United States Patent
Robinson et al.

(10) Patent No.: US 8,440,498 B2
(45) Date of Patent: *May 14, 2013

(54) THIN-FILM DEVICES FORMED FROM SOLID PARTICLES

(75) Inventors: Matthew R. Robinson, San Jose, CA (US); Chris Eberspacher, Palo Alto, CA (US); Jeroen K. J. Van Duren, San Francisco, CA (US)

(73) Assignee: Nanosolar, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/311,483

(22) Filed: Dec. 5, 2011

(65) Prior Publication Data

US 2012/0171847 A1    Jul. 5, 2012

Related U.S. Application Data

(63) Continuation of application No. 12/304,683, filed on Oct. 28, 2009, now Pat. No. 8,071,419.

(51) Int. Cl.
*H01L 21/00* (2006.01)

(52) U.S. Cl.
USPC ............. 438/95; 136/242; 136/264; 136/265; 257/E31.029; 427/74; 427/76; 438/93

(58) Field of Classification Search ............... 136/242; 257/E31.029; 427/74, 76; 438/93, 95
See application file for complete search history.

(56) References Cited

U.S. PATENT DOCUMENTS

| | | |
|---|---|---|
| 4,547,621 A | 10/1985 | Hack et al. |
| 4,622,432 A | 11/1986 | Yamazaki |
| 4,642,140 A | 2/1987 | Noufi et al. |
| 5,045,409 A | 9/1991 | Eberspacher et al. |
| 5,078,804 A | 1/1992 | Chen et al. |
| 5,141,564 A | 8/1992 | Chen et al. |
| 5,356,839 A | 10/1994 | Tuttle et al. |
| 5,436,204 A | 7/1995 | Albin et al. |

(Continued)

FOREIGN PATENT DOCUMENTS

WO    2007146964 A    12/2007

OTHER PUBLICATIONS

Final Office Action from U.S. Appl. No. 11/762,052 dated Jul. 11, 2011.

(Continued)

*Primary Examiner* — Asok K Sarkar
(74) *Attorney, Agent, or Firm* — Joseph D. Isenberg; JDI Patent

(57) ABSTRACT

Methods and devices are provided for forming thin-films from solid group IIIA-based particles. In one embodiment of the present invention, a method is described comprising of providing a first material comprising an alloy of a) a group IIIA-based material and b) at least one other material. The material may be included in an amount sufficient so that no liquid phase of the alloy is present within the first material in a temperature range between room temperature and a deposition or pre-deposition temperature higher than room temperature, wherein the group IIIA-based material is otherwise liquid in that temperature range. The other material may be a group IA material. A precursor material may be formulated comprising a) particles of the first material and b) particles containing at least one element from the group consisting of: group IB, IIIA, VIA element, alloys containing any of the foregoing elements, or combinations thereof.

15 Claims, 20 Drawing Sheets

U.S. PATENT DOCUMENTS

| | | | |
|---|---|---|---|
| 5,441,897 A | 8/1995 | Noufi et al. | |
| 5,445,847 A | 8/1995 | Wada et al. | |
| 5,567,469 A | 10/1996 | Wada et al. | |
| 5,578,503 A | 11/1996 | Karg et al. | |
| 5,626,688 A | 5/1997 | Probst et al. | |
| 5,674,555 A | 10/1997 | Birkmire et al. | |
| 5,728,231 A | 3/1998 | Negami et al. | |
| 5,985,691 A | 11/1999 | Basol et al. | |
| 6,107,562 A | 8/2000 | Hashimoto et al. | |
| 6,127,202 A | 10/2000 | Kapur et al. | |
| 6,268,014 B1 | 7/2001 | Eberspacher et al. | |
| 6,518,086 B2 | 2/2003 | Beck et al. | |
| 6,534,704 B2 | 3/2003 | Hashimoto et al. | |
| 6,974,976 B2 | 12/2005 | Hollars | |
| 7,144,627 B2 | 12/2006 | Halas et al. | |
| 8,071,419 B2 * | 12/2011 | Robinson et al. | 438/95 |
| 2002/0106873 A1 | 8/2002 | Beck et al. | |
| 2003/0051664 A1 | 3/2003 | Stanbery | |
| 2003/0108664 A1 | 6/2003 | Kodas et al. | |
| 2004/0219730 A1 * | 11/2004 | Basol | 438/200 |
| 2004/0219739 A1 | 11/2004 | Basol | |
| 2005/0194036 A1 | 9/2005 | Basol | |
| 2007/0169813 A1 | 7/2007 | Robinson et al. | |
| 2007/0193623 A1 | 8/2007 | Krasnov | |
| 2008/0057203 A1 | 3/2008 | Robinson et al. | |
| 2008/0057616 A1 | 3/2008 | Robinson et al. | |
| 2008/0175982 A1 | 7/2008 | Robinson et al. | |
| 2010/0029036 A1 | 2/2010 | Robinson et al. | |

OTHER PUBLICATIONS

Final Office Action from U.S. Appl. No. 11/762,058 dated May 12, 2011.
Final Office Action from U.S. Appl. No. 11/762,060 dated Oct. 14, 2010.
Notice of Allowance and Fees due dated Sep. 9, 2011 for U.S. Appl. No. 12/304,683.
Office Action dated Jan. 12, 2011 for U.S. Appl. No. 12/304,638.
Office Action from U.S. Appl. No. 11/762,052 dated Oct. 20, 2010.
Office Action from U.S. Appl. No. 11/762,058 dated Aug. 31, 2010.
Office Action from U.S. Appl. No. 11/762,060 dated Jan. 28, 2010.
Office Action from U.S. Appl. No. 11/762,056 dated Mar. 31, 2011.
Written Opinion from PCT application WO07/146964 dated Dec. 26, 2007.
Office Action from U.S. Appl. No. 12/304,683 dated Jan. 12, 2011.

* cited by examiner

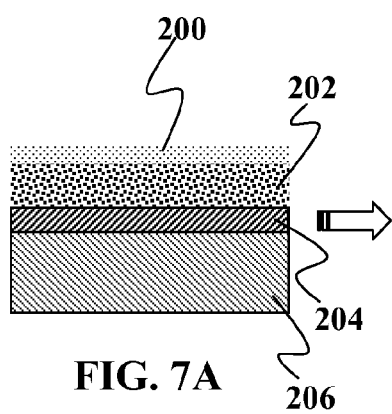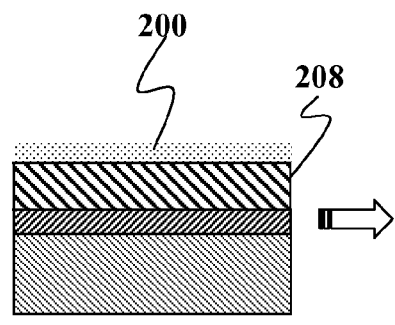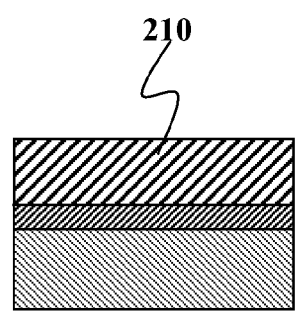
FIG. 7A      FIG. 7B      FIG. 7C
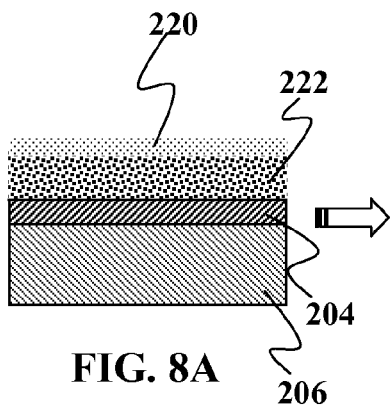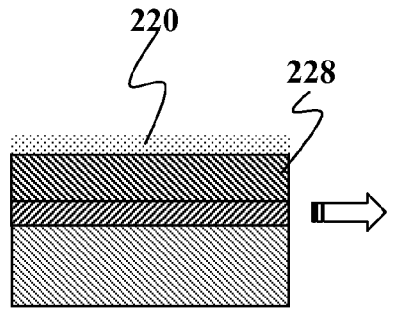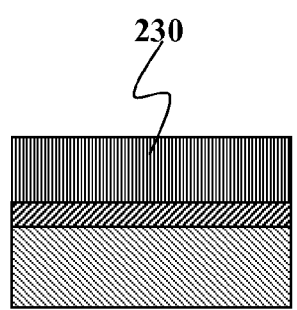
FIG. 8A      FIG. 8B      FIG. 8C

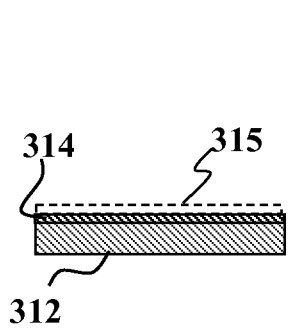
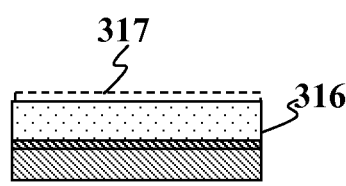
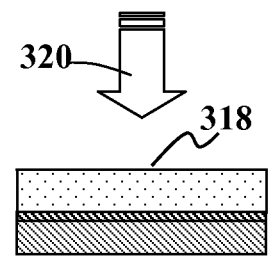
FIG. 13A        FIG. 13B        FIG. 13C
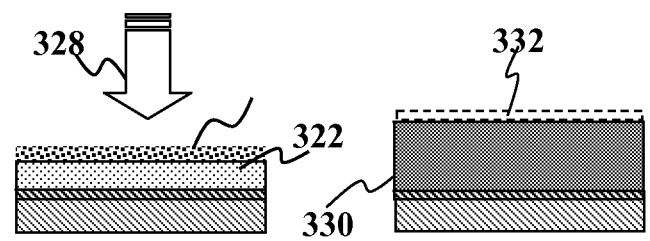
FIG. 13D        FIG. 13E

THIN-FILM DEVICES FORMED FROM SOLID PARTICLES

CROSS-REFERENCE TO RELATED APPLICATION

This application is a continuation of U.S. patent application Ser. No. 12/304,683 filed Oct. 28, 2009 and entitled THIN-FILM DEVICES FORMED FROM SOLID PARTICLES, which was issued as U.S. Pat. No. 8,071,419 on Dec. 6, 2011.

FIELD OF THE INVENTION

This invention relates generally to semiconductor films, and more specifically, to semiconductor films containing a group IB-IIIA-VIA compound and formed in part from solid group IIIA-based materials.

BACKGROUND OF THE INVENTION

Solar cells and solar modules convert sunlight into electricity. These electronic devices have been traditionally fabricated using silicon (Si) as a light-absorbing, semiconducting material in a relatively expensive production process. To make solar cells more economically viable, solar cell device architectures have been developed that can inexpensively make use of thin-film, light-absorbing semiconductor materials such as copper-indium-gallium-sulfo-di-selenide, $Cu(In, Ga)(S, Se)_2$, also termed CI(G)S(S). This class of solar cells typically has a p-type absorber layer sandwiched between a back electrode layer and an n-type junction partner layer. The back electrode layer is often Mo, while the junction partner is often CdS. A transparent conductive oxide (TCO) such as zinc oxide ($ZnO_x$) doped with aluminum is formed on the junction partner layer and is typically used as a transparent electrode. CIS-based solar cells have been demonstrated to have power conversion efficiencies exceeding 19%.

A central challenge in cost-effectively constructing a large-area copper-indium-gallium-di-selenide (CIGS) based solar cell or module is that the elements of the CIGS layer must be within a narrow stoichiometric ratio on nano-, meso-, and macroscopic length scale in all three dimensions in order for the resulting cell or module to be highly efficient. Achieving precise stoichiometric composition over relatively large substrate areas is, however, difficult using traditional vacuum-based deposition processes. For example, it is difficult to deposit compounds and/or alloys containing more than one element by sputtering or evaporation. Both techniques rely on deposition approaches that are limited to line-of-sight and limited-area sources, tending to result in poor surface coverage. Line-of-sight trajectories and limited-area sources can result in non-uniform three-dimensional distribution of the elements in all three dimensions and/or poor film-thickness uniformity over large areas. These non-uniformities can occur over the nano-, meso-, and/or macroscopic scales. Such non-uniformity also alters the local stoichiometric ratios of the absorber layer, decreasing the potential power conversion efficiency of the complete cell or module.

Alternatives to traditional vacuum-based deposition techniques have been developed. In particular, production of solar cells on flexible substrates using non-vacuum, semiconductor printing technologies provides a highly cost-efficient alternative to conventional vacuum-deposited solar cells. For example, T. Arita and coworkers [20th IEEE PV Specialists Conference, 1988, page 1650] described a non-vacuum, screen printing technique that involved mixing and milling pure Cu, In and Se powders in the compositional ratio of 1:1:2 and forming a screen printable paste, screen printing the paste on a substrate, and sintering this film to form the compound layer. They reported that although they had started with elemental Cu, In and Se powders, after the milling step the paste contained the $Cu-In-Se_2$ phase. However, solar cells fabricated from the sintered layers had very low efficiencies because the structural and electronic quality of these absorbers was poor.

Screen-printed $Cu-In-Se_2$ deposited in a thin-film was also reported by A. Vervaet et al. [9th European Communities PV Solar Energy Conference, 1989, page 480], where a micron-sized $Cu-In-Se_2$ powder was used along with micron-sized Se powder to prepare a screen printable paste. Layers formed by non-vacuum, screen printing were sintered at high temperature. A difficulty in this approach was finding an appropriate fluxing agent for dense $Cu-In-Se_2$ film formation. Even though solar cells made in this manner had poor conversion efficiencies, the use of printing and other non-vacuum techniques to create solar cells remains promising.

It should be understood that some precursor materials used in non-vacuum manufacturing of thin-films suitable for semiconductor devices may be in liquid form, with these precursor materials serving as source material for the thin-film, whereas most other precursor materials in the ink are in solid form and desirably so, this in contrast to materials added to the ink to allow for reliable, fast and uniform deposition, like solvents and organic additives. These solvents and organic additives are typically unwanted in the final thin-film and require facile removal during or after the deposition process. Unfortunately, sometimes these preferably solid components can become liquid at the handling and/or particle size reduction temperatures typically associated with non-vacuum techniques for solar cell production. This may be a disadvantageous feature as premature and/or undesired liquification or coalescence increases the difficulty in handling these materials during processing, during ink storage, and may require more involved techniques. For example, elemental gallium is a liquid above 30° C., which is very close to room temperature and below the processing temperature associated with deposition and/or ink preparation. It may also be disadvantageous during processing since the liquid form may change the kinetics of the conversion of the particulate layer to the final semiconductor film. For example, if too much liquid is present at or near the onset of a reaction, liquid may group together at certain areas and not be evenly distributed throughout the reaction area. This can result in thickness non-uniformity and/or lateral composition non-uniformity. Furthermore, if material in liquid form leaches out from an alloy or compound containing that material, this may change the local stoichiometry at the start of the reaction resulting in different compound(s) in the final thin-film if the leaching occurs prior to or during processing of the materials.

For example for the preferably solid components, liquid form might be present and undesirable before/during the synthesis of the particles. Such components in liquid form increases the difficulty in controlling and maintaining the particle (droplet) size during ink preparation and solution deposition. In one example, elemental gallium used in thin-film solar cell production is a liquid above 30° C., which is very close to room temperature and below the processing temperature typically used during ink deposition. Lowering the processing temperature far below the melting point of gallium complicates the ink preparation and solution deposition. Additionally, difficulty in controlling the particle (droplet) size during deposition complicates controlling and maintaining the target thickness uniformity of the resulting film on micro-, and macroscopic length scales.

Additionally for the preferably solid components, liquid might be present and undesirable when annealing the coatings of ink. It may also be disadvantageous during single and/or multi-step conversion of the solution-deposited coating or layer into the resulting semiconductor film since the premature presence of liquid may change the kinetics of the reactions involved and therefore the quality and uniformity of the semiconductor film. For example, if too much liquid is present at or near the onset of a reaction, liquid may dewet from the surface and ball up resulting in a non-uniform material distribution throughout the layer, both in thickness and composition.

Due to the aforementioned issues, there are significant opportunities for improving non-vacuum CIGS manufacturing processes. Improvements may be made to increase the throughput of existing CIGS manufacturing process and decrease the cost associated with CIGS based solar devices. The decreased cost and increased production throughput should increase market penetration and commercial adoption of such products.

SUMMARY OF THE INVENTION

Embodiments of the present invention address at least some of the drawbacks set forth above. The present invention provides for the use of solid particles in the formation of high quality precursor layers which are processed into dense films, semiconductor films, and/or semiconductor dense films. The resulting films may be useful in a variety of industries and applications, including but not limited to, the manufacture of photovoltaic devices and solar cells. More specifically, the present invention has particular application in the formation of precursor layers for thin film solar cells. The present invention provides for more efficient and simplified creation of a dispersion, and the resulting coating thereof. It should be understood that this invention is generally applicable to any processes involving the deposition of a material from dispersion. At least some of these and other objectives described herein will be met by various embodiments of the present invention.

In one embodiment of the present invention, a method is described comprising of providing a first material comprising an alloy of: a) a group IIIA-based material and b) at least one other material. The material may be included in an amount sufficient so that no liquid phase of the alloy is present within the first material in a temperature range between room temperature and a deposition or pre-deposition temperature higher than room temperature, wherein the group IIIA-based material is otherwise liquid in that temperature range. The other material may be a group IA material. A precursor material may be formulated comprising: a) particles of the first material and b) particles containing at least one element from the group consisting of: group IB, IIIA, VIA element, alloys containing any of the foregoing elements, or combinations thereof. The temperature range described above may be between about 20° C. and about 200° C. It should be understood that the alloy may have a higher melting temperature than a melting temperature of the IIIA-based material in elemental form.

For any of the embodiments described herein, the following may also apply. The group IA-based material may be a Na-based material. The group IA-based material may be comprised of NaF. The group IA-based material may contain an element chosen from the group consisting of: sodium (Na), potassium (K), lithium (Li), Rubidium (Rb), Cesium (Cs), Francium (Fr), an alloy containing any of the foregoing, or combinations thereof. The group IA-based material may be comprised of an elemental material. The group IA-based material may be comprised of a binary alloy. The group IA-based material may be comprised of a multinary alloy. The group IIIA-based material of the first material may be Indium. The group IIIA-based material of the first material may be Gallium. The alloy may be a binary alloy and/or a multinary alloy. The alloy may be comprised of a Ga—Na based alloy. The alloy may be $Ga_4Na$ and/or $Ga_{29}Na_{32}$. Optionally, the alloy contains at least about 0.6 weight percent Na. The alloy may contain at least about 8 weight percent Na. The alloy may contain at least about 11 weight percent Na. The alloy may include an In—Na based alloy. The alloy may be comprised of $In_8Na_5$. The precursor material may contain particles comprised of Cu-based particles. The precursor material may contain particles comprised of Cu-based alloy particles. The precursor material may contain particles comprised of Cu-IIIA based alloy particles. The precursor material may contain particles comprised of Cu-VIA based alloy particles. Optionally, the particles may be nanoparticles. The particles may be spherical nanoparticles and/or non-spherical, planar flakes. The alloy may be formed by at least one method selected from the group consisting of: atomization, pyrometallurgy, mechanical alloying, or combinations thereof.

In a still further embodiment of the present invention, a composition is provided having a precursor material comprising of: a) solid particles of a first material comprising an alloy of a group IIIA-based material and at least one group IA-based material and b) particles containing at least one element from the group consisting of: group IB, IIIA, VIA element, alloys containing any of the foregoing elements, or combinations thereof. The group IA-based material is included in an amount sufficient so that no liquid phase of the alloy is present within the first material in a temperature range between room temperature and a deposition or pre-deposition temperature higher than room temperature, wherein the group IIIA-based material is otherwise liquid in that temperature range. It should be understood that the group IA-based material comprises of Na.

For any of the embodiments described herein, the following may also apply. Optionally, the method may include formulating an ink including the precursor material; solution depositing the ink onto a substrate to form a precursor layer on the substrate; and reacting the precursor layer in a suitable atmosphere to form a group IB-IIIA based film. This may be a two step process where the group IB-IIIA film may not include a group VIA material and is further treated in a second step to form a group IB-IIIA-VIA compound. The first film may be a dense film that includes a group IB-IIIA compound. The method may comprise of heating the film in a group VIA based atmosphere to form a group IB-IIIA-VIA compound film. The film may comprise of a semiconductor film suitable for use as an absorber layer in a photovoltaic device. The film may be comprised of an absorber layer for a solar cell. The reacting step may be comprised of heating the precursor layer. In other embodiments, the reacting step comprises of heating the precursor layer in a group VIA-based atmosphere. Optionally, the suitable atmosphere may contain at least one of the following: selenium, sulfur, tellurium, $H_2$, CO, $H_2Se$, $H_2S$, Ar, $N_2$ or combinations or mixtures thereof. The method may include adding a mixture of one or more elemental or alloy particles containing at least one element selected from the group consisting of: aluminum, tellurium, or sulfur. One or more classes of the particles may be doped with one or more inorganic materials. One or more classes of the particles may be doped with one or more inorganic materials chosen from the group consisting of: aluminum (Al) and sulfur (S). One or more classes of the particles may be doped with one or more inorganic materials chosen from the group consisting of: sodium (Na), potassium (K), or lithium (Li). The alloy containing particles may be a sole source of group IIIA elements in the ink. In terms of composition, the film may have a Cu/(In+Ga) compositional range of about 0.01 to about 1.0 and a Ga/(In+Ga) compositional range of about 0.01 to about 1.0. The film may have a Cu/(In+Ga) compositional range of about >1.0 for Cu/(In+Ga) and a Ga/(In+Ga) compositional range of about 0.01 to about 1.0. The film may have a Cu/(In+Ga) compositional range of about 0.01 to about 1.0 and a Ga/(In+Ga) compositional range of about 0.01 to about 1.0. Optionally, the film has a desired Cu/(In+Ga) molar ratio is in the range of about 0.7 to about 1.0 and a desired Ga/(Ga+In) molar ratio in the range of about 0.1 to about 0.8. Optionally, there is the possibility of having a ratio of Cu/(In+Ga)>1.0 and using subsequent post-treatment (KCN, etc.) to change Cu/(In+Ga)<1.0.

For any of the embodiments described herein, the following may also apply. In some embodiments, the ink includes a carrier liquid. The depositing step may include using at least one of the following techniques: wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jetprinting, jet deposition, spray deposition, or combinations thereof.

For any of the embodiments described herein, the following may also apply. The material may increase the melting temperature and does not contain contaminants that require further heating to remove contaminants added by the material. The material may be included in an amount sufficient so that no liquid phase of the alloy is present within the first material in a temperature range between room temperature and a deposition or pre-deposition temperature higher than room temperature, wherein the material is otherwise liquid in that temperature range and does not require further heating to remove any materials added by the additive.

In yet another embodiment of the present invention, the method includes providing a first material comprising an alloy of a) a group IIIA-based material and b) a second material, wherein the second material is included in an amount sufficient so that no liquid phase of the alloy is present within the first material in a temperature range between room temperature and a deposition or pre-deposition temperature higher than room temperature, wherein the group IIIA-based material is otherwise liquid in that temperature range. A precursor material may be formulated comprising of a) particles of the first material and b) particles containing at least one element from the group consisting of: group IB, IIIA, VIA element, alloys containing any of the foregoing elements, or combinations thereof. The second material comprises of F. Optionally, the second material comprises of $NO_3$. The second material comprises of any melting-point increasing material, relative to a melting point of the group IIIA-based material. The alloy may be comprised of $GaF_3$. The alloy may also be comprised of $Ga(NO_3)_3$. The alloy may be comprised of a group IIIA-based salt. The alloy may be comprised of an organo-gallium compound. The method may include heating the precursor material to form a layer without C, N, O, or F elements in the layer. The second material may contain aluminum (Al) and/or aluminum compounds. The second material may contain sulfur (S) and/or sulfur compounds.

Alloys

In one embodiment of the present invention, a method is provided for creating solid alloy particles. The method may include providing a first material containing at least one alloy comprising of: a) a group IIIA element, b) at least one group IB, IIIA, and/or VIA element different from the group IIIA element of a), and c) a group IA-based material. The group IA-based material may be included in an amount sufficient so that no liquid phase of the alloy is present in a temperature range between room temperature and a deposition or pre-deposition temperature higher than room temperature, wherein the group IIIA element is otherwise liquid in that temperature range. The method may involve formulating a precursor material comprising of: a) particles of the first material and b) particles containing at least one element from one of the following: a group IB element, a group IIIA element, a group VIA element, alloys containing any of the foregoing elements, or combinations thereof.

For any of the embodiments described herein, the following may also apply. The temperature range where the alloy is solid may be between about 20° C. and about 200° C. The alloy may have a higher melting temperature than a melting temperature of the group IIIA element of a). The precursor material may further include a second material containing a group IB, IIIA, and/or VIA based material. There may further include particles containing the precursor material. The group IIIA element of the first material may be indium. The group IIIA element of the first material may be Ga. The group IA-based material may be at least partially included in the particles. The group IA-based material may be comprised of elemental sodium. The group IA-based material may be comprised of a sodium-based compound. The group IA-based material may contain an element chosen from the group consisting of sodium (Na), potassium (K), lithium (Li), compounds containing any of the foregoing, or combinations thereof. The alloy may be comprised of In—Ga—Na, In—Ga—Se—Na, and/or Ga—Se—Na. Optionally, the alloy may be comprised of one of the following: In—Se—Na, Cu—In—Na, or Cu—Ga—Na. The alloy may be comprised of a sulfide. The alloy may be comprised of Cu—In—Ga—Na. The precursor material contains particles comprising of Cu-based particles. The precursor material may contain particles comprising of Cu-based alloy particles. The precursor material may contain particles comprising of Cu-IIIA based alloy particles. The precursor material may contain particles comprising of Cu-VIA based alloy particles. The particles may include nanoparticles. Optionally, the particles may include spherical nanoparticles. The particles include non-spherical, planar flakes.

In one embodiment, the material may solidify substantially all of the particle. Optionally, the alloy may solidify at least an outer portion of the particles to prevent leaching or phase separation of liquid group IIIA element from the particles. The alloy may create a solid outer shell on the particles to prevent leaching of liquid group IIIA element from the particles. The particles may be formed by using at least one of the following methods: grinding, milling, electroexplosive wire (EEW) processing, evaporation condensation (EC), pulsed plasma processing, or combinations thereof. The particles may be formed using at least one of the following methods: sonification, agitation, electromagnetically mixing of a liquid metal or liquid alloy. The particles may be formed using at least one of the following methods: spray-pyrolysis, laser pyrolysis, or a bottom-up technique like wet chemical approaches.

For any of the embodiments described herein, the following may also apply. The particles may be nanoparticles. The particles may be spherical nanoparticles. Optionally, at least some of the particles are non-spherical, planar flakes. The method may include using the precursor material in a solution coatable ink for forming a film on a substrate. The method may include formulating an ink including the precursor material; solution depositing the ink onto a substrate to form a precursor layer on the substrate; and reacting the precursor layer in a suitable atmosphere to form a group IB-IIIA-VIA based film. In other embodiments, the method may include formulating an ink including the precursor material; solution depositing the ink onto a substrate to form a precursor layer on the substrate; and reacting the precursor layer in a suitable atmosphere to form a IB-IIIA film. The film may include a group IB-IIIA-VIA compound. The film may be a dense film that includes a group IB-IIIA compound. The film may be heated in a group VIA based atmosphere to form a group IB-IIIA-VIA compound film. The film may be comprised of a semiconductor film suitable for use in a photovoltaic device. The film may be comprised of an absorber layer for a solar cell. The reacting step may be comprised of heating the layer in the suitable atmosphere. The method may include adding a mixture of one or more elemental particles selected from: aluminum, tellurium, sulfur, copper, indium, gallium, alloys containing any of the foregoing, and combinations thereof. The suitable atmosphere may contain at least one of the following: selenium, sulfur, tellurium, H2, CO, H2Se, H2S, Ar, N2 or combinations or mixtures thereof. Optionally, one or more classes of the particles may be doped with one or more inorganic materials. One or more classes of the particles may be doped with one or more inorganic materials containing at least one element from the group of aluminum (Al), sulfur (S), sodium (Na), potassium (K), or lithium (Li).

For any of the embodiments described herein, the following may also apply. Optionally, the alloy containing particles may be a sole source of group IIIA elements in the ink. The film may have a Cu/(In+Ga) compositional range of about 0.01 to about 1.0 and a Ga/(In+Ga) compositional range of about 0.01 to about 1.0. The film may have a Cu/(In+Ga) compositional range >1.0 and a Ga/(In+Ga) compositional range of about 0.01 to about 1.0. The film may have a desired Cu/(In+Ga) molar ratio is in the range of about 0.7 to about 1.0 and a desired Ga/(Ga+n) molar ratio in the range of about 0.1 to about 0.8. The ink may include a carrier liquid. Depositing the material may be comprised of using at least one of the following techniques: wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jet printing, jet deposition, spray deposition, or combinations thereof.

In yet another embodiment of the present invention, a composition is provided that comprises of a precursor material comprising of: a) solid particles of a first material and b) particles containing at least one element from the group consisting of: group IB, IIIA, VIA element, alloys containing any of the foregoing elements, or combinations thereof. The first material may contain at least one alloy comprised of: a) a group IIIA element, b) at least one group IB, IIIA, and/or VIA element different from the group IIIA element of a), and c) a group IA-based material. The group IA-based material is included in an amount sufficient so that no liquid phase of the alloy is present in a temperature range between room temperature and a deposition or pre-deposition temperature higher than room temperature, wherein the group IIIA element is otherwise liquid in that temperature range. The group IA-based material may be comprised of Na. The composition may include any of features previously discussed in the foregoing paragraphs.

In a still further embodiment of the present invention, a method includes providing a first material containing at least one alloy comprising: a) a group IIIA element, b) at least one group IB, IIIA, and/or VIA element different from the group IIIA element of a), and c) a second material. The second material is included in an amount sufficient so that no liquid phase of the alloy is present in a temperature range between room temperature and a deposition or pre-deposition temperature higher than room temperature, wherein the group IIIA element is otherwise liquid in that temperature range. The method may include formulating a precursor material comprising a) particles of the first material and b) particles containing at least one element from the group consisting of: group IB, IIIA, VIA element, alloys containing any of the foregoing elements, or combinations thereof.

For any of the embodiments described herein, the following may also apply. The second material may be comprised of F. Optionally, the second material may be comprised of $NO_3$. The second material may include any melting-point increasing material for increasing the melting point relative to a melting point of the group IIIA-based material. The alloy may be comprised of $GaF_3$ and/or $Ga(NO_3)_3$. Optionally, the alloy may be comprised of a group IIIA-based salt. The alloy may be comprised of an organo-gallium compound. The precursor material may be heated to form a layer without C, N, O, or F elements in the layer. The second material may contain aluminum (Al) and/or aluminum compounds. The second material may contain sulfur (S) and/or sulfur compounds.

Quenching

In one embodiment of the present invention, a process for forming solid particles is provided. The method includes providing a first suspension of solid and/or liquid particles containing at least one group IIIA element. A material may be added to substantially increase the melting point of at least one set of group IIIA-containing particles in the suspension into higher-melting solid particles comprising an alloy of the group IIIA element and at least a part of the added material. The suspension may be deposited onto a substrate to form a precursor layer on the substrate and the precursor layer is reacted in a suitable atmosphere to form a film.

For any of the embodiments described herein, the following may also apply. The alloy may have a higher melting temperature than a melting temperature of the IIIA element. The solid and/or liquid particles contain at least one element from the group consisting of: group IB, IIIA, VIA element, alloys containing any of the foregoing elements, or combinations. A second suspension may be provided, wherein the second suspension includes solid and/or liquid particles containing at least one element from the group consisting of: group IB, IIIA, VIA element, alloys containing any of the foregoing elements, or combinations. The material may be added to create solid particles of the material and the group IIIA element. The first suspension may be separately prepared before mixing it with a second suspension. A IIIA-alloy-solid-particles-based suspension may be separately prepared before mixing it with the other IB and/or IIIA and/or VIA elements. The method may involve separate emulsion/suspension creation step before adding it to the mixed final suspension and depositing the suspension onto a substrate to form a precursor layer on the substrate. Optionally, at least one set of the solid particles are group IIIA-Na alloy containing particles, wherein Na in the group IIIA-Na alloy containing particles is at an amount sufficient so that no liquid phase of a group IIIA-Na alloy is present within the group IIIA-Na alloy containing particles in a temperature range between room temperature and a deposition or pre-deposition temperature higher than room temperature, wherein the group IIIA-based material is otherwise liquid in that temperature range. Optionally, at least one set of the solid particles are group IIIA-Na alloy containing particles, wherein Na in the group IIIA-Na alloy containing particles is at an amount sufficient so that no liquid phase of a group IIIA-Na alloy is present within the group IIIA-Na alloy containing particles in a temperature range between about 15 C and about 200 C, wherein the group IIIA-based material is otherwise liquid in that temperature range. Optionally, at least one set of the solid particles are group IIIA-Na alloy containing particles, wherein Na in the group IIIA-Na alloy containing particles is at an amount sufficient so that no liquid phase of a group IIIA-Na alloy is present within the group IIIA-Na alloy containing particles at a deposition and/or dispersion temperature. The suspension may be cooled to solidify the particles. The depositing step may be comprised of solution depositing the suspension.

For any of the embodiments described herein, the following may also apply. The material may be comprised of elemental sodium and/or a sodium-based material. The material may be comprised of the aforementioned in liquid and/or solid form. The adding step may be comprised of adding an emulsion of the material to an emulsion containing a liquid group IIIA element to create the solid particles. The adding step may be comprised of adding an emulsion of the material to dispersion of solid group IIIA element to create the solid particles. Optionally, the adding step comprises of adding a dispersion of solid material particles of the material to an emulsion containing a liquid group IIIA element to create the solid particles. The adding step may be comprised of adding a dispersion of solid material particles of the material to a dispersion of solid particle containing a group IIIA element for a solid-solid reaction to create solid particles. The method may include milling the material and the one set of group IIIA-containing liquid particles in the suspension to more thoroughly mix solids with the liquid. Optionally, the method may include mechanically alloying the material and the one set of group IIIA-containing particles in the suspension to more thoroughly mix solids. Adding the material may create particles of sizes smaller than the size of the group IIIA-containing particles found in the suspension prior to introduction of the material. The method may include agitating the suspension to mix and size reduce the particles. The suspension may be sonicated to mix and size reduce the particles. Electromagnetic size-reduction/control may be used to mix and size reduce the particles. Any sodium containing particles may be added during emulsification to solidify droplets of Ga to form solid Ga—Na particles. Sodium in elemental form may be added prior to, during, or after emulsification to solidify droplets of Ga to form solid Ga—Na particles. Liquid sodium may be added in elemental form prior to, during, or after emulsification to solidify droplets of Ga to form solid Ga—Na particles. A sodium emulsion may be combined with a gallium emulsion to solidify droplets of Ga to form solid Ga—Na particles. A sodium emulsion may be combined with a gallium emulsion by milling to solidify droplets of Ga to form solid Ga—Na particles. A sodium emulsion may be combined with a solid gallium particles by mechanical alloying at temperatures below the melting point of gallium to form solid Ga—Na particles. A sodium dispersion may be combined with a gallium dispersion by mechanical alloying to solidify droplets of Ga to form solid Ga—Na particles. The film may include a group IB-IIIA-VIA compound. The reacting step may be comprised of heating the layer in a suitable atmosphere.

For any of the embodiments described herein, the following may also apply. Optionally, at least one set of the particles in the suspension is in the form of nanoglobules. In other embodiments, at least one set of the particles in the suspension are in the form of nanoglobules and contain at least one group IIIA element. At least one set of the particles in the suspension may be in the form of nanoglobules comprising of a group IIIA element in elemental form. At least some of the particles may have a platelet shape. Optionally, a majority of the particles may have a platelet shape. All of the particles may have a platelet shape. The particles may have a substantially flat, planar shape. A majority of the particles may have a flat, planar shape. All of the particles may have a flat, planar shape. The depositing step may include coating the substrate with the suspension. The suspension may be comprised of an emulsion. Gallium may be incorporated as a group IIIA element in the form of a suspension of nanoglobules. Nanoglobules of gallium may be formed by creating an emulsion of liquid gallium in a solution. A suspension of liquid gallium in solution may be maintained or enhanced by stirring, mechanical means, electromagnetic means, ultrasonic means, and/or the addition of dispersants and/or emulsifiers.

For any of the embodiments described herein, the following may also apply. A mixture of one or more elemental particles may be added, wherein the particles are selected from: aluminum, tellurium, and/or sulfur. The suitable atmosphere may contain at least one of the following: selenium, sulfur, tellurium, $H_2$, CO, $H_2Se$, $H_2S$, Ar, $N_2$ or combinations or mixture thereof. One or more classes of the particles may include one or more inorganic materials. The particles may be contain one or more inorganic materials chosen from the group consisting of: aluminum (Al), sulfur (S), sodium (Na), potassium (K), lithium (Li), alloys containing the foregoing elements, or combinations thereof. The particles may be nanoparticles. Particles may be formed from a feedstock by one of the following processes: milling, electroexplosive wire (EEW) processing, evaporation condensation (EC), pulsed plasma processing, or combinations thereof. Optionally, the material does negatively impact the resulting absorber layer and not need to be removed from the resulting absorber layer. The material may be comprised of Al to make solid Al—Ga particles. Optionally, the process may be comprised of a material comprising of Al, wherein Ga dissolves in Al to make solid Al—Ga particles for use in forming a film of CAGS and/or CAIGS.

Bandgap

In one embodiment, a method is provided for bandgap grading in a thin-film device using such particles. The method may be comprised of providing a bandgap grading material comprising of an alloy having: a) a IIIA material and b) a group IA-based material, wherein the alloy has a higher melting temperature than a melting temperature of the IIIA material in elemental form. A precursor material may be deposited on a substrate to form a precursor layer. The precursor material comprising group IB, IIIA, and/or VIA based particles. The bandgap grading material of the alloy may be deposited after depositing the precursor material. The alloy in the grading material may react after the precursor layer has begun to sinter and thus maintains a higher concentration of IIIA material in a portion of the compound film that forms above a portion that sinters first.

For any of the embodiments described herein, the following may also apply. The bandgap grading material may melt above 450° C. Optionally, the bandgap grading material melts above 500° C. In another embodiment, the bandgap grading material melts above 550° C. The method may include at least partially sintering the precursor material to form a dense film prior to depositing the bandgap grading material. The precursor material may be completely sintered to form a dense film prior to depositing the bandgap grading material. The precursor material may be reacted in a suitable atmosphere to form a CIS-based film prior to depositing the bandgap grading material. The precursor material and the bandgap grading material may be reacted in a suitable atmosphere to form a CIGS film. The alloy may have a higher reacting temperature than a maximum sintering temperature of the precursor material. The depositing step may be comprised of solution depositing the precursor material. Optionally, the depositing step may be comprised of dry powder depositing the precursor material. The reacting step comprises of using a solid-state reaction. The reacting step comprises of heating the precursor material at a first temperature profile, wherein the precursor layer at least partially sinters at the first temperature profile where a maximum temperature is lower than a reacting temperature of the alloy; and increasing processing temperature to a second temperature sufficient to melt react the particles of the alloy, wherein the alloy reacts after the precursor layer has begun to at least partially sinter. The bandgap grading material may be solution deposited over the precursor layer. The bandgap grading material may be deposited over the precursor layer using a vacuum-based technique. The bandgap grading material may be deposited over the precursor layer by sputtering. The bandgap grading material may be deposited over the precursor layer by at least one of the following techniques: ALD, CVD, PVD, or combinations thereof electrodeposition, solution-deposition of 'molecular' soluble Ga-compounds in contrast to particles=aggregates). The precursor material may be comprised of a material that forms a Cu—In—Se based alloy when sintered at the first temperature profile. The precursor material may be comprised of a precursor material that forms a Cu—In—Se based alloy when sintered at the first temperature profile and combines with the alloy to form a Cu—In—Ga—Se based alloy when processed with the second temperature profile.

For any of the embodiments described herein, the following may also apply. The precursor material may be comprised of a material that forms a Cu—In—Ga—Se based alloy when sintered at the first temperature profile and combines with the alloy to form a Cu—In—Ga—Se based alloy when processed with the second temperature profile with increase Ga content near a top surface of the layer. The alloy may be comprised of a Ga—Na based material, a Ga—Na—Se based material, a Ga—Na—S based material, and/or a Ga—Na—Te based material. The group IA-based material may be comprised of elemental sodium-based material. The group IA-based material may be comprised of a sodium-based compound. The group IA-based material may be chosen from the group of sodium (Na), potassium (K), lithium (Li), alloys containing any of the foregoing, or combinations thereof. The precursor material may contain particles comprised of Cu-based alloy particles. The precursor material contains particles comprised of Cu-IIIA based alloy particles. The precursor material may contain particles comprised of Cu-VIA based alloy particles. The precursor material may be comprised of a selenide-based alloy. The particles may be nanoparticles. The particles may be spherical nanoparticles. The particles may include non-spherical, planar flakes. The compound film may include a group IB-IIIA-VIA compound. The compound film may be comprised of a semiconductor film suitable for use in a photovoltaic device. The compound film may be comprised of an absorber layer for a solar cell. A mixture of one or more elemental particles may be added and selected from: aluminum, tellurium, or sulfur. The suitable atmosphere may contain at least one of the following: selenium, sulfur, tellurium, H2, CO, H2Se, H2S, Ar, N2 or combinations or mixtures thereof. One or more classes of the particles may be doped with one or more inorganic materials. One or more classes of the particles may be doped with one or more inorganic materials chosen from the group of aluminum (Al), sulfur (S), sodium (Na), potassium (K), or lithium (Li). The film may have a Cu/(In+Ga) compositional range of about 0.01 to about 1.0 and a Ga/(In+Ga) compositional range of about 0.01 to about 1.0. The film may have a desired Cu/(In+Ga) molar ratio in the range of about 0.7 to about 1.0 and a desired Ga/(Ga+In) molar ratio in the range of about 0.1 to about 0.8. The film may optionally have a desired Cu/(In+Ga) molar ratio in the range of greater than about 1.0 and a desired Ga/(Ga+n) molar ratio in the range of about 0.1 to about 0.8. The film may be reacted in a post-reacting step to change Cu/(In+Ga) to be in a range less than about 1.0. Solution deposition comprises using at least one of the following techniques: wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jetprinting, jet deposition, spray deposition, or combinations thereof.

In yet another embodiment of the present invention, a method is provided for bandgap grading. The method may be comprised of providing a bandgap grading material having an alloy of a) an group IA-based material and b) Ga. The particles of the alloy may be deposited over a previously formed Cu—In—Ga—Se based layer. The particles with the previously formed Cu—In—Ga—Se based layer may be reacted in a suitable atmosphere at a processing temperature, wherein the bandgap grading material is reacted to form a gallium-rich portion of the Cu—In—Ga—Se based layer over at least a portion of the previously formed Cu—In—Ga—Se based layer.

For any of the embodiments described herein, the following may also apply. The group IA-based material may be comprised of an Na-based material. The group IA-based material may be comprised of elemental Na. The alloy may be comprised of a Ga—Na based material. The alloy may be comprised of a Ga—Na—Se based material. It should be understood that any of the materials used herein are not limited to solution deposition but may also be suitable for deposition using vacuum-based techniques.

Inter-Metallics

In one embodiment, the method comprises forming a precursor layer on a substrate, wherein the precursor layer comprises one or more discrete layers. The layers may include at least a first layer containing one or more group IB elements and two or more different group IIIA elements and at least a second layer containing elemental chalcogen particles. The precursor layer may be heated to a temperature sufficient to melt the chalcogen particles and to react the chalcogen particles with the one or more group IB elements and group IIIA elements in the precursor layer to form a film of a group IB-IIIA-chalcogenide compound. The method may also include making a film of group IB-IIIA-chalcogenide compound that includes mixing the nanoparticles and/or nanoglobules and/or nanodroplets to form an ink, depositing the ink on a substrate, heating to melt the extra chalcogen and to react the chalcogen with the group IB and group IIIA elements and/or chalcogenides to form a dense film. In some embodiments, densification of the precursor layer is not used since the absorber layer may be formed without first sintering the precursor layer to a temperature where densification occurs. At least one set of the particles in the precursor layer are inter-metallic particles containing at least one group IB-IIIA inter-metallic alloy phase. Alternatively, at least one set of the particles in the precursor layer are formed from a feedstock of inter-metallic particles containing at least one group IB-IIIA inter-metallic alloy phase.

For any of the embodiments described herein, the following may also apply. Optionally, the first layer may be formed over the second layer. In another embodiment, the second layer may be formed over the first layer. The first layer may also contain elemental chalcogen particles. The first layer may have group IB elements in the form of a group IB-chalcogenide. The first layer may have group IIIA elements in the form of a group IIIA-chalcogenide. There may be a third layer containing elemental chalcogen particles. The two or more different group IIIA elements may include indium and gallium. The group IB element may be copper. The chalcogen particles may be particles of selenium, sulfur, and/or tellurium. The precursor layer may be substantially oxygen-free. Forming the precursor layer may include forming a dispersion including nanoparticles containing one or more group IB elements and nanoparticles containing two or more group IIIA elements, spreading a film of the dispersion onto the substrate. Forming the precursor layer may include sintering the film to form the precursor layer. Sintering the precursor layer may take place before the step of disposing the layer containing elemental chalcogen particles over the precursor layer. The substrate may be a flexible substrate and wherein forming the precursor layer and/or disposing the layer containing elemental chalcogen particles over the precursor layer, and/or heating the precursor layer and chalcogen particles includes the use of roll-to-roll manufacturing on the flexible substrate. The substrate may be an aluminum foil substrate. The group IB-IIIA-chalcogenide compound may be of the form $CuZn(1-x)Ga_xS2(1-y)Se2y$, where $0.5 \leq z \leq 1.5$, $0 \leq x \leq 1.0$ and $0 \leq y \leq 1.0$. In another embodiment of the present invention, heating of precursor layer and chalcogen particles may include heating the substrate and precursor layer from an ambient temperature to a plateau temperature range of between about 200° C. and about 600° C., maintaining a temperature of the substrate and precursor layer in the plateau range for a period of time ranging between about a fraction of a second to about 60 minutes, and subsequently reducing the temperature of the substrate and precursor layer.

In a still further embodiment of the present invention, a method is provided for forming a film of a group IB-IIIA-chalcogenide compound. The method includes forming a precursor layer on a substrate, wherein the precursor layer contains one or more group IB elements and one or more group IIIA elements. The method may include sintering the precursor layer. After sintering the precursor layer, the method may include forming a layer containing elemental chalcogen particles over the precursor layer. The method may also include heating the precursor layer and chalcogen particles to a temperature sufficient to melt the chalcogen particles and to react the chalcogen particles with the group IB element and group IIIA elements in the precursor layer to form a film of a group IB-IIIA-chalcogenide compound. The one or more group IIIA elements may include indium and gallium. The chalcogen particles may be particles of selenium, sulfur or tellurium. The precursor layer may be substantially oxygen-free. The method may include forming the precursor layer which includes forming a dispersion containing nanoparticles containing one or more group IB elements and nanoparticles containing two or more group IIIA elements, spreading a film of the dispersion onto a substrate. The method may include forming the precursor layer and/or sintering the precursor layer and/or disposing the layer containing elemental chalcogen particles over the precursor layer and/or heating the precursor layer and chalcogen particles to a temperature sufficient to melt the chalcogen particles includes the use of roll-to-roll manufacturing on the flexible substrate. The group IB-IIIA-chalcogenide compound may be of the form $CuZn(1-x)Ga_xS2(1-y)Se2y$, where $0.5 \leq z \leq 1.5$, $0 \leq x \leq 1.0$ and $0 \leq y \leq 1.0$.

For any of the embodiments described herein, the following may also apply. Sintering the precursor layer may include heating the substrate and precursor layer from an ambient temperature to a plateau temperature range of between about 200° C. and about 600° C., maintaining a temperature of the substrate and precursor layer in the plateau range for a period of time ranging between about a fraction of a second to about 60 minutes, and subsequently reducing the temperature of the substrate and precursor layer. Heating the precursor layer and chalcogen particles may include heating the substrate, precursor layer, and chalcogen particles from an ambient temperature to a plateau temperature range of between about 200° C. and about 600° C., maintaining a temperature of the substrate and precursor layer in the plateau range for a period of time ranging between about a fraction of a second to about 60 minutes, and subsequently reducing the temperature of the substrate and precursor layer. It should also be understood that the substrate may be an aluminum foil substrate.

In a still further embodiment of the present invention, a method is provided that is comprised of forming a precursor layer containing particles having one or more group IB elements and two or more different group IIIA elements and forming a layer containing surplus chalcogen particles providing a source of excess chalcogen, wherein the precursor layer and the surplus chalcogen layer are adjacent to one another. The precursor layer and the surplus chalcogen layer are heated to a temperature sufficient to melt the particles providing the source of excess chalcogen and to react the particles with the one or more group IB elements and group IIIA elements in the precursor layer to form a film of a group IB-IIIA-chalcogenide compound on a substrate. The surplus chalcogen layer may be formed over the precursor layer. The surplus chalcogen layer may be formed under the precursor layer. The particles providing the source of excess chalcogen may be comprised of elemental chalcogen particles. The particles providing the source of excess chalcogen may be comprised of chalcogenide particles. The particles providing the source of excess chalcogen may be comprised of chalcogen-rich chalcogenide particles. The precursor layer may also contain elemental chalcogen particles. The precursor layer may have group IB elements in the form of a group IB-chalcogenide. The precursor layer may have group IIIA elements in the form of a group IIIA-chalcogenide. A third layer may be provided that contains elemental chalcogen particles. The film may be formed from the precursor layer of the particles and a layer of a sodium-containing material in contact with the precursor layer.

For any of the embodiments described herein, the following may also apply. Optionally, the film may be formed from a precursor layer of the particles and a layer in contact with the precursor layer and containing at least one of the following materials: a group IB element, a group IIIA element, a group VIA element, a group IA element, a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide. In one embodiment, the particles contain sodium at about 1 at. % or less. The particles may contain at least one of the following materials: Cu—Na, In—Na, Ga—Na, Cu—In—Na, Cu—Ga—Na, In—Ga—Na, Na—Se, Cu—Se—Na, In—Se—Na, Ga—Se—Na, Cu—In—Se—Na, Cu—Ga—Se—Na, In—Ga—Se—Na, Cu—In—Ga—Se—Na, Na—S, Cu—S—Na, In—S—Na, Ga—S—Na, Cu—In—S—Na, Cu—Ga—S—Na, In—Ga—S—Na, or Cu—In—Ga—S—Na. The film may be formed from a precursor layer of the particles and an ink containing a sodium compound with an organic counter-ion or a sodium compound with an inorganic counter-ion. Optionally, the film may be formed from a precursor layer of the particles and a layer of a sodium containing material in contact with the precursor layer and/or particles containing at least one of the following materials: Cu—Na, In—Na, Ga—Na, Cu—In—Na, Cu—Ga—Na, In—Ga—Na, Na—Se, Cu—Se—Na, In—Se—Na, Ga—Se—Na, Cu—In—Se—Na, Cu—Ga—Se—Na, In—Ga—Se—Na, Cu—In—Ga—Se—Na, Na—S, Cu—S—Na, In—S—Na, Ga—S—Na, Cu—In—S—Na, Cu—Ga—S—Na, In—Ga—S—Na, or Cu—In—Ga—S—Na; and/or an ink containing the particles and a sodium compound with an organic counter-ion or a sodium compound with an inorganic counter-ion. The method may also include adding a sodium containing material to the film after the heating step.

For any of the embodiments described herein, the following may also apply. A liquid ink may be made using one or more liquid metals. For example, an ink may be made starting with a liquid and/or molten mixture of Gallium and/or Indium. Copper nanoparticles may then be added to the mixture, which may then be used as the ink/paste. Copper nanoparticles are available commercially. Alternatively, the temperature of the Cu—Ga—In mixture may be adjusted (e.g. cooled) until a solid forms. The solid may be ground at that temperature until small nanoparticles (e.g., less than 5 nm) are present. Selenium may be added to the ink and/or a film formed from the ink by exposure to selenium vapor, e.g., before, during, or after annealing.

In another embodiment, a liquid ink may be made using one or more liquid metals. For example, an ink may be made starting with a liquid and/or molten mixture of Gallium and/or Indium. Copper nanoparticles may then be added to the mixture, which may then be used as the ink/paste. Copper nanoparticles are available commercially. Alternatively, the temperature of the Cu—Ga—In mixture may be adjusted (e.g. cooled) until a solid forms. The solid may be ground at that temperature until small nanoparticles (e.g., less than 5 nm) are present. Selenium may be added to the ink and/or a film formed from the ink by exposure to selenium vapor, e.g., before, during, or after annealing.

In yet another embodiment of the present invention, a process is described comprising of formulating a dispersion of solid and/or liquid particles comprising group IB and/or IIIA elements, and, optionally, at least one group VIA element. The process includes depositing the dispersion onto a substrate to form a layer on the substrate and reacting the layer in a suitable atmosphere to form a film. In this process, at least one set of the particles are inter-metallic particles containing at least one group IB-IIIA inter-metallic phase.

In yet another embodiment of the present invention, a composition is provided comprised of a plurality of particles comprising group IB and/or IIIA elements, and, optionally, at least one group VIA element. At least one set of the particles contains at least one group IB-IIIA inter-metallic alloy phase.

For any of the embodiments described herein, the following may also apply. The method may include formulating a dispersion of particles comprising group IB and/or IIIA elements, and, optionally, at least one group VIA element. The method may include depositing the dispersion onto a substrate to form a layer on the substrate and reacting the layer in a suitable atmosphere to form a film. At least one set of the particles contain a group IB-poor, group IB-IIIA alloy phase. In some embodiments, group IB-poor particles contribute less than about 50 molar percent of group IB elements found in all of the particles. The group IB-poor, group IB-IIIA alloy phase particles may be a sole source of one of the group IIIA elements. The group IB-poor, group IB-IIIA alloy phase particles may contain an inter-metallic phase and may be a sole source of one of the group IIIA elements. The group IB-poor, group IB-IIIA alloy phase particles may contain an inter-metallic phase and are a sole source of one of the group IIIA elements. The group IB-poor, group IB-IIIA alloy phase particles may be $Cu_1In_2$ particles and are a sole source of indium in the material.

For any of the embodiments described herein, the following may also apply. It should be understood that for any of the foregoing, the film and/or final compound may include a group IB-IIIA-VIA compound. The reacting step may comprise of heating the layer in the suitable atmosphere. The depositing step may include coating the substrate with the dispersion. At least one set of the particles in the dispersion may be in the form of nanoglobules. At least one set of the particles in the dispersion may be in the form of nanoglobules and contain at least one group IIIA element. At least one set of the particles in the dispersion may be in the form of nanoglobules comprising of a group IIIA element in elemental form. In some embodiments of the present invention, the inter-metallic phase is not a terminal solid solution phase. In some embodiments of the present invention, the inter-metallic phase is not a solid solution phase. The inter-metallic particles may contribute less than about 50 molar percent of group IB elements found in all of the particles. The inter-metallic particles may contribute less than about 50 molar percent of group IIIA elements found in all of the particles. The inter-metallic particles may contribute less than about 50 molar percent of the group IB elements and less than about 50 molar percent of the group IIIA elements in the dispersion deposited on the substrate. The inter-metallic particles may contribute less than about 50 molar percent of the group IB elements and more than about 50 molar percent of the group IIIA elements in the dispersion deposited on the substrate. The inter-metallic particles may contribute more than about 50 molar percent of the group IB elements and less than about 50 molar percent of the group IIIA elements in the dispersion deposited on the substrate. The molar percent for any of the foregoing may be based on a total molar mass of the elements in all particles present in the dispersion. In some embodiments, at least some of the particles have a platelet shape. In some embodiments, a majority of the particles have a platelet shape. In other embodiments, substantially all of the particles have a platelet shape.

For any of the embodiments described herein, the following may also apply. For any of the foregoing embodiments, an inter-metallic material for use with the present invention is a binary material. The inter-metallic material may be a ternary material. It may be a copper rich (or group IB rich) ternary or binary. It may be a copper poor (or group IB poor) ternary or copper poor binary, wherein additional copper (or group IB material) may be added from a different source. The copper poor (or group IB poor) ternary or binary may contribute less than about 50% of the total group IB material in the precursor and/or final film. The copper poor (or group IB poor) ternary or binary may contribute less than about 40% of the total group IB material in the precursor and/or final film. The copper poor (or group IB poor) ternary or binary may contribute less than about 30% of the total group IB material in the precursor and/or final film. The copper poor (or group IB poor) ternary or binary may contribute less than about 20% of the total group IB material in the precursor and/or final film. The copper poor (or group IB poor) ternary or binary may contribute less than about 10% of the total group IB material in the precursor and/or final film. The inter-metallic material may comprise of $Cu_1In_2$. The inter-metallic material may be comprised of a composition in a δ phase of $Cu_1In_2$. The inter-metallic material may be comprised of a composition in between a δ phase of $Cu_1In_2$ and a phase defined by Cu16In9. The inter-metallic material may be comprised of $Cu_1Ga_2$. The inter-metallic material may be comprised of an intermediate solid-solution of $Cu_1Ga_2$. The inter-metallic material may be comprised of $Cu_{68}Ga_{38}$. The inter-metallic material may be comprised of $Cu_{70}Ga_{30}$. The inter-metallic material may be comprised of $Cu_{75}Ga_{25}$. The inter-metallic material may be comprised of a composition of Cu—Ga of a phase in between the terminal solid-solution and an intermediate solid-solution next to it. The inter-metallic may be comprised of a composition of Cu—Ga in a γ1 phase (about 31.8 to about 39.8 wt % Ga). The inter-metallic may be comprised of a composition of Cu—Ga in a γ2 phase (about 36.0 to about 39.9 wt % Ga). The inter-metallic may be comprised of a composition of Cu—Ga in a γ3 phase (about 39.7 to about −44.9 wt % Ga). The inter-metallic may be comprised of a composition of Cu—Ga in a phase between γ2 and γ3. The inter-metallic may be comprised of a composition of Cu—Ga in a phase between the terminal solid solution and γ1. The inter-metallic may be comprised of a composition of Cu—Ga in a θ phase (about 66.7 to about 68.7 wt % Ga). The inter-metallic material may be comprised of Cu-rich Cu—Ga. Gallium may be incorporated as a group IIIA element in the form of a suspension of nanoglobules. Nanoglobules of gallium may be formed by creating an emulsion of liquid gallium in a solution. Gallium nanoglobules may be created by being quenched below room temperature.

For any of the embodiments described herein, the following may also apply. A process according to the any of the foregoing embodiments of the present invention may include maintaining or enhancing a dispersion of liquid gallium in solution by stirring, mechanical means, electromagnetic means, ultrasonic means, and/or the addition of dispersants and/or emulsifiers. The process may include adding a mixture of one or more elemental particles selected from: aluminum, tellurium, or sulfur. The suitable atmosphere may contain selenium, sulfur, tellurium, $H_2$, CO, $H_2Se$, $H_2S$, Ar, $N_2$ or combinations or mixture thereof. The suitable atmosphere may contain at least one of the following: $H_2$, CO, Ar, and $N_2$. One or more classes of the particles may be doped with one or more inorganic materials. Optionally, one or more classes of the particles are doped with one or more inorganic materials chosen from the group of aluminum (Al), sulfur (S), sodium (Na), potassium (K), or lithium (Li). Optionally, embodiments of the present invention may include having a copper source that does not immediately alloy with In, and/or Ga. One option would be to use (slightly) oxidized copper. The other option would be to use CuxSey. Note that for the (slightly) oxidized copper approach, a reducing step may be desired. Basically, if elemental copper is used in liquid In and/or Ga, speed of the process between ink preparation and coating should be sufficient so that the particles have not grown to a size that will result in thickness non-uniform coatings. It should be understood that the temperature range may that of the substrate only since that is typically the only one that should not be heated above its melting point. This holds for the lowest melting material in the substrate, being Al and other suitable substrates.

Vapor

For any of the embodiments described herein, the following may also apply. In one embodiment of the present invention, the method comprises forming a precursor material comprising group IB and/or group IIIA particles of any shape. The method may include forming a precursor layer of the precursor material over a surface of a substrate. The method may further include heating the particle precursor material in a substantially oxygen-free chalcogen atmosphere to a processing temperature sufficient to react the particles and to release chalcogen from the chalcogenide particles, wherein the chalcogen assumes a liquid form and acts as a flux to improve intermixing of elements to form a group IB-IIIA-chalcogenide film at a desired stoichiometric ratio. The chalcogen atmosphere may provide a partial pressure greater than or equal to the vapor pressure of liquid chalcogen in the precursor layer at the processing temperature. This may be used in a one stage process or a two stage process.

For any of the embodiments described herein, the following may also apply. In one embodiment of the present invention, the method comprises forming a precursor material comprising group IB and/or group IIIA and/or group VIA particles of any shape. The method may include forming a precursor layer of the precursor material over a surface of a substrate. The method may further include heating the particle precursor material in a substantially oxygen-free chalcogen atmosphere to a processing temperature sufficient to react the particles and to release chalcogen from the chalcogenide particles, wherein the chalcogen assumes a liquid form and acts as a flux to improve intermixing of elements to form a group IB-IIIA-chalcogenide film at a desired stoichiometric ratio. The suitable atmosphere may be a selenium atmosphere. The suitable atmosphere may comprise of a selenium atmosphere providing a partial pressure greater than or equal to vapor pressure of selenium in the precursor layer. The suitable atmosphere may comprise of a non-oxygen atmosphere containing chalcogen vapor at a partial pressure of the chalcogen greater than or equal to a vapor pressure of the chalcogen at the processing temperature and processing pressure to minimize loss of chalcogen from the precursor layer, wherein the processing pressure is a non-vacuum pressure. The suitable atmosphere may comprises of a non-oxygen atmosphere containing chalcogen vapor at a partial pressure of the chalcogen greater than or equal to a vapor pressure of the chalcogen at the processing temperature and processing pressure to minimize loss of chalcogen from the precursor layer, wherein the processing pressure is a non-vacuum pressure and wherein the particles are one or more types of binary chalcogenides.

For any of the embodiments described herein, the following may also apply. In one embodiment of the present invention, the method comprises forming a precursor material comprising group IB-chalcogenide and/or group IIIA-chalcogenide particles, wherein an overall amount of chalcogen in the particles relative to an overall amount of chalcogen in a group IB-IIIA-chalcogenide film created from the precursor material, is at a ratio that provides an excess amount of chalcogen in the precursor material. The method also includes using the precursor material to form a precursor layer over a surface of a substrate. The particle precursor material is heated in a suitable atmosphere to a temperature sufficient to melt the particles and to release at least the excess amount of chalcogen from the chalcogenide particles, wherein the excess amount of chalcogen assumes a liquid form and acts as a flux to improve intermixing of elements to form the group IB-IIIA-chalcogenide film at a desired stoichiometric ratio. The overall amount of chalcogen in the precursor material is an amount greater than or equal to a stoichiometric amount found in the IB-IIIA-chalcogenide film.

For any of the embodiments described herein, the following may also apply. It should be understood that, optionally, the overall amount of chalcogen may be greater than a minimum amount necessary to form the final IB-IIIA-chalcogenide at the desired stoichiometric ratio. The overall amount of chalcogen in the precursor material may be an amount greater than or equal to the sum of: 1) the stoichiometric amount found in the IB-IIIA-chalcogenide film and 2) a minimum amount of chalcogen necessary to account for chalcogen lost during processing to form the group IB-IIIA-chalcogenide film having the desired stoichiometric ratio. Optionally, the overall amount may be about 2 times greater than a minimum amount necessary to form the IB-IIIA-chalcogenide film at the desired stoichiometric ratio. The particles may be chalcogen-rich particles and/or selenium-rich particles and/or sulfur-rich particles and/or tellurium-rich particles. In one embodiment, the overall amount of chalcogen in the group IB-chalcogenide particles is greater than an overall amount of chalcogen in the group IIIA particles. The overall amount of chalcogen in the group IB-chalcogenide particles may be less than an overall amount of chalcogen in the group IIIA particles.

For any of the embodiments described herein, the following may also apply. Optionally, the group IB-chalcogenide particles may include a mix of particles, wherein some particles are chalcogen-rich and some are not, and wherein the chalcogen-rich particles outnumber the particles that are not. The group IIIA-chalcogenide particles may include a mix of particles, wherein some particles are chalcogen-rich and some are not, and wherein the chalcogen-rich particles outnumber the particles that are not. The particles may be $IB_xVIA_y$ and/or $IIIA_aVIA_b$ particles, wherein $x<y$ and $a<b$. The resulting group IB-IIIA-chalcogenide film may be $CuZn(1-x)Ga_xSe\,2$, wherein $0.5 \leq z \leq 1.5$ and $0 \leq x \leq 1$. The amount of chalcogen in the particles may be above the stoichiometric ratio required to form the film. The particles may be substantially oxygen-free particles. The particles may be particles that do not contain oxygen above about 5.0 weight-percentage. The group IB element may be copper. The group IIIA element may be comprised of gallium and/or indium and/or aluminum. The chalcogen may be selenium or sulfur or tellurium. The particles may be alloy particles. The particles may be binary alloy particles and/or ternary alloy particles and/or multi-nary alloy particles and/or compound particles and/or solid-solution particles.

For any of the embodiments described herein, the following may also apply. Optionally, the precursor material may include group IB-chalcogenide particles containing a chalcogenide material in the form of an alloy of a chalcogen and an element of group IB and/or wherein the particle precursor material includes group IIIA-chalcogenide particles containing a chalcogenide material in the form of an alloy of a chalcogen and one or more elements of group IIIA. The group IB-chalcogenide may be comprised of CGS and the group IIIA-chalcogenide may be comprised of CIS. The method may include adding an additional source of chalcogen prior to heating the precursor material. The method may include adding an additional source of chalcogen during heating of the precursor material. The method may further include adding an additional source of chalcogen before, simultaneously with, or after forming the precursor layer. The method may include adding an additional source of chalcogen by forming a layer of the additional source over the precursor layer. The method may include adding an additional source of chalcogen on the substrate prior to forming the precursor layer. A vacuum-based process may be used to add an additional source of chalcogen in contact with the precursor layer. The amounts of the group IB element and amounts of chalcogen in the particles may be selected to be at a stoichiometric ratio for the group IB chalcogenide that provides a melting temperature less than a highest melting temperature found on a phase diagram for any stoichiometric ratio of elements for the group IB chalcogenide. The method may include using a source of extra chalcogen that includes particles of an elemental chalcogen. The extra source of chalcogen may be a chalcogenide. The amounts of the group IIIA element and amounts of chalcogen in the particles may be selected to be at a stoichiometric ratio for the group IIIA chalcogenide that provides a melting temperature less than a highest melting temperature found on a phase diagram for any stoichiometric ratio of elements for the group IIIA chalcogenide.

For any of the embodiments described herein, the following may also apply. Optionally, the group IB-chalcogenide particles may be $Cu_xSe_y$, wherein the values for x and y are selected to create a material with a reduced melting temperature as determined by reference to the highest melting temperature on a phase diagram for Cu—Se. The group IB-chalcogenide particles may be $Cu_xSe_y$, wherein x is in the range of about 2 to about 1 and y is in the range of about 1 to about 2. The group IIIA-chalcogenide particles may be $In_xSe_y$, wherein the values for x and y are selected to create a material with a reduced melting temperature as determined by reference to the highest melting temperature on a phase diagram for In—Se. The group IIIA-chalcogenide particles may be $In_xSe_y$, wherein x is in the range of about 1 to about 6 and y is in the range of about 0 to about 7. The group IIIA-chalcogenide particles may be $Ga_xSe_y$, wherein the values for x and y are selected to create a material with a reduced melting temperature as determined by reference to the highest melting temperature on a phase diagram for Ga—Se. The group IIIA-chalcogenide particles may be $Ga_xSe_y$, wherein x is in the range of about 1 to about 2 and y is in the range of about 1 to about 3. The melting temperature may be at a eutectic temperature for the material as indicated on the phase diagram. The group IB or IIIA chalcogenide may have a stoichiometric ratio that results in the group IB or IIIA chalcogenide being less thermodynamically stable than the group IB-IIIA-chalcogenide compound.

In yet another embodiment of the present invention, a precursor material is provided that is comprised of group IB-chalcogenide particles containing a substantially oxygen-free chalcogenide material in the form of an alloy of a chalcogen with an element of group IB; and/or group IIIA-chalcogenide particles containing a substantially oxygen-free chalcogenide material in the form of an alloy of a chalcogen with one or more elements of group IIIA. The group IB-chalcogenide particles and/or the group IIIA-chalcogenide particles may have a stoichiometric ratio that provides a source of surplus chalcogen, wherein the overall amount of chalcogen in the precursor material is an amount greater than or equal to a stoichiometric amount found in the IB-IIIA-chalcogenide film. The overall amount of chalcogen in the precursor material is an amount greater than or equal to the sum of: 1) the stoichiometric amount found in the IB-IIIA-chalcogenide film and 2) a minimum amount of chalcogen necessary to account for chalcogen lost during processing to form the group IB-IIIA-chalcogenide film having the desired stoichiometric ratio. The overall amount may be greater than a minimum amount necessary to form the IB-IIIA-chalcogenide film at the desired stoichiometric ratio. The overall amount may be about 2 times greater than a minimum amount necessary to form the IB-IIIA-chalcogenide film at the desired stoichiometric ratio.

The material may be solid at the processing temperature used in deposition and around the ink preparation temperature complicating controlling particle size. If too much liquid is present at or near the onset of a reaction, liquid may group together at certain areas and not be evenly distributed throughout the reaction area. This can result in thickness non-uniformity and/or lateral composition non-uniformity. Furthermore, if material in liquid form leaches out from an alloy or compound containing that material, this may change the local stoichiometry at the start of the reaction resulting in different compound(s) in the final thin-film if the leaching occurs prior to or during processing of the materials. Some embodiments may have a composition where there is a mixture of elemental Ga and solid Ga4Na. This can be generalized to a composition where there is elemental group IIIA material and group IA-IIIA material.

A further understanding of the nature and advantages of the invention will become apparent by reference to the remaining portions of the specification and drawings.

BRIEF DESCRIPTION OF THE DRAWINGS

FIGS. 7A through 7C show one method of bandgap grading according to an embodiment of the present invention.

FIGS. 8A through 8C show another method of bandgap grading according to an embodiment of the present invention.

FIGS. 13A through 13E cross-sectional schematics showing that layers of material may be deposited above and/or below the precursor layer according to embodiments of the present invention.

DESCRIPTION OF THE SPECIFIC EMBODIMENTS

Figure 1A:
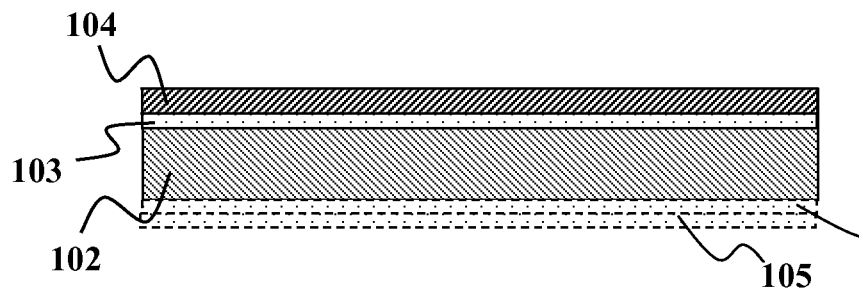
FIGS. 1A-1D are schematic cross-sectional diagrams illustrating fabrication of a film according to an embodiment of the present invention.

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for a barrier film, this means that the barrier film feature may or may not be present, and, thus, the description includes both structures wherein a device possesses the barrier film feature and structures wherein the barrier film feature is not present.

Photovoltaic Device Chemistry

The solid particles for use with the present invention may be used with a variety of different chemistries to arrive at a desired semiconductor film. Although not limited to the following, an active layer for a photovoltaic device may be fabricated by first formulating an ink of spherical and/or non-spherical particles each containing at least one element from groups IB, IIIA and/or VIA, coating a substrate with the ink to form a precursor layer, and heating the precursor layer to form a dense film. In a two step process, the dense film may then be processed in a suitable atmosphere to form a group IB-IIIA-VIA compound. In other embodiments, the precursor layer forms a layer with a group IB-IIIA-VIA compound in a one step process. Optionally, others may take one or more steps. It should be understood that reduction and/or densification of the precursor layer may not be needed in some embodiments, particularly if the precursor materials are oxygen-free or substantially oxygen free. Thus, the heating step may optionally be skipped if the particles are processed air-free and are oxygen-free. The resulting group IB-IIIA-VIA compound for either a one step or a two step process may be a compound of Cu, In, Ga and selenium (Se) and/or sulfur S of the form $CuIn_{(1-x)}Ga_xS_{2(1-y)}Se_{2y}$, where $0 \leq x \leq 1$ and $0 \leq y \leq 1$. Optionally, it should also be understood that the resulting group IB-IIIA-VIA compound may be a compound of Cu, In, Ga and selenium (Se) and/or sulfur S of the form $Cu_zIn_{(1-x)}Ga_xS_{2(1-y)}Se_{2y}$, where $0.5 \leq z \leq 1.5$, $0 \leq x \leq 1.0$ and $0 \leq y \leq 1.0$. Some embodiments may also form the desired semiconductor film in a one step process.

It should be understood that group IB, IIIA, and VIA elements other than Cu, In, Ga, Se, and S may be included in the description of the IB-IIIA-VIA materials described herein, and that the use of a hyphen ("—" e.g., in Cu—Se or Cu—In—Se) does not indicate a compound, but rather indicates a coexisting mixture of the elements joined by the hyphen. It is also understood that group IB is sometimes referred to as group 11, group IIIA is sometimes referred to as group 13 and group VIA is sometimes referred to as group 16. Furthermore, elements of group VIA (16) are sometimes referred to as chalcogens. Where several elements can be combined with or substituted for each other, such as In and Ga, or Se, and S, in embodiments of the present invention, it is not uncommon in this art to include in a set of parentheses those elements that can be combined or interchanged, such as (In, Ga) or (Se, S). The descriptions in this specification sometimes use this convenience. Finally, also for convenience, the elements are discussed with their commonly accepted chemical symbols. Group IB elements suitable for use in the method of this invention include copper (Cu), silver (Ag), and gold (Au). Preferably the group IB element is copper (Cu). Group IIIA elements suitable for use in the method of this invention include gallium (Ga), indium (In), aluminum (Al), and thallium (Tl). Preferably the group IIIA element is gallium (Ga) and/or indium (In). Group VIA elements of interest include selenium (Se), sulfur (S), and tellurium (Te), and preferably the group VIA element is either Se and/or S. It should be understood that mixtures such as, but not limited to, alloys, solid solutions, and compounds of any of the above can also be used. The shapes of the solid particles may be any of those described herein.

Method of Forming a Film

Referring now to FIG. 1, one method of forming a semiconductor film from solid particles according to the present invention will now be described. It should be understood that the present embodiment of the invention uses non-vacuum techniques to form the semiconductor film. Other embodiments of the invention, however, may optionally form the film under a vacuum environment in one or more steps, and the use of solid particles (non-spherical and/or spherical) is not limited to only non-vacuum coating techniques.

As seen in FIG. 1, a substrate 102 is provided. By way of non-limiting example, the substrate 102 may be made of a metal such as aluminum. In other embodiments, metals such as, but not limited to, stainless steel, molybdenum, titanium, copper, metallized plastic films, coated metal foils, or combinations of the foregoing may be used as the substrate 102. Alternative substrates include but are not limited to ceramics, glasses, and the like. Any of these substrates may be in the form of foils, sheets, rolls, the like, or combinations thereof. Depending on the material of the substrate 102, it may be useful to form or apply a contact layer 104 to the surface of substrate 102 to promote electrical contact between the substrate 102 and the absorber layer that is to be formed on it. As a nonlimiting example, when the substrate 102 is made of aluminum, the contact layer 104 may be but is not limited to a layer of molybdenum. For the purposes of the present discussion, the contact layer 104 may be regarded as being part of the substrate. As such, any discussion of forming or disposing a material or layer of material on the substrate 102 includes disposing or forming such material or layer on the contact layer 104, if one is used. Optionally, other layers of materials may also be used with the contact layer 104 for insulation or other purposes and still considered part of the substrate 102. It should be understood that the contact layer 104 may comprise of more than one type or more than one discrete layer of material. Optionally, some embodiments may use any one and/or combinations of the following for the contact layer: a copper, aluminum, chromium, molybdenum, vanadium, etc. and/or iron-cobalt alloys.

Aluminum and molybdenum can and often do inter-diffuse into one another, especially upon heating to elevated temperatures as used for absorber growth, with deleterious electronic and/or optoelectronic effects on the device 100. Furthermore aluminum can diffuse though molybdenum into layers beyond e.g. CIG(S). To inhibit such inter-diffusion, an intermediate, interfacial layer 103 may be incorporated between the aluminum foil substrate 102 and molybdenum base electrode 104. The interfacial layer may be composed of any of a variety of materials, including but not limited to chromium, vanadium, tungsten, and glass, or compounds such as nitrides (including but not limited to titanium nitride, tantalum nitride, tungsten nitride, hafnium nitride, niobium nitride, zirconium nitride, vanadium nitride, silicon nitride, or molybdenum nitride), oxynitrides (including but not limited to oxynitrides of Ti, Ta, V, W, Si, Zr, Nb, Hf, or Mo), oxides, and/or carbides. The material may be selected to be an electrically conductive material. In one embodiment, the materials selected from the aforementioned may be those that are electrically conductive diffusion barriers. The thickness of this layer can range from 10 nm to 50 nm or from 10 nm to 30 nm. Optionally, the thickness may be in the range of about 50 nm to about 1000 nm. Optionally, the thickness may be in the range of about 100 nm to about 750 nm. Optionally, the thickness may be in the range of about 100 nm to about 500 nm. Optionally, the thickness may be in the range of about 110 nm to about 300 nm. In one embodiment, the thickness of the layer 103 is at least 100 nm or more. In another embodiment, the thickness of the layer 103 is at least 150 nm or more. In one embodiment, the thickness of the layer 103 is at least 200 nm or more. Optionally, some embodiments may include another layer such as but not limited to a copper layer, a titanium layer, or other metal layer above the layer 103 and below the base electrode layer 104. Optionally, some embodiments may include another layer such as but not limited to a copper layer, a titanium layer, an aluminum layer, or other metal layer below the layer 103 and below the base electrode layer 104. This layer may be thicker than the layer 103. Optionally, it may be the same thickness or thinner than the layer 103. This layer 103 may be placed on one or optionally both sides of the aluminum foil (shown as layer 105 in phantom in FIG. 1).

If barrier layers are on both sides of the aluminum foil, it should be understood that the protective layers may be of the same material or they may optionally be different materials from the aforementioned materials. The bottom protective layer 105 may be any of the materials. Optionally, some embodiments may include another layer 107 such as but not limited to an aluminum layer above the layer 105 and below the aluminum foil 102. This layer 107 may be thicker than the layer 103 (or the layer 104). Optionally, it may be the same thickness or thinner than the layer 103 (or the layer 104). Although not limited to the following, this layer 107 may be comprised of one or more of the following: Mo, Cu, Ag, Al, Ta, Ni, Cr, NiCr, or steel. Some embodiments may optionally have more than one layer between the protective layer 105 and the aluminum foil 102. Optionally, the material for the layer 105 may be an electrically insulating material such as but not limited to an oxide, alumina, or similar materials. For any of the embodiments herein, the layer 105 may be used with or without the layer 107.

Figure 1B:
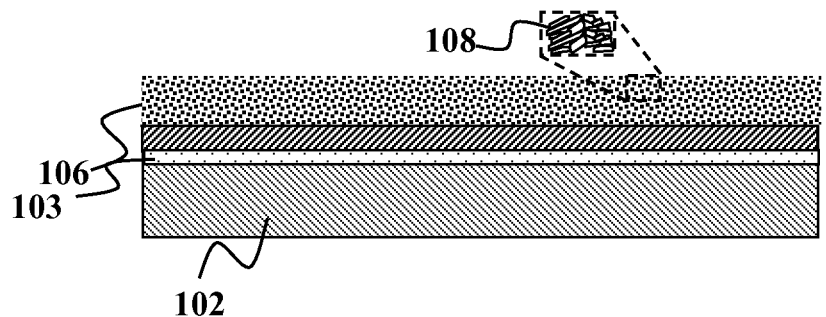

Referring now to FIG. 1B, a precursor layer 106 is formed over the substrate 102 by coating the substrate 102 with a dispersion such as but not limited to an ink. As one nonlimiting example, the ink may be comprised of a carrier liquid mixed with the microflakes 108 and has a rheology that allows the ink to be coatable over the substrate 102. In one embodiment, the present invention may use dry powder mixed with the vehicle and sonicated before coating. Optionally, the inks may be already formulated as the precursor materials are formed in the mill. In the case of mixing a plurality of flake compositions, the product may be mixed from various mills. This mixing could be sonicated but other forms of mechanical agitation and/or another mill may also be used. The ink used to form the precursor layer 106 may contain non-spherical particles 108 such as but not limited to microflakes and/or nanoflakes. It should also be understood that the ink may optionally use both non-spherical and spherical particles in any of a variety of relative proportions.

FIG. 1B includes a close-up view of the microflakes 108 in the precursor layer 106, as seen in the enlarged image. Microflakes have non-spherical shapes and are substantially planar on at least one side. A more detailed view of one embodiment of the microflakes 108 can be found in FIGS. 2A and 2B of U.S. patent application Ser. No. 11/362,266 filed Feb. 23, 2006 and fully incorporated herein by reference. Microflakes may be defined as particles having at least one substantially planar surface with a length and/or largest lateral dimension of about 500 nm or more and the particles have an aspect ratio of about 2 or more. In other embodiments, the microflake is a substantially planar structure with thickness of between about 10 and about 250 nm and lengths between about 500 nm and about 5 microns. It should be understood that in other embodiments of the invention, microflakes may have lengths as large as 10 microns. Optionally, other microflakes may be those with a thickness dimension substantially less than its length and width. In such other embodiments, flakes may be curved or undulating, or other non-planar shape, but still have a high aspect ratio between thickness and length-to-width. Although not limited to the following, at least some of the solid group IIIA-particles may be processed into planar particles and adapted for use during solution deposition.

It should be understood that different types of particles such as microflakes 108 may be used to form the precursor layer 106. In one nonlimiting example, the microflakes are elemental microflakes, i.e., microflakes having only a single atomic species. The microflakes may be single metal particles of Cu, Ga, In, or Se. Some inks may have only one type of microflake. Other inks may have two or more types of microflakes which may differ in material composition and/or other quality such as but not limited to shape, size, interior architecture (e.g. a central core surrounded by one or more shell layers) exterior coating, or the like. In one embodiment, the ink used for precursor layer 106 may contain microflakes comprising one or more group IB elements and microflakes comprising one or more different group IIIA elements. Optionally, the precursor layer 106 contains copper, indium and gallium. In another embodiment, the precursor layer 106 may be an oxygen-free layer containing copper, indium and gallium. Optionally, the ratio of elements in the precursor layer may be such that the layer, when processed, forms one or more compounds of a compound of $CuIn_xGa_{1-x}$, where $0 \leq x \leq 1$. Those of skill in the art will recognize that other group IB elements may be partially or completely substituted for Cu and other group IIIA elements may be partially or completely substituted for In and Ga. Optionally, the precursor may contain Se as well, such as but not limited to Cu—In—Ga—Se flakes. This is feasible if the precursor is oxygen-free and densification is not needed. Optionally, this is also feasible when the precursor layer is not oxygen-free or when densification prior to absorber-growth is desired. Two nonlimiting examples are provided. One nonlimiting example would be to densify a precursor layer that is Se-poor, where the Se is mainly added to limit undesired oxidation of the particles, and in a subsequent step form the absorber layer. Another nonlimiting example would be to form the absorber layer from a Se-poor precursor layer in one step without the need for a separate densification step. In still further embodiments, the precursor material may contain microflakes of group IB, IIIA, and VIA elements. In one nonlimiting example, the precursor may contain Cu—In—Ga—Se microflakes, which would be particularly advantageous if the microflakes are formed air free and densification prior to film formation is not needed.

Optionally, the microflakes 108 in the ink may be of alloy material. In one nonlimiting example, the alloy microflakes may be binary alloy microflakes such as but not limited to Cu—In, In—Ga, or Cu—Ga. Alternatively, the microflakes may be a binary alloy of group IB, IIIA elements, a binary alloy of Group IB, VIA elements, and/or a binary alloy of group IIIA, VIA elements. In other embodiments, the particles may be a ternary alloy of group IB, IIIA, and/or VIA elements. For example, the particles may be ternary alloy particles of any of the above elements such as but not limited to Cu—In—Ga. In other embodiments, the ink may contain particles that are a quaternary alloy of group IB, IIIA, and/or VIA elements. Some embodiments may have quaternary or multi-nary microflakes. The ink may also combine microflakes of different classes such as but not limited to elemental microflakes with alloy microflakes or the like. In one embodiment of the present invention, the microflakes used to form the precursor layer 106 contain no oxygen other than those amounts unavoidably present as impurities. Optionally, the microflakes contain less than about 0.1 wt % of oxygen. In other embodiments, the microflakes contain less than about 0.5 wt % of oxygen. In still further embodiments, the microflakes contain less than about 1.0 wt % of oxygen. In yet another embodiment, the microflakes contain less than about 3.0 wt % of oxygen. In other embodiments, the microflakes contain less than about 5.0 wt % of oxygen. Some embodiments may have a shell layer that contains 0 to 5 wt % of oxygen. Optionally, the shell may have 5-25 wt % of oxygen. Optionally, the shell may be a full oxide. Any of the foregoing may optionally be applied to any particles used with the present invention, regardless of shape or size. It should also be understood that the source of group VIA material may be added as discussed in commonly assigned, co-pending U.S. patent application Ser. No. 11/243,522 filed on Feb. 23, 2006 and fully incorporated herein by reference.

Optionally, the microflakes 108 in the ink may be chalcogenide particles, such as but not limited to, a group IB or group IIIA selenide. In one nonlimiting example, the microflakes may be a group IB-chalcogenide formed with one or more elements of group IB (new-style: group 11), e.g., copper (Cu), silver (Ag), and gold (Au). Examples include, but are not limited to, $Cu_xSe_y$, wherein x is in the range of about 1 to 10 and y is in the range of about 1 to 10. In some embodiments of the present invention, x<y. Alternatively, some embodiments may have selenides that are more selenium rich, such as but not limited to, $Cu_1Se_x$ (where x>1). This may provide an increased source of selenium as discussed in commonly assigned, co-pending U.S. patent application Ser. No. 11/243,522 filed on Feb. 23, 2006 and fully incorporated herein by reference. Alternatively, some embodiments may have selenides that are selenium poor, such as but not limited to, $Cu_1 Se_x$ (where x<1). In another nonlimiting example, the microflakes may be a group IIIA-chalcogenide formed with one or more elements of group IIIA (new style: group 16), e.g., aluminum (Al), indium (In), gallium (Ga), and thallium (Tl). Examples include $In_xSe_y$ and $Ga_xSe_y$, wherein x is in the range of about 1 to about 10 and y is in the range of about 1 to about 10. Still further, the microflakes may be a Group IB-IIIA-chalcogenide compound of one or more group IB elements, one or more group IIIA elements and one or more chalcogens. Examples include $CuInGa—Se_2$. Other embodiments may replace the selenide component with another group VIA element such as but not limited to sulfur, or combinations of multiple group VIA elements such as both sulfur and selenium. Any of the foregoing may optionally apply to any particles used with the present invention, regardless of shape or size.

It should be understood that the ink used in the present invention may include more than one type of chalcogenide microflakes. For example, some may include microflakes from both group IB-chalcogenide(s) and group IIIA-chalcogenide(s). Others may include microflakes from different group IB-chalcogenides with different stoichiometric ratios. Others may include microflakes from different group IIIA-chalcogenides with different stoichiometric ratios.

Optionally, the microflakes 108 in the ink may also be particles of at least one solid solution. In one nonlimiting example, the nano-powder may contain copper-gallium solid solution particles, and at least one of indium particles, indium-gallium solid-solution particles, copper-indium solid solution particles, and copper particles. Alternatively, the nano-powder may contain copper particles and indium-gallium solid-solution particles. Yet in another nonlimiting example, the nano-powder may contain both copper particles and copper-indium-gallium solid-solution particles Generally, an ink may be formed by dispersing the microflakes (and/or other particles) in a vehicle containing a dispersant (e.g., a surfactant or polymer) along with (optionally) some combination of other components commonly used in making inks. In some embodiments of the present invention, the ink is formulated without a dispersant or other additives. The carrier liquid may be an aqueous (water-based) or non-aqueous (organic) solvent. Other components include, without limitation, dispersing agents, binders, emulsifiers, anti-foaming agents, dryers, solvents, fillers, extenders, thickening agents, film conditioners, anti-oxidants, flow and leveling agents, plasticizers and preservatives. These components can be added in various combinations to improve the film quality and optimize the coating properties of the microflake dispersion. An alternative method to mixing microflakes and subsequently preparing a dispersion from these mixed microflakes would be to prepare separate dispersions for each individual type of microflake and subsequently mixing these dispersions. It should be understood that, due to favorable interaction of the planar shape of the microflakes with the carrier liquid, some embodiments of the ink may be formulated by use of a carrier liquid and without a dispersing agent.

The precursor layer 106 from the dispersion may be formed on the substrate 102 by any of a variety of solution-based coating techniques including but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, and the like, as well as combinations of the above and/or related technologies. The foregoing may apply to any embodiments herein, regardless of particle size or shape.

In some embodiments, extra chalcogen, alloys particles, or elemental particles, e.g., micron- or sub-micron-sized chalcogen powder may be mixed into the dispersion containing the microflakes so that the microflakes and extra chalcogen are deposited at the same time. Alternatively the chalcogen powder may be deposited on the substrate in a separate solution-based coating step before or after depositing the dispersion containing the particles. In other embodiment, group IIIA elemental material such as but not limited to gallium droplets may be mixed with the flakes. This is more fully described in commonly assigned, copending U.S. patent application Ser. No. 11/243,522 filed on Feb. 23, 2006 and fully incorporated herein by reference. This may create an additional layer 107 (shown in phantom in FIG. 1C). Optionally, additional chalcogen may be added by any combination of (1) any chalcogen source that can be solution-deposited, e.g. a Se, S, or calcogen-containing alloy nano- or micron-sized powder mixed into the precursor layers or deposited as a separate layer, (2) chalcogen (e.g., Se or S) evaporation, (3) an $H_2Se$ ($H_2S$) atmosphere, (4) a chalcogen (e.g., Se or S) atmosphere, (5) an $H_2$ atmosphere, (6) an organo-selenium atmosphere, e.g. diethylselenide or another organo-metallic material, (7) another reducing atmosphere, e.g. CO, (8) a wet chemical reduction step, and a (9) heat treatment. The stoichiometric ratio of microflakes to extra chalcogen, given as Se/(Cu+In+Ga+Se) may be in the range of about 0 to about 1000. This is purely exemplary and nonlimiting. Any of the foregoing may optionally apply to any particles used with the present invention, regardless of shape or size.

Note that the solution-based deposition of the proposed mixtures of microflakes does not necessarily have to be performed by depositing these mixtures in a single step. In some embodiments of the present invention, the coating step may be performed by sequentially depositing microflake dispersions having different compositions of IB-, IIIA- and chalcogen-based particulates in two or more steps. For example, the method may be to first deposit a dispersion containing an indium selenide microflake (e.g. with an In-to-Se ratio of ~1), and subsequently deposit a dispersion of a copper selenide microflake (e.g. with a Cu-to-Se ratio of ~1) and a gallium selenide microflake (e.g. with a Ga-to-Se ratio of ~1) followed optionally by depositing a dispersion of Se. This would result in a stack of three solution-based deposited layers, which may be heated together. Alternatively, each layer may be heated before depositing the next layer. A number of different sequences are possible. For example, a layer of $In_xGa_ySe_z$ with $x \geq 0$ (larger than or equal to zero), $y \geq 0$ (larger than or equal to zero), and $z \geq 0$ (larger than or equal to zero), may be formed as described above on top of a uniform, dense layer of $Cu_wIn_xGa_y$ with $w \geq 0$ (larger than or equal to zero), $x \geq 0$ (larger than or equal to zero), and $y \geq 0$ (larger than or equal to zero), and subsequently converting the two layers into CIGS. Alternatively a layer of $Cu_wIn_xGa_y$ may be formed on top of a uniform, dense layer of $In_xGa_ySe_z$ and subsequently converting the two layers into CIGS.

In alternative embodiments, microflake-based dispersions as described above may further include elemental IB, and/or IIIA nanoparticles (e.g., in metallic form). These nanoparticles may be in flake form, or optionally, take other shapes such as but not limited to spherical, spheroidal, oblong, cubic, or other non-planar shapes. These particles may also include but is not limited to emulsions, molten materials, mixtures, and the like, in addition to solids. For example $Cu_xIn_yGa_zSe_u$ materials, with $u > 0$ (larger than zero), with $x \geq 0$ (larger than or equal to zero), $y \geq 0$ (larger than or equal to zero), and $z \geq 0$ (larger than or equal to zero), may be combined with an additional source of selenium (or other chalcogen) and metallic gallium into a dispersion that is formed into a film on the substrate by heating. Metallic gallium nanoparticles and/or nanoglobules and/or nanodroplets may be formed, e.g., by initially creating an emulsion of liquid gallium in a solution. Gallium metal or gallium metal in a solvent with or without emulsifier may be heated to liquefy the metal, which is then sonicated and/or otherwise mechanically agitated in the presence of a solvent. Agitation may be carried out either mechanically, electromagnetically, or acoustically in the presence of a solvent with or without a surfactant, dispersant, and/or emulsifier. The gallium nanoglobules and/or nanodroplets can then be manipulated in the form of a solid-particulate, by quenching in an environment either at or below room temperature to convert the liquid gallium nanoglobules into solid gallium nanoparticles. This technique is described in detail in commonly-assigned U.S. patent application Ser. No. 11/081,163 to Matthew R. Robinson and Martin R. Roscheisen entitled "Metallic Dispersion", the entire disclosures of which are incorporated herein by reference.

Figure 1C:
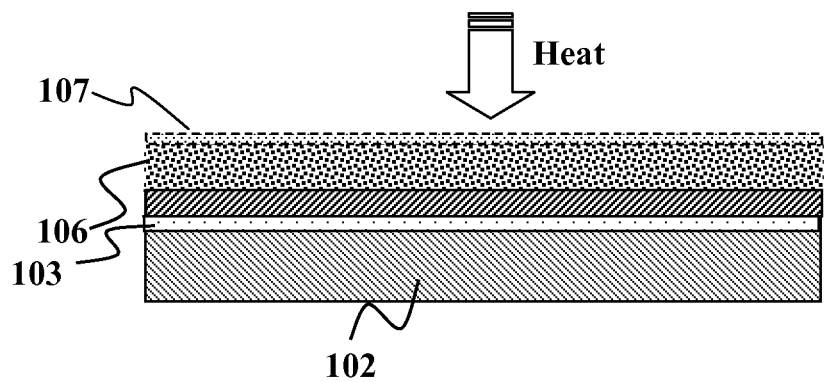

Referring now to FIG. 1C, the precursor layer 106 may then be processed in a suitable atmosphere to form a film. The film may be a dense film. In one embodiment, this involves heating the precursor layer 106 to a temperature sufficient to convert the ink (as-deposited ink. Note that solvent and possibly dispersant have been removed by drying) to a film. The temperature may be between about 375° C. and about 525° C. (a safe temperature range for processing on aluminum foil or high-melting-temperature polymer substrates). The processing may occur at various temperatures in the range, such as but not limited to 450° C. In other embodiments, the temperature at the substrate may be between about 400° C. and about 600° C. at the level of the precursor layer, but optionally cooler at the substrate. The time duration of the processing may also be reduced by at least about 20% if certain steps are removed. In one embodiment, the heating may occur over a range between about two minutes to about ten minutes. In one embodiment, the processing comprises heating the precursor layer to a temperature greater than about 375° C. but less than a melting temperature of the substrate for a period of less than about 15 minutes. In another embodiment, the processing comprises heating the precursor layer to a temperature greater than about 375° C. but less than a melting temperature of the substrate for a period of about 1 minute or less. In a still further embodiment, the processing comprises heating the precursor layer to an annealing temperature but less than a melting temperature of the substrate for a period of about 1 minute or less. The processing step may also be heated and/or accelerated via thermal processing techniques using at least one of the following processes: pulsed thermal processing, exposure to laser beams, or heating via IR lamps, and/or similar or related processes. Although not limited by the following, one-step processes typically occur in a reactive atmosphere, while multi-step processes may include one or steps in non-reactive atmosphere(s) while the remaining steps are in an reactive atmosphere.

Although pulsed thermal processing remains generally promising, certain implementations of the pulsed thermal processing such as a directed plasma arc system, face numerous challenges. In this particular example, a directed plasma arc system sufficient to provide pulsed thermal processing is an inherently cumbersome system with high operational costs. The direct plasma arc system requires power at a level that makes the entire system energetically expensive and adds significant cost to the manufacturing process. The directed plasma arc also exhibits long lag time between pulses and thus makes the system difficult to mate and synchronize with a continuous, roll-to-roll system. The time it takes for such a system to recharge between pulses also creates a very slow system or one that uses more than one directed plasma arc, which rapidly increase system costs.

In some embodiments of the present invention, other devices suitable for rapid thermal processing may be used and they include pulsed lasers used in adiabatic mode for annealing (Shtyrokov E I, *Soy. Phys.—Semicond.* 9 1309), continuous wave lasers (10-30W typically) (Ferris S D 1979 *Laser-Solid Interactions and Laser Processing* (New York: AIP)), pulsed electron beam devices (Kamins T I 1979 *Appl. Phys. Leti.* 35 282-5), scanning electron beam systems (McMahon R A 1979 *J. Vac. Sci. Techno.* 16 1840-2) (Regolini J L 1979 *Appl. Phys. Lett.* 34 410), other beam systems (Hodgson R T 1980 *Appl. Phys. Lett.* 37 187-9), graphite plate heaters (Fan J C C 1983 *Mater. Res. Soc. Proc.* 4 751-8) (M W Geis 1980 *Appl. Phys. Lett.* 37 454), lamp systems (Cohen R L 1978 *Appl. Phys. Lett.* 33 751-3), and scanned hydrogen flame systems (Downey D F 1982 *Solid State Technol.* 25 87-93). In some embodiments of the present invention, a non-directed, low density system may be used. Alternatively, other known pulsed heating processes are also described in U.S. Pat. Nos. 4,350,537 and 4,356,384. Additionally, it should be understood that methods and apparatus involving pulsed electron beam processing and rapid thermal processing of solar cells as described in expired U.S. Pat. Nos. 3,950,187 ("Method and apparatus involving pulsed electron beam processing of semiconductor devices") and 4,082,958 ("Apparatus involving pulsed electron beam processing of semiconductor devices") are in the public domain and well known. U.S. Pat. Nos. 4,729,962 also describes another known method for rapid thermal processing of solar cells. The above may be applied singly or in single or multiple combinations with the above or other similar processing techniques with various embodiments of the present invention.

It should be noted that using microflakes typically results in precursor layers that heat into a solid layer at temperatures as much as 50° C. lower than a corresponding layer of spherical nanoparticles. This is due in part because of the greater surface area contact between particles. Of course, it should be understood that the use of solid group IIIA-based particles is not limited to only planar particles such as microflakes, and those solid group IIIA-based particles may be suitable for particles of various shapes.

In certain embodiments of the invention, the precursor layer 106 (or any of its sub-layers) may be annealed, either sequentially or simultaneously. Such annealing may be accomplished by rapid heating of the substrate 102 and precursor layer 106 from an ambient temperature to a plateau temperature range of between about 200° C. and about 600° C. In this embodiment of the invention, the temperature is maintained in the plateau range for a period of time ranging between about a fraction of a second to about 60 minutes, and subsequently reduced. Alternatively, the annealing temperature could be modulated to oscillate within a temperature range without being maintained at a particular plateau temperature. This technique (referred to herein as rapid thermal annealing or RTA) is particularly suitable for forming photovoltaic active layers (sometimes called "absorber" layers) on metal foil substrates, such as but not limited to aluminum foil. Other suitable substrates include but are not limited to other metals such as Stainless Steel, Copper, Titanium, or Molybdenum, metallized plastic foils, glass, ceramic films, and mixtures, alloys, and blends of these and similar or related materials. The substrate may be flexible, such as the form of a foil, or rigid, such as the form of a plate, or combinations of these forms. Additional details of this technique are described in U.S. patent application Ser. No. 10/943,685, which is incorporated herein by reference.

The atmosphere associated with the annealing step may also be varied. In one embodiment, the suitable atmosphere comprises a hydrogen atmosphere. In another embodiment the suitable atmosphere comprises a carbon monoxide atmosphere. However, in other embodiments where very low or no amounts of oxygen are found in the microflakes and/or other particles, the suitable atmosphere may be comprised of a nitrogen atmosphere, an argon atmosphere, a carbon monoxide atmosphere, or an atmosphere having less than about 10% hydrogen. These other atmospheres may be advantageous to enable and improve material handling during production.

Figure 1D:

Referring now to FIG. 1D, the precursor layer 106 is processed to form the dense film 110. The dense film 110 may actually have a reduced thickness compared to the thickness of the wet precursor layer 106 since the carrier liquid and other materials have been removed during processing. In one embodiment, the film 110 may have a thickness in the range of about 0.5 microns to about 2.5 microns. In other embodiments, the thickness of film 110 may be between about 1.5 microns and about 2.25 microns. In one embodiment, the resulting dense film 110 may be substantially void free. In some embodiments, the dense film 110 has a void volume of about 5% or less. In other embodiments, the void volume is about 10% or less. In another embodiment, the void, volume is about 20% or less. In still other embodiments, the void volume is about 24% or less. In still other embodiments, the void volume is about 30% or less. The processing of the precursor layer 106 will fuse the microflakes together and in most instances, remove void space and thus reduce the thickness of the resulting dense film.

Depending on the type of materials used to form the film 110, the film 110 may be a film for use in a one step process, or a two step process, or a multi-step process. In a one step process, the film 110 is formed to include group IB-IIIA-VIA compounds and the film 110 may be an absorber film suitable for use in a photovoltaic device. In a two step process, the film 110 may be a solid and/or densified film that will have further processing to be suitable for use as an absorber film for use in a photovoltaic device. As a nonlimiting example, the film 110 in a two step process may not contain any and/or sufficient amounts of a group VIA element to function as an absorber layer. Adding a group VIA element or other material may be the second step of the two-step process. Either a mixture of two or more VIA elements can be used, or a third step can be added with another VIA element as used in the second step. A variety of methods of adding that material include printing of group VIA element, using VIA element vapor, and/or other techniques. It should also be understood that in a two step process, the process atmospheres may be different. By way of nonlimiting example, one atmosphere may optionally be a group VIA-based atmosphere. As another nonlimiting example, one atmosphere may be an inert atmosphere as described herein. It should be understood that this further processing may actually react the densified film into a layer with increased thickness.

Optionally, the present invention may comprise of adding a material to solidify micron-sized or larger feedstock (to be used to prepare sub-micron or nano-sized particles), that otherwise would be all or partially liquid at particle preparation, handling, or deposition or pre-deposition temperature. In another embodiment, the present invention may comprise of adding material to solidify sub-micron or nano-sized globules/droplets, that otherwise would be all or partially liquid at particle preparation, handling, or deposition or pre-deposition temperature. All combinations of size (large feedstock and sub-micron), process temperature (particle preparation, ink and web handling, and deposition), and timing (before size reduction, after size reduction) are considered herein.

Solid Group IIIA Particles

Figure 2:
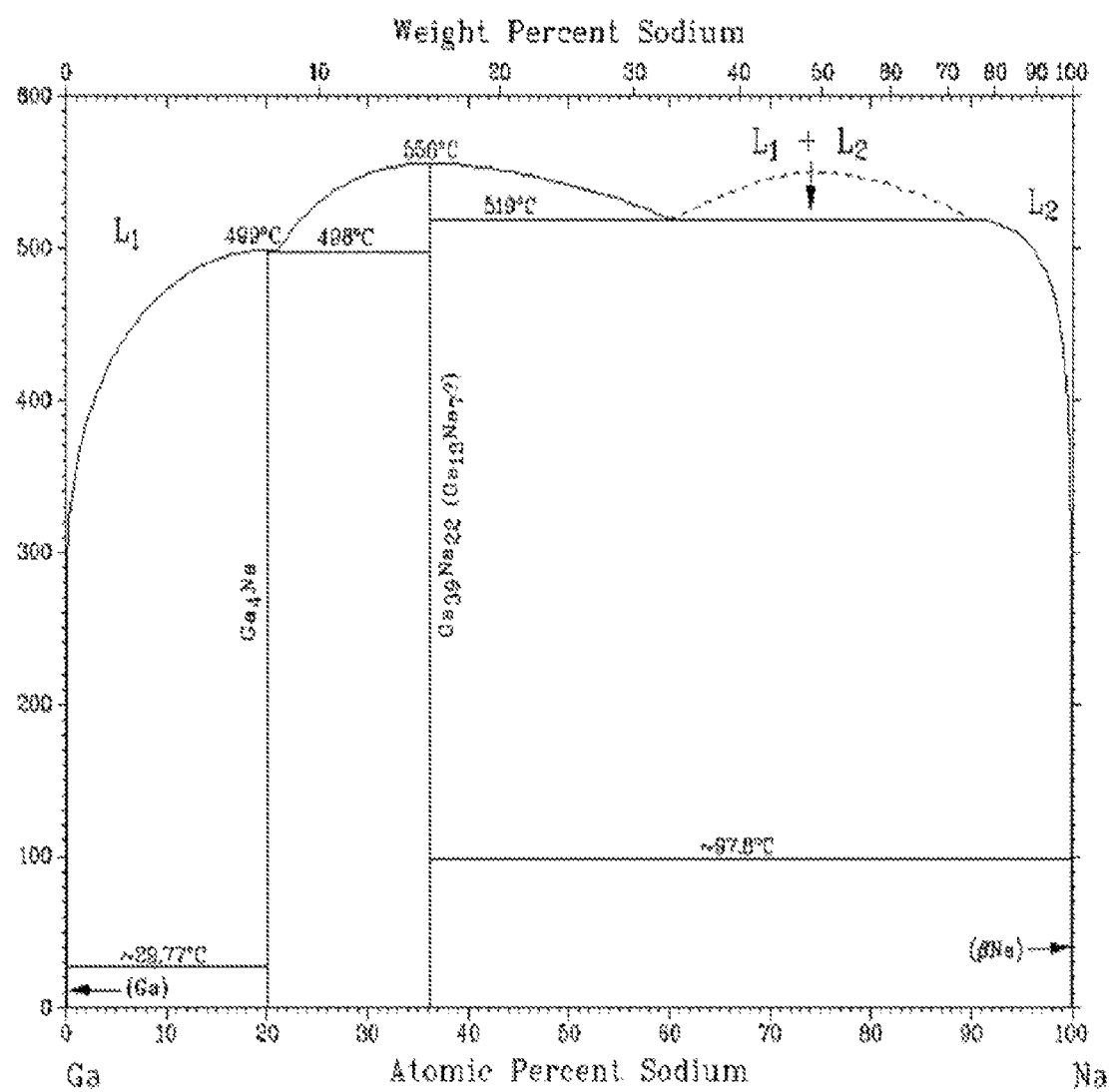
FIG. 2 shows the binary phase diagram for a Gallium-Sodium alloy.

Referring now to FIG. 2, various methods of forming the solid particles such as but not limited to solid group IIIA particles will now be described. For some of the embodiments described herein, it may be desirable to have particles that are in solid form. This may be particularly useful for processing group IIIA-based materials in preparation for introduction into the precursor layer and/or resulting semiconductor film. Solid particles may allow for the use of known processing techniques for size reduction and/or shape alteration on the group IIIA-based material prior to dispersing the material in a carrier liquid. This may simplify processing and increase process robustness.

Obtaining solid particles is generally not an issue for many of the elements used in forming CIGS based solar cells because they are solid at/or near room temperature. However, some materials, particularly group IIIA-based materials, may be in liquid form at/or near room temperature, and the liquid form may increase the difficulty of handling the material or reducing the material to sufficiently small particle and/or droplet sizes. For example, elemental gallium (Ga) may be liquid at temperatures higher than 30° C., and elemental indium (In) may be liquid at temperatures above 156° C. Certainly, there are many possible ways for including these Group IIIA elements into printed CIGS solar cells including, but not limited to using a liquid metallic dispersion of liquid group IIIA elements. One such method is described in commonly assigned copending U.S. patent application Ser. No. 11/081,163, filed Mar. 16, 2005 and in copending U.S. patent application Ser. No. 10/782,017, filed Feb. 19, 2004, both fully incorporated herein by reference for all purposes.

It is possible, however, to solidify Group IIIA based materials and increase their melting temperatures. This may advantageously increase the robustness of the thin-film manufacturing process. A variety of materials may be introduced in appropriate amounts to change the characteristics of elemental gallium or indium and create solid particles of Group IIIA-based materials. The resulting solid materials may be, but are not limited to, metallic alloys, chalcogen-based alloys, and/or salts. In one embodiment of the present invention, sodium may be the material introduced to increase the melting temperature of the resulting alloy. Advantageously, sodium is not a contaminant that needs to be removed from the resulting Group IB-IIIA-VIA film. Concurrently, sodium may improve the performance of the photovoltaic device. Furthermore, an alloy of a Group IIIA element and an added material such as, but not limited to, sodium or other group IA elements will be in solid state well above room temperature and above all size reduction/shape altering/particle formation processes used with the materials. This allows spherical and/or non-spherical particles to be made via processes such as but not limited to milling, evaporation condensation (EC), electroexplosive wire (EEW), plasma pulse processing, or other methods to create particles desired for use in the present invention.

Referring now to FIG. 2, a phase diagram of gallium and sodium (Ga—Na) is shown. As seen in FIG. 2, the phase diagram of Ga—Na indicates that the melting point of the binary alloy steady rises from about 30° C. to about 499° C. as the weight percent of sodium is increased from about 0% to about 8% the amount of solid material increases and stays solid at higher temperature compared to pure gallium (30° C.), up to about 499° C. at about 8%. (as seen along the top axis). Hence, the addition of sodium will substantially increase the range of temperatures where at least part of the Ga—Na is a solid and can be handled or sized-reduced while in solid form. At about 7.6 weight percent, the alloy may be stable as $Ga_4Na$), the Ga—Na alloy turns into a line-compound and is all solid up to 499° C. Compounds containing lower amounts of sodium may contain portions that separate out into elemental Gallium. At higher weight percentages such as about 15.7% Na, the alloy may be stable as $Ga_{39}Na_{22}$. The melting temperature of such an alloy of $Ga_{39}Na_{22}$ may be as high as about 556° C. This is substantially higher than the handling and processing temperature associated with preparing the particles for deposition and is one method of introducing Gallium using a stable, solid particle.

Figure 3:
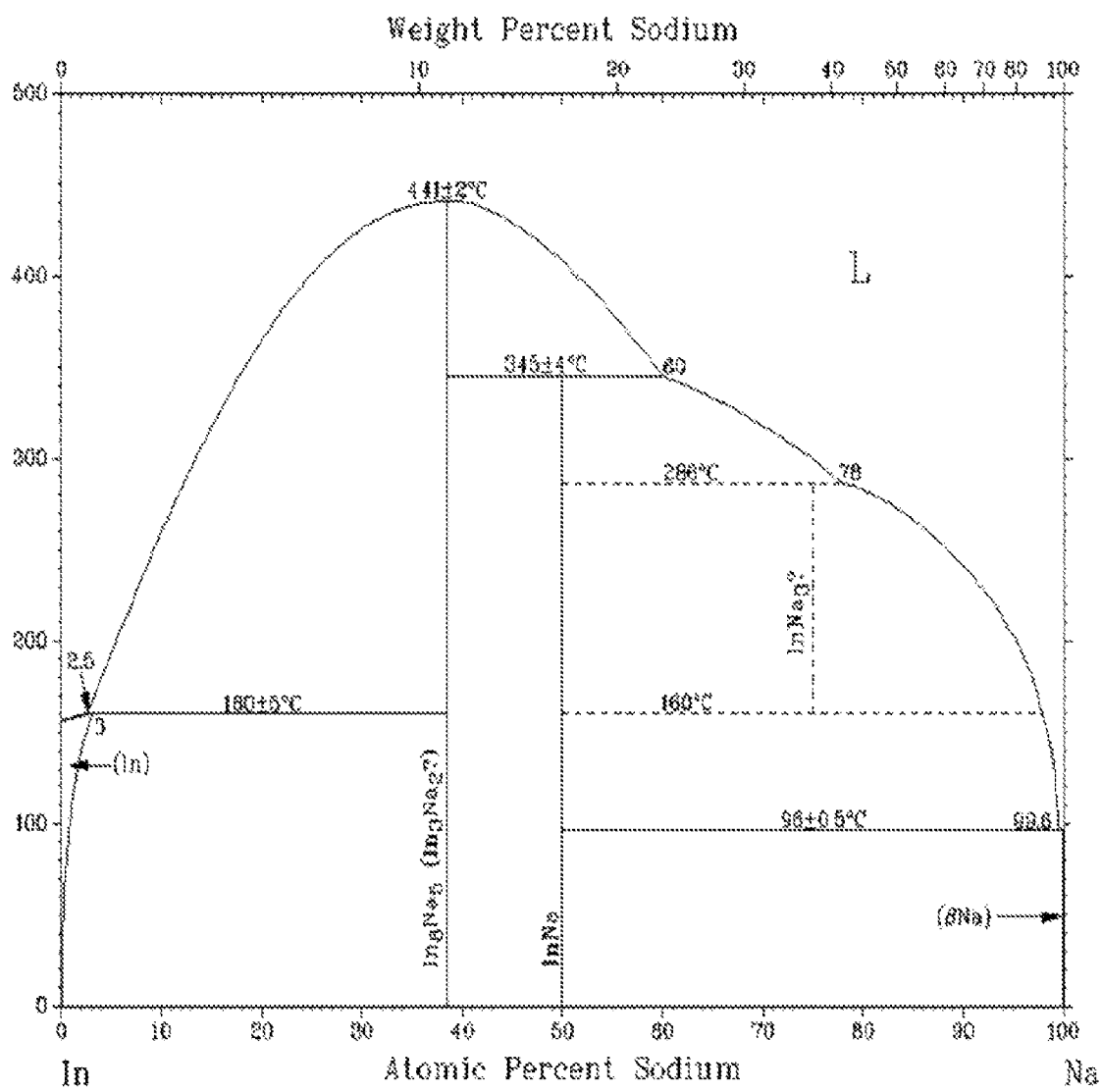
FIG. 3 shows the binary phase diagram for an Indium-Sodium alloy.

Referring now to FIG. 3, a similar result can also be found for other group IIIA based alloys such as indium and sodium (In—Na). At about 11.1 weight percent of sodium, the In—Na alloy turns into a line-compound, is $In_8Na_5$ and may have a melting temperature as high as 441° C. At about 16.7 weight percent of sodium, the In—Na alloy turns into the line-compound is InNa and may have a melting temperature as high as 345° C. Again, the addition of a second material, which in this case is sodium to indium, increases the range of temperatures where the group IIIA-based particle is a solid particle and can be handled and processed in the same manner as other solid particles.

As a nonlimiting example, the range of materials suitable for use in increasing the temperature where liquid is formed Accordingly, as seen with regards to FIGS. 2 and 3, material such as a Group IA element may be added to a Group IIIA element to solidify the Group IIIA element that otherwise would be all or partially liquid at particle preparation, handling, or deposition or pre-deposition temperature. This material may be added to micron-sized or larger Group IIIA feedstock to be used to prepare sub-micron or nano-sized particles. Optionally, the material may be added to solidify sub-micron or nano-sized globules/droplets that otherwise would be all or partially liquid at particle preparation, handling, or deposition or pre-deposition temperature. The amount of group IA material may be adjusted to account for any combinations of size (large feedstock and sub-micron), process temperature (particle preparation, ink and web handling, and deposition), and timing (before size reduction, after size reduction) to reduce premature presence of liquid.

In addition to Group IA elements mentioned above, another embodiment of the invention may use other materials that can maintain a substantially all solid material. As a nonlimiting example, the range of material suitable for use in increasing the melting and/or reacting temperature of a group IIIA-based material may include: sodium, lithium, potassium, rubidium, cesium, sulfur, selenium, rare-earth elements, and/or aluminum. This suitable material may include one or more group IA-based material (in elemental, alloy, or compound form). By way of example and not detract from semiconductor film quality include, but are not limited to: lithium, potassium, rubidium, cesium, sulfur, aluminum, and/or combinations thereof.

As a nonlimiting example, the range of materials suitable for use in increasing the temperature where liquid is formed in a group IIIA-based material may include one or more group IA-based materials (in elemental, alloy, or compound form). By way of example and without limitation, Table I shows some of the possible combinations.

TABLE I

|  | Na | Li | K | Rb |
|---|---|---|---|---|
| In | In—Na | In—Li | In—K | In—Rb |
| Ga | Ga—Na | Ga—Li | Ga—K | Ga—Rb |
| In—Ga | In—Ga—Na | In—Ga—Li | In—Ga—K | In—Ga—Rb |
| Cu—In—Ga | Cu—In—Ga—Na | Cu—In—Ga—Li | Cu—In—Ga—K | Cu—In—Ga—Rb |
| Al—Ga | Al—Ga—Na | Al—Ga—Li | Al—Ga—K | Al—Ga—Rb |
| Al—In | Al—In—Na | Al—In—Li | Al—In—K | Al—In—Rb |
| Cu—Al—Ga | Cu—Al—Ga—Na | Cu—Al—Ga—Li | Cu—Al—Ga—K | Cu—Al—Ga—Rb |
| Cu—Al—In | Cu—Al—In—Na | Cu—Al—In—Li | Cu—Al—In—K | Cu—Al—In—Rb |
| Cu—In—Se | Cu—In—Se—Na | Cu—In—Se—Li | Cu—In—Se—K | Cu—In—Se—Rb |
| Cu—Ga—Se | Cu—Ga—Se—Na | Cu—Ga—Se—Li | Cu—Ga—Se—K | Cu—Ga—Se—Rb |
| In—Ga—Se | In—Ga—Se—Na | In—Ga—Se—Li | In—Ga—Se—K | In—Ga—Se—Rb |
| Cu—In—Ga—Se | Cu—In—Ga—Se—Na | Cu—In—Ga—Se—Li | Cu—In—Ga—Se—K | Cu—In—Ga—Se—Rb |

|  | Cs | S | Al |
|---|---|---|---|
| In | In—Cs | In—S | In—Al |
| Ga | Ga—Cs | Ga—S | Ga—Al |
| In—Ga | In—Ga—Cs | In—Ga—S | In—Ga—Al |
| Cu—In—Ga | Cu—In—Ga—Cs | Cu—In—Ga—S | Cu—In—Ga—Al |
| Al—Ga | Al—Ga—Cs | Al—Ga—S | Al—Ga |
| Al—In | Al—In—Cs | Al—In—S | Al—In |

TABLE I-continued

| | | | |
|---|---|---|---|
| Cu—Al—Ga | Cu—Al—Ga—Cs | Cu—Al—Ga—S | Cu—Al—Ga |
| Cu—Al—In | Cu—Al—In—Cs | Cu—Al—In—S | Cu—Al—In |
| Cu—In—Se | Cu—In—Se—Cs | Cu—In—Se—S | Cu—In—Se—Al |
| Cu—Ga—Se | Cu—Ga—Se—Cs | Cu—Ga—Se—S | Cu—Ga—Se—Al |
| In—Ga—Se | In—Ga—Se—Cs | In—Ga—Se—S | In—Ga—Se—Al |
| Cu—In—Ga—Se | Cu—In—Ga—Se—Cs | Cu—In—Ga—Se—S | Cu—In—Ga—Se—Al |

As a nonlimiting example, the range of materials suitable for use in increasing the temperature where liquid is formed in a group IIIA-based material may include one or more group IA-based materials (in elemental, alloy, or compound form). By way of example and without limitation, Table I shows some of the possible combinations. Various sodium salts and other salt compounds may added to Gallium or other group IIIA elements to form solid compounds. Although not limited to the following, some examples of Gallium-based compounds include: Ga—Na—F (better leave out stoichiometry), $GaF_3$, and or $Ga(NO_3)_3$ Similar Indium based compounds may also be used. Basically, any Ga, In, or Ga—In-salt could be included, e.g. any halide as counter-anion (although Cl less optimal as it may decrease performance of CIGS cells), sulfates, sulfites, nitrates, phosphates, hydroxides, selenites, borates, acetate, butyrate, hexanoate, etc. . . . . Although not limited to the following, the salts may be selected to NOT be soluble in the solvent. The salt counter-ion may easily be decomposed with the counterion decomposing into volatiles, either by heating in an inert atmosphere, heating in a reducing atmosphere, heating in a selenizing (sulfurizing) atmosphere, or any combination of the previous. Additionally, any other conceivable method of replacing the counter-ion by Se and/or S (e.g. wet chemically) would allow counter-ions that do not decompose under heat, H2, and/or a selenizing or sulfurizing atmosphere.

Apart from alloys of IIIA and sodium, sodium can be added in different ways as well. Other suitable sodium containing compounds include any deprotonated organic and inorganic acid, deprotonated alcohol where the proton is replaced by sodium. The list may also include deprotonated acids, being the sodium salt of the (deprotonated) acid, sodium hydroxide, sodium acetate, and the sodium salts of e.g. the following acids: Butyric acid, Caproic Acid, Caprylic Acid, Capric Acid, Laurie Acid, Myristic Acid, Palmitic Acid, Palmitoleic Acid, Stearic Acid, Oleic Acid, Vaccenic Acid, Linoleic Acid, Alpha-Linolenic Acid, Gamma-Linolenic Acid. Other possibilities include deprotonated alcohols such as sodium ethoxide. Other inorganic compounds include sodium nitrate, sodium selenite, sodium sulphate, sodium sulphite, sodium phosphate, and/or sodium phosphite.

In another embodiment of the present invention, the technique of using a group IIIA-based alloy to introduce a group IIIA element into the semiconductor film may be optimized if the material alloyed with the group IIIA element is a material that does not need to be subsequently removed from the semiconductor film. Sodium may be advantageous in this regard. Other materials that may be used in amounts that will not detract from semiconductor film quality include, but are not limited to: sodium, lithium, potassium, rubidium, cesium, sulfur, aluminum, and/or combinations thereof. Materials containing high amounts of carbon (C), nitrogen (N), or oxygen (O), or fluoride (F) would leave residuals that may need to be removed to maximize performance of the resulting semiconductor film.

As further example of solid Group IIIA-based materials, solid Ga particles can optionally also be created via temperature control (Ga<29° C.) or when combined to form Cu—Ga, Cu—Ga—In, Ga—Se, Ga—S, In—Ga—S, In—Ga—Se, etc., Ga-IA (e.g. with Group IA e.g. Na, K, Li), Ga-salts (e.g. $GaF_3$, $Ga(NO_3)_3$). For certain embodiments of the present invention using salts and even for more exotic organo-gallium compounds, the element and/or materials added to Ga are preferably removed prior to, during, or after the formation of CIGS to minimize the amount of C, N, O, F, etc. in the CIGS film as previously mentioned.

The alloy may be formed by a variety of methods such as, but not limited to, atomization, pyrometallurgy, mechanical alloying, or combinations thereof. Bulk materials of the alloy may be treated by the following to form particles using at least one of the following methods: grinding, milling, electroexplosive wire (EEW) processing, evaporation condensation (EC), pulsed plasma processing, or combinations thereof. Optionally, the particles may be formed using at least one of the following methods: spray-pyrolysis, laser pyrolysis, or a bottom-up technique like wet chemical approaches. It should be understood that in some embodiments, further processing may be used to refine the material created as described above. For example, mechanical alloying may be used to combine a material such as Ga—Na with Cu—In or other materials. This may be particularly useful if a ternary or multi-nary alloy is too hard to mill into smaller pieces or different shapes. In some embodiments, instead of starting with an atomically homogeneously mixed feedstock, a mixture of two or more start materials each having a different composition may be using during mechanical milling.

The particles created above may be used in a precursor material in a variety of substances including a solution coatable ink for forming a film on a substrate. The method may include formulating an ink containing the precursor material and then solution depositing the ink onto a substrate to form a precursor layer on the substrate. Of course as previously described, the precursor layer may be reacted in a suitable atmosphere to form a group IB-IIIA-VIA based film in a one step process or it may become a group IB-IIIA-VIA based film via a two-step or multi-step process.

The solid IIIA-based particles may optionally be a sole source of group IIIA elements in the ink. In terms of composition, the resulting film may have a Cu/(In+Ga) compositional range of about 0.01 to about 1.0 and a Ga/(In+Ga) compositional range of about 0.01 to about 1.0. The film may have a Cu/(In+Ga) compositional range of about >1.0 for Cu/(In+Ga) and a Ga/(In+Ga) compositional range of about 0.01 to about 1.0. The film may have a Cu/(In+Ga) compositional range of about 0.01 to about 1.0 and a Ga/(In+Ga) compositional range of about 0.01 to about 1.0. Optionally, the film has a desired Cu/(In+Ga) molar ratio is in the range of about 0.7 to about 1.0 and a desired Ga/(Ga+n) molar ratio in the range of about 0.1 to about 0.8. Optionally, there is the possibility of having a ratio of Cu/(In+Ga)>1.0 and using subsequent post-treatment (KCN, etc.) to change Cu/(In+Ga)<1.0.

Adding Material to Solidify an Alloy

Figure 4A:
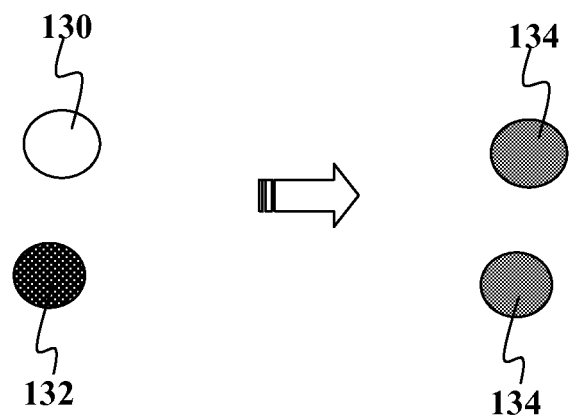
FIGS. 4A and 4B show particles being processed in accordance with an embodiment of the present invention.
Figure 4B:
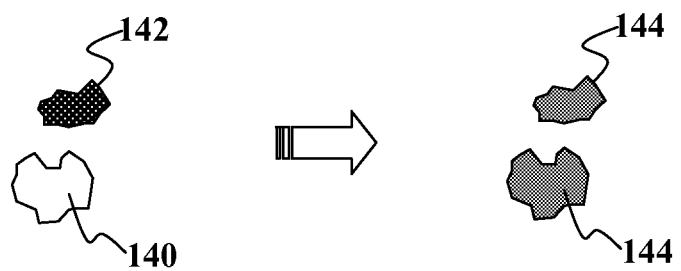

Referring now to FIGS. 4A and 4B, another embodiment of the present invention adds a material 130 such as but not limited to sodium to metal alloys 132 that might ordinarily be characterized by leaching or phase separation of a component element from the alloy particle contains regions that are liquid and other regions that are solid (i.e. phase separation of a group IIIA component such as liquid gallium). In one such example involving a group IIIA-based alloy, a group IIIA alloy such as copper gallium may have gallium leach from the alloy as the temperature increases and/or during mechanical alloying. This leaching is generally undesirable since this may change the stoichiometry of the resulting reaction if the leached material is lost and the leeching occurs prior to processing of the materials. It may also be disadvantageous during processing since the liquid form may change the kinetics of the reaction. For example, if too much liquid is present at or near the onset of a reaction, liquid may group together at certain areas and not be evenly distributed throughout the reaction area. In other situations, the leached material may gum-up or clog equipment used in milling.

To solidify elements which may leach in liquid form at particle preparation, handling, or deposition or pre-deposition temperature, a material as described previously may be combined with the alloy. This may include adding a group IA element or IA-based material such as sodium to metal alloys such as In—Ga, Cu—In—Ga, In—Ga—Se, Ga—Se and other metal alloys as described in Table I. The methods used to make this solid alloy 134 may include any of those described previously herein. The addition of this material overcomes gallium leaching which may occur during milling and/or mechanical alloying of the bulk materials.

It should be understood that a binary or multinary alloy (such as but not limited to IB-IIIA-VIA-IA) in a broad range of compositions hardly ever consists of one (solid) line-compound, but typically is a combination of two or more line-compounds and solid-solutions, where one or more compounds might be present as a liquid at processing temperature. As a non-limiting example, Ga—Na at 300° C. with a composition of 15 atomic percent Na consists mainly of solid $Ga_4Na$ (at thermodynamic equilibrium, see phase diagram) and some, almost pure, liquid gallium. Another nonlimiting example, Ga—Na at 200° C. with a composition of 28 atomic percent sodium consists of a mixture of two different solids, being $Ga_4Na$ and $Ga_{39}Na_{22}$. In other words, a material with a formula like e.g. Cu—In—Ga (with or without details on the actual stoichiometry of the bulk material) might consist of one, but more commonly, a mixture of two or more different compounds of different compositions.

The material 130 to be added to the alloy may be prepared using a variety of methods such as but not limited to atomization, pyrometallurgy, mechanical alloying, or combinations thereof. The resulting material may then be treated using the previously mentioned methods of grinding, milling, electroexplosive wire (EEW) processing, evaporation condensation (EC), pulsed plasma processing, or combinations thereof.

FIG. 4B shows that the particles need not be spherical and may have a material represented in a non-spherical particle 140 and the alloy represented by non-spherical particle 142. The resulting alloy may also be non-spherical particles 144. Of course, combinations of spherical and non-spherical particles are also combinable. It should also be understood that the group IIIA elements may be introduced where one or more are introduced as a liquid (or as liquid droplets/nanoglobules) in combination with solid particles.

The amount of material added may be in trace or dopant amounts or it may be in sufficient amounts to alter the composition of the resulting film. In one embodiment, the final film may include 1) a group IB-IIIA-VIA-IA compound and/or 2) at least a mixture of one or more IB-IIIA-VIA compounds and one or more IA-containing compounds. Of course, other embodiments may use other materials such as but not limited to rare earth elements in place of IA material. Because the atomic concentration of group IA material may be much lower than the concentration of the IB, IIIA, and VIA elements, the IA elements are typically not mentioned and are seen as dopants.

Quenching Group IIIA Droplets Via Addition of Group IA Material

Figure 5:
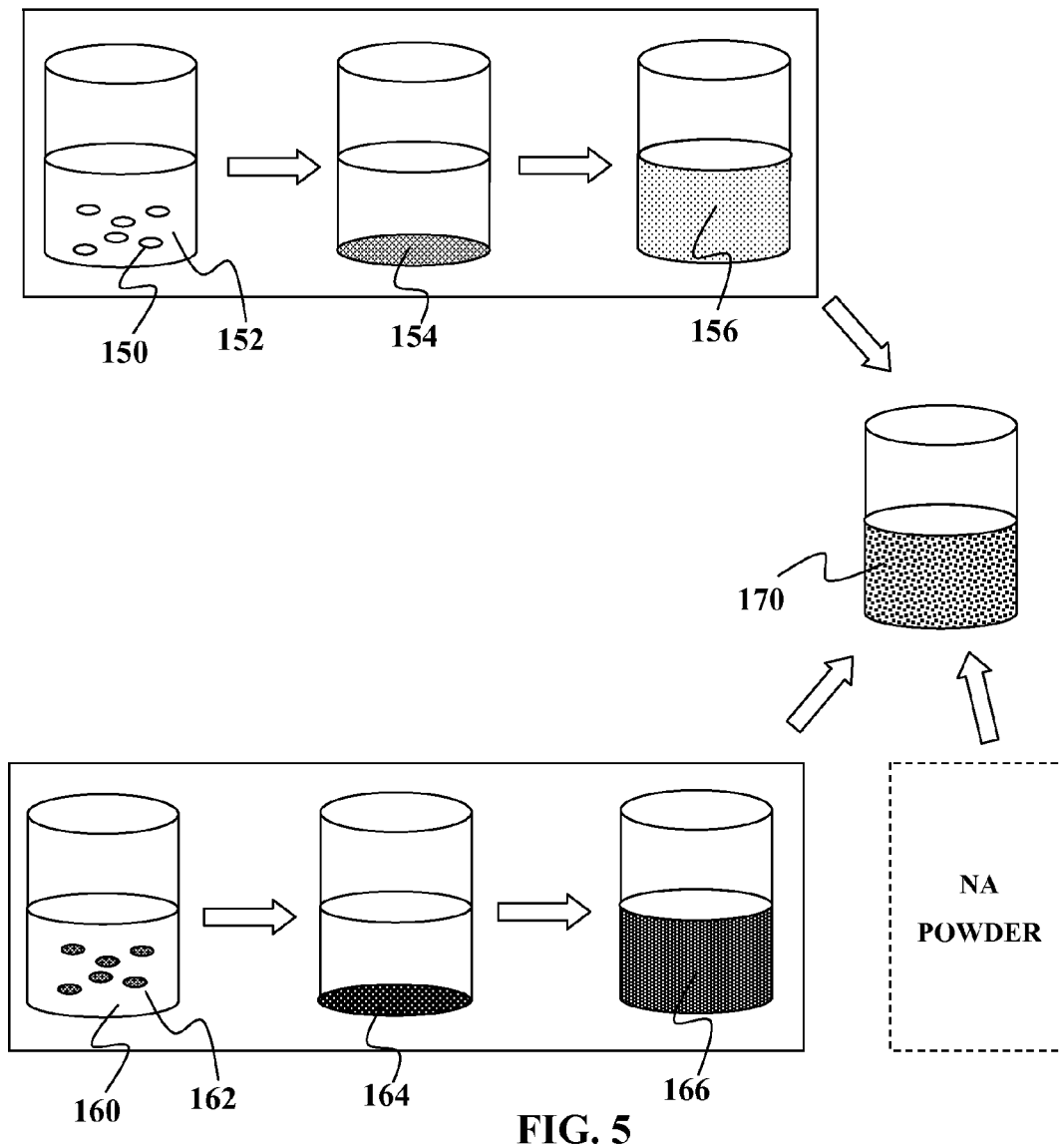
FIG. 5 shows a process flow schematic for creating solid particles using a dispersion and/or suspension method according to one embodiment of the present invention.

Referring now to FIG. 5, it should be understood that the formation of solid group IIIA-based alloy particles may be achieved by a variety of methods many of which were discussed above. The present embodiment describes a still further process that uses an emulsion-based process wherein a material such as sodium is added to an emulsion of a group IIIA-based material to solidify droplets and/or nanoparticles in the emulsion. The formed solid material may be $Ga_4Na$ or other similar materials that are solid at or near room temperature. The sodium may be added in the form of elemental sodium and/or a sodium-based compound, either to a group IIIA-based emulsion (of droplets) or dispersion (of solid particles). Other embodiments may add liquid sodium (melting point 100° C.), either to a group IIIA-based emulsion (of droplets) or dispersion (of solid particles). Still further embodiments may add a sodium-based emulsion, either to a group IIIA-based emulsion (of droplets), or to a group IIIA-based dispersion (of solid particles).). Still further embodiments may add a sodium-based emulsion to a gallium-based emulsion.

As seen in the example of FIG. 5, an emulsion of gallium is created by adding gallium shot 150 into a carrier liquid 152. The carrier liquid 152 may be a solvent and/or include a surfactant. Optionally, the carrier liquid 152 may be a non-organic solvent. In some embodiments, the carrier liquid 152 is water. The combined gallium shot 150 and carrier liquid 152 may then be heated, prior to or during agitation, to a temperature within a desired range. The temperature range in this particular example may be between about 40° C. to about 110° C. Preferably, the temperature will be 100° C. or greater. The heated material 154 may then be agitated to create the gallium emulsion 156. The agitation may be by sonication, vibration, stirring, manipulation of fluid flow, and/or combinations thereof, or any other combination of mechanical, electromagnetic, or acoustic means.

Referring still to FIG. 5, the group IA-based material added to the gallium emulsion 156 may be prepared by adding the group IA shots 160 into a carrier liquid 162. The carrier liquid 162 may be a solvent and/or include a surfactant. Optionally, the carrier liquid 162 may be a non-organic solvent. In some embodiments, the carrier liquid 162 is water. The combined group IA shots 160 and carrier liquid 162 may then be heated to a temperature sufficient to liquefy the group IA shots 160. The temperature will preferably be 100° C. or greater. The heated material 164 may then be agitated to create the group IA-based emulsion 166. The agitation may be sonication, stirring, manipulating of fluid flow, mechanical churning, and combinations thereof, or any other combination of mechanical, electromagnetic, or acoustic means.

In one embodiment of the present invention, the gallium emulsion 156 and the group IA emulsion 166, e.g. a Na emulsion, may be combined to form the $Ga_4Na$ dispersion 170 which may be dried to obtain dry $Ga_4Na$ particles. In other embodiments, it should be understood that dry Na or group IA element powder may be used in place of and/or in combination with the group IA emulsion 166. This may provide sufficient amounts of sodium or group IA element to reach the desired stoichiometry to form the desired group IIIA-IA based particles. Note that it might be advantageous to make the Ga-emulsion at rt (or 40° C.), make the Na-emulsion >100° C., subsequently, cool-down one or both to have either one or both as solid particles during the alloying in case the alloying is extremely exothermic (lot of heat generated, possibly causing an uncontrollable reaction). If the reaction is easily controlled, than in view of time, having both >100° C. would be the best (liquid-liquid chemistry typically faster than liquid-solid or solid-solid).

Figure 6A:
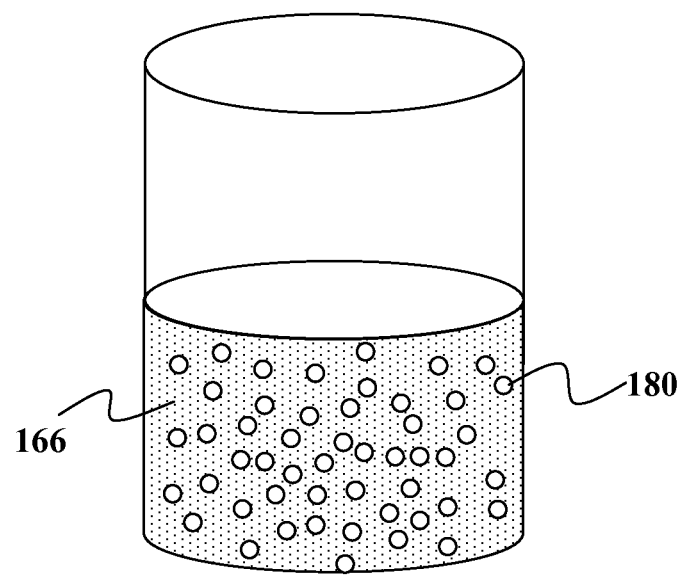
FIGS. 6A and 6B show another method of forming solid particles according to an embodiment of the present invention.
Figure 6B:
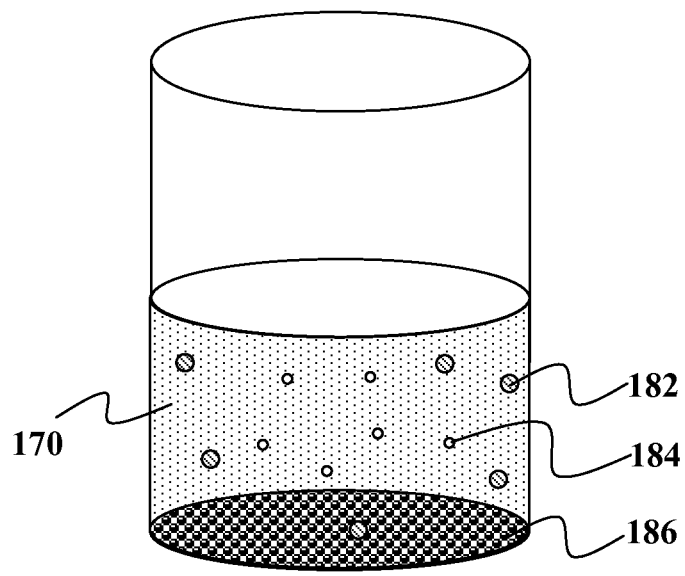

Referring now to FIGS. 6A and 6B, the emulsion technique may lead to smaller particles than the gallium droplets 180 in the initial Ga-emulsion 156. This may be the result of the slow addition of the sodium emulsion into the emulsion of gallium, or vice versa. The gallium will diffuse into the (smaller) sodium droplets in emulsion 166 or $Ga_4Na$ shells or cores will be found on or inside the gallium droplets 182 (see FIG. 6B) which will then be broken up by sonication or other processes while exposing new un-reacted gallium in smaller droplets 184. The portions broken off will likely be smaller particles and the continued exposure of unreacted gallium will continue to create other small particles. Furthermore, it is possible that milling be used as the agitation source in this case since any coating from liquid gallium on mill part will come off when solidified. As seen in FIG. 6B, some of the solidified particles 186 of $Ga_4Na$ will settle to the bottom of the container if unagitated. Of course, other techniques besides sonication may also be used to size reduce and/or agitate the globules in the emulsion. Other such techniques include but are not limited to: mechanical agitation, high pressure homogenization using a device such as an Emulsiflex™, available from Avestin, Inc., agitation via stirring, and emulsification via (horizontal) bead-milling, manipulation of fluid flow, stirring, combinations of the foregoing, or the like.

Note that forming solid In particles by quenching an emulsion of In is possible as well, from a particle synthesis and size control point of view. The process may involve making an In-emulsion and quenching the emulsion by adding a compound that acts as a seed to solidify it into smaller particles than the In-nanoglobules.

Bandgap Grading Using IIIA-Based Materials

Referring now to FIGS. 7A-7C, a still further embodiment of the present invention will now be described. This embodiment describes a method of selecting materials that have different reaction rates, due to e.g. a higher thermodynamic stability compared to the other materials used, to achieve a desired distribution of material in the photovoltaic device. This may allow for fine tuning of the resulting photovoltaic device by controlling where materials are located in the device layers. By way of nonlimiting example, the reaction rate of the group IIIA-IA based alloy may be sufficiently high such that it does not react until other portions of the precursor material have begun to react. For $Ga_4Na$ and $Ga_{39}Na_{22}$, they melt at the selenization temperature and above the anneal temperature for other materials used for CIGS formation via RTP. For example, the melting point of $Ga_4Na$ and $Ga_{39}Na_{22}$ is much higher than the typical decomposition, melting, and reaction temperatures of most of the intermetallic alloys and chalcogenides present, formed, and consumed during the absorber growth process(es). This advantageously keeps these materials at or near the locations where these materials were deposited and not letting them migrate as they tend to do when they react at the same time as the other materials.

As seen in FIG. 7A, one embodiment of the present invention involves coating a dispersion 200 of the solid group IIIA-IA based particles over the precursor layer 202. In this example, the precursor layer 202 may be a layer of un-annealed material over a conductive layer 204 and a substrate 206. Although not limited to the following, the particles in layer 202 may be all spherical particles, all non-spherical particles, and/or mixtures of particles of various shapes. When heated as shown in FIG. 7B, the precursor layer 202 fuses into the annealed layer 208. FIG. 7B continues to show that the coating of the dispersion 200 continues to have particles of solid group IIIA-IA based material. The dispersion 200 with the solid particles of group IIIA-IA based material has not reached a sufficient temperature to react the particles therein significantly, or at least not to the same extent as the particles in 202. The layers of materials continues to be heated from the configuration of FIG. 7B to that of 7C. FIG. 7C shows that continued heating at a higher temperature or for a longer time results in the reacting of the coating of the dispersion 200 and formation of a layer 210 similar to the layer 208, except that the layer 210 has an increased group IIIA and group IA concentration. The annealed layers 208 and 210 may be part of a two-step or multi-step processing technique where further processing is required to turn the layers into an absorber layer. Thus for a CIGS absorber layer, the layers 208 and 210 may require further selenization to become a CIGS absorber layer. Due to the differing compositions of the layers 208 and 210 (i.e. higher group IIIA content in layer 210), a desired bandgap grading will be retained in the resulting absorber layer. The stoichiometry will be such that there is a higher ratio of a group IIIA element such as but not limited to gallium in the layer 210 than in layer 208 to obtain the desired performance and/or bandgap. In one embodiment, the desired stoichiometric ratio in layer 208 for band gap grading may include but is not limited to a Ga/(In+Ga) at the back of 208 (and 210) in the range of 0.3-0.7, close to the top surface of 210 a Ga/(In+Ga) of 0.1-0.4, and at the top surface of 210 a Ga/(In+Ga) in the range of 0.15-0.45. Regarding Cu/(In+Ga); in the bulk <1.0.

Referring now to FIGS. 8A-8C, yet another embodiment of the present invention will now be described. This embodiment of the present invention involves coating a dispersion 220 of the solid group IIIA-IA based particles over a precursor layer 222. In this example, the precursor layer 222 may be a layer of unannealed material over a conductive layer 204 and a substrate 206, or may contain one or more evaporated layers including selenium. The conductive layer 204 may be conductive electrically, thermally, or both. When heated as shown in FIG. 8B, the precursor layer 222 fuses into the annealed layer 228. In the example shown in FIG. 8B, the layer 228 may be a CIS layer. The layer 220 has not reached a sufficient temperature to react significantly or at least not to the same extent as the particles in 222. The embodiment of FIG. 8B is heated to a higher temperature or for a longer time, where it then reacts with the layer 228 to form layer 230 in FIG. 8C. As seen in FIG. 8C, the layer 230 may be a CIGS absorber layer. It may have a higher concentration of group IIIA elements near the top surface formerly occupied by layer 220. The difference between layer 228 of FIG. 8B and layer 208 of FIG. 7B is the inclusion of a group VIA element in layer 228. The layer 228 may be part of a one-step processing technique where further processing is not required to turn the resulting layer 230 into an absorber layer after annealing of layers 220 and 228.

Figure 9A:
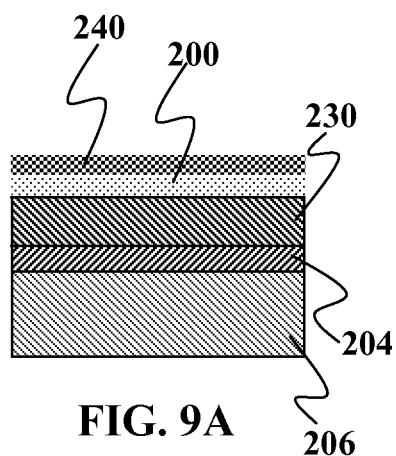
FIGS. 9A and 9B show another method of bandgap grading according to an embodiment of the present invention.
Figure 9B:
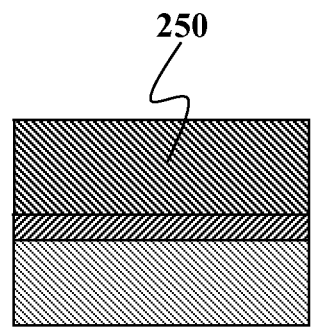

Referring now to FIGS. 9A and 9B, bandgap grading may also be applied on top of a fully formed absorber layer 230. FIG. 9A shows that the present invention involves coating a dispersion 200 of the solid group IIIA-IA based particles over a CIGS absorber layer 230. An extra layer 240 of group VIA material such as but not limited to selenium may be used with the dispersion 200, especially if the group IIIA-IA based material does not contain any or sufficient amounts of group VIA material in coating of the dispersion 200. If the coating of the dispersion 200 is a solid group IIIA-IA-VIA based material, then this layer 240 may or may not be necessary depending on the content therein. FIG. 9B shows that upon sufficient heating, the resulting layer 250 may be formed as a CIGS layer with a graded bandgap.

Figure 10A:
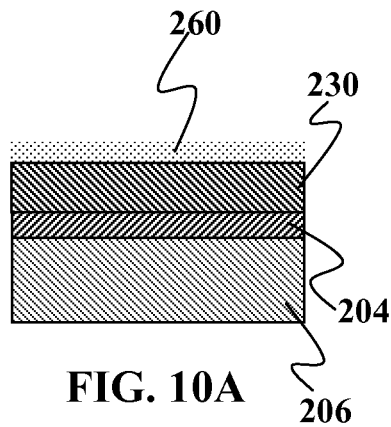
FIGS. 10A and 10B show yet another method of bandgap grading according to an embodiment of the present invention.
Figure 10B:
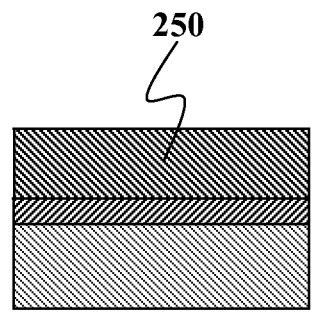

FIGS. 10A-10B shows yet another variation similar to that of FIGS. 9A-9B. Instead of using a group IIIA-IA based material, layer 260 uses a group IIIA-IA-VIA based material and thus a separate layer 240 of group VIA material is not used. The resulting layer 250 will have the desired bandgap grading and is similar to formed in FIG. 9B.

As seen from the foregoing, a variety of methods may be used to obtain bandgap grading using materials that will react after the sub-layers have begun to at least partially anneal. As nonlimiting examples, Ga—Na (any Na concentration if thin enough) or Ga—Se—Na may be used on top of either precursor CIG, CIGS, CI, annealed CIG, CI (from elements or alloys), or on top of a selenized layer which could even be copper rich for crystal growth or other purposes. In another embodiment, coating of a Ga—Na or similar layer on top of a selenized layer is not very different from a process point of view from solution deposition of a gallium emulsion, except that thin coatings from Ga—Na are likely easier to coat than a gallium emulsion containing larger droplets and/or sensitive to coalescence. The dewetting risk is low since liquid is not formed until the temperature where the gallium is likely to incorporate into the film, which is higher than the anneal temperature. In a still further embodiment, coating this material on top of a precursor layer (prior to selenization or anneal) is likely to have an advantage in that gallium is less likely to diffuse into the bulk because it will be in the solid state at low temperatures. Then at the melting temperature, the temperature is high enough for good CIGS formation which is likely to freeze the gallium at the top. Optionally, it should be understood that other embodiments may also mix the bandgap grading material in the precursor layer, in addition to or in place of additional bandgap material above the precursor layer.

Additionally, some embodiments may use Ga—Na particles that are not completely solid particles. At about 7.6 weight percent, the alloy can be stable as $Ga_4Na$ and be fully solid. Compounds containing lower amounts of sodium may contain portions that separate out from the composition into elemental gallium and $Ga_4Na$. At higher weight percentages such as about 15.7% Na, the alloy may be stable as $Ga_{39}Na_{22}$. Some embodiments may use Na at weight percentages greater than about 15.7%. These may have some separation but still provide the desired band gap grading. Optionally, elements of other group IA-IIIA material may also be incorporated into the particle to prevent separation of undesired elemental materials. These group IA-IIIA materials may be deposited above, with, and/or below the precursor material.

It should be understood that a binary or multi-nary alloy (IB-IIIA-VIA-IA) in a broad range of compositions may be a combination of two or more line-compounds and solid-solutions, where one or more compounds might be present as a liquid at processing temperature. As a non-limiting example, Ga—Na at 300 C with a composition of 15 atomic percent Na consists mainly of solid $Ga_4Na$ (at thermodynamic equilibrium, see phase diagram) and some, almost pure, liquid gallium. Another nonlimiting example, Ga—Na at 200 C with a composition of 28 atomic percent sodium consists of a mixture of two different solids, being $Ga_4Na$ and $Ga_{39}Na_{22}$. In other words, a material with a formula like e.g. Cu—In—Ga (with or without details on the actual stoichiometry of the bulk material) might consist of one, but more commonly, a mixture of two or more different compounds of different compositions.

It should be understood that in some embodiments, part of the precursor material is allowed to liquefy, meaning starting with a composition of Ga—Na that will result in both nanodroplets of elemental-Ga and solid $Ga_4Na$ particles. The same holds for In—Na (although, liquefying elemental-In occurs at 156° C.). In other words in some embodiments of the present invention, the precursor material containing the solid IIIA-alloy may contain liquid material next to the solid IIIA-alloy prior to, during, or after particle synthesis. In some embodiments of the present invention, the same holds for ink preparation, ink deposition, and conversion to a compound layer.

Particle Shapes

It should be understood that any of solid particles as discussed herein may be used in spherical and/or non-spherical particle shapes. FIG. 1A shows that the particles may all be non-spherical, planar flake particles. By way of example and not limitation, it should be understood that the solid Group IIIA-based particles may be particles of various shapes used with any of the combinations shown below in Table II. Flakes may be considered to be one type of non-spherical particles.

TABLE II

|  | Spherical | Non-Spherical | Flake | Nanoglobules |
|---|---|---|---|---|
| Spherical | Spherical | Non-spherical + Spherical | Flake + Spherical | Nanoglobules + Spherical |
| Non-Spherical | Spherical + Non-spherical | Non-spherical | Flake + Non-spherical | Nanoglobules + Non-spherical |
| Flake | Spherical + Flake | Non-spherical + Flake | Flake | Nanoglobules + Flake |
| Nanoglobules | Spherical + Nanoglobules | Non-spherical + Nanoglobules | Flake + Nanoglobules | Nanoglobules |
| Spherical + Non-spherical | Spherical + Non-spherical | Spherical + Non-spherical | Spherical + Non-spherical + Flake | Spherical + Non-spherical + Nanoglobules |
| Spherical + Flake | Spherical + Flake | Spherical + Flake + Non-spherical | Spherical + Flake | Spherical + Flake + Nanoglobules |
| Spherical + Nanoglobules | Spherical + Nanoglobules | Spherical + Nanoglobules + Non-spherical | Spherical + Nanoglobules + Flake | Spherical + Nanoglobules |
| Flake + Nonspherical | Flake + Nonspherical + Spherical | Flake + Nonspherical | Flake + Nonspherical | Flake + Nonspherical + Nanoglobules |
| Flake + | Flake + | Flake + | Flake + | Flake + |

TABLE II-continued

|  | Spherical | Non-Spherical | Flake | Nanoglobules |
|---|---|---|---|---|
| Nanoglobules | Nanoglobules + Spherical | Nanoglobules + Non-spherical | Nanoglobules | Nanoglobules |
| Non-spherical + Nanoglobules | Non-spherical + Nanoglobules + Spherical | Non-spherical + Nanoglobules | Non-spherical + Nanoglobules + Flake | Non-spherical + Nanoglobules |

Figure 11:
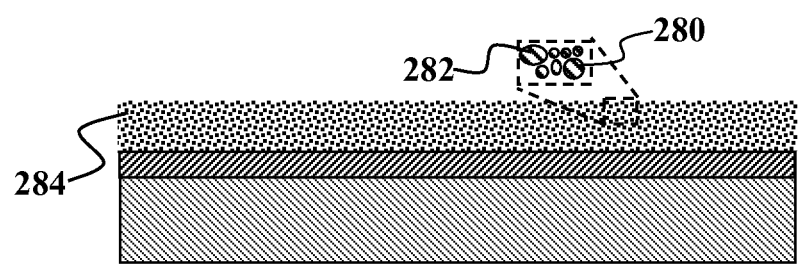
FIG. 11 shows the use of spherical particles and non-spherical particles according to an embodiment of the present invention.

FIG. 11 shows one embodiment of the present invention where spherical particles 280 and oblong particles 282 (i.e. one type of non-spherical particles) are shown in combination. They may be deposited together or sequentially to form precursor layer 284.

Figure 12:
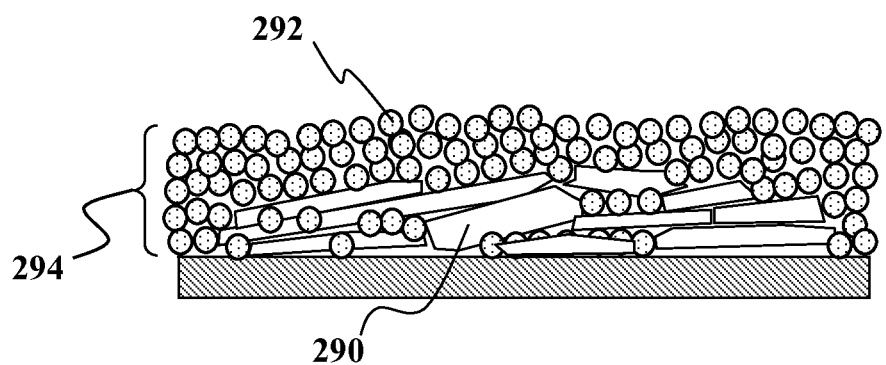
FIG. 12 shows the use of spherical particles and planar according to an embodiment of the present invention.

FIG. 12 shows yet another embodiment of the present invention where particles of one time are used in combination with particles of another type. FIG. 12 shows that planar, flake particles 290 maybe used with spherical particles 292 to form the precursor layer 294.

Additional Sodium

Referring now to FIGS. 13A-13E, it should be understood that even with solid group IIIA-based particles, more sodium may be desired in certain embodiments of the present invention to provide improved performance. This embodiment of the invention shows that layers of material may be deposited above and/or below the precursor layer. Some layers may be deposited after the precursor layer has been processed. Although not limited to the following, these layers may provide one technique for adding additional sodium.

Referring now to FIG. 13A, the absorber layer may be formed on a substrate 312, as shown in FIG. 13A. A surface of the substrate 312 may be coated with a contact layer 314 to promote electrical contact between the substrate 312 and the absorber layer that is to be formed on it. By way of example, an aluminum substrate 312 may be coated with a contact layer 314 of molybdenum. As discussed herein, forming or disposing a material or layer of material on the substrate 312 includes disposing or forming such material or layer on the contact layer 314, if one is used. Optionally, it should also be understood that a layer 315 may also be formed on top of contact layer 314 and/or directly on substrate 312. An interlayer may also be incorporated as previously described. This layer may be solution coated, evaporated, and/or deposited using vacuum based techniques. Although not limited to the following, the layer 315 may have a thickness less than that of the precursor layer 316. In one nonlimiting example, the layer may be between about 1 nm to about 100 nm in thickness. The layer 315 may be comprised of various materials including but not limited to at least one of the following: a group IB element, a group IIIA element, a group VIA element, a group IA element (new style: group 1), a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide.

As shown in FIG. 13B, a precursor layer 316 is formed on the substrate. The precursor layer 316 contains one or more group IB elements and one or more group IIIA elements. Preferably, the one or more group IB elements include copper. The one or more group IIIA elements may include indium and/or gallium. The precursor layer may be formed using any of the techniques described above. In one embodiment, the precursor layer contains no oxygen other than those unavoidably present as impurities or incidentally present in components of the film other than the nano- or microflakes themselves. Although the precursor layer 316 is preferably formed using non-vacuum methods, it should be understood that it may optionally be formed by other means, such as but not limited to, evaporation, sputtering, chemical vapor deposition, physical vapor deposition, atomic layer deposition (ALD), etc. By way of example, the precursor layer 316 may be an oxygen-free compound containing copper, indium and gallium. In one embodiment, the non-vacuum system operates at pressures above about 3.2 kPa (24 Torr). Optionally, it should also be understood that a layer 317 may also be formed on top of precursor layer 316. It should be understood that the stack may have both layers 315 and 317, only one of the layers, or none of the layers. Although not limited to the following, the layer 317 may have a thickness less than that of the precursor layer 316. In one nonlimiting example, the layer may be between about 1 to about 100 nm in thickness. The layer 317 may be comprised of various materials including but not limited to at least one of the following: a group IB element, a group IIIA element, a group VIA element, a group IA element (new style: group 1), a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide.

Referring now to FIG. 13C, heat 320 is applied to anneal the first precursor layer 316 into a group IB-IIIA compound film 318. It should be understood that this may also include some amounts of IA material, but the IA material is typically at a level that does not change the main IB-IIIA material. In one nonlimiting example, the group IA material is less than about 3% at. of the composition in the precursor material and less than 0.1% of the final semiconductor material that contains group IA material. Optionally, some may have less than about 2% at. of the composition in the precursor material. Optionally, some may have less than about 1% at. of the composition in the precursor material. In many embodiments, most of the excess IA material is not in the final film but can be found along the boundaries. Optionally, the IA material is included as a dopant. Optionally, some embodiments may have significant amounts of Na and thus create a group IA-IB-IIIA compound film which in the final embodiment may be a IA-IB-IIIA-VIA. Optionally, the IA material may be such that it helps crystal growth for the IB-IIIA-VIA material, but the IA material is mainly gone in the final semiconductor film.

Referring still to the embodiment of FIG. 13C, the heat 320 may be supplied in a rapid thermal annealing process, e.g., as described above. As a nonlimiting example, the substrate 312 and precursor layer(s) 316 may be heated from an ambient temperature to a plateau temperature range of between about 200° C. and about 600° C. The heat 320 may be supplied in a rapid thermal annealing process, e.g., as described above. As a non-limiting example, the substrate 312 and precursor layer(s) 316 may be heated from an ambient temperature to a plateau temperature range of between about 200° C. and about 600° C. Processing comprises annealing with a ramp-rate of about 1-5° C./sec, optionally over about 5° C./sec, to a temperature of about 200° C. and about 600° C. The temperature is maintained in the plateau range for a period of time ranging between about a fraction of a second to about 60 minutes, and subsequently reduced. Optionally in some embodiments, there are embodiments contemplated wherein the ramp-down and ramp-up between the H2-anneal and selenization is avoided. In one such embodiment, there does not include a step where temperature is reduced to room temperature and/or temperatures less than 100 C. In addition, some embodiments of the present invention may use heating of the as-coated CIG (IB-IIIA) and/or as-annealed CIG (IB-IIIA) without heating the substrate by using a laser. Optionally, processing further comprise selenizing this annealed layer with a ramp-rate of about 1-5° C./sec, optionally over about 5° C./sec, to a temperature of about 225 to about 600° C. for a time period of about 60 seconds to about 10 minutes in Se vapor, where the plateau temperature is not necessarily kept constant in time, to form the thin-film containing one or more chalcogenide compounds containing Cu, In, Ga, and Se. Optionally, processing comprises selenizing without the separate annealing step in an atmosphere containing hydrogen gas, but may be densified and selenized in one step with a ramp-rate of 1-5° C./sec, preferably over 5° C./sec, to a temperature of 225 to 600° C. for a time period of about 120 seconds to about 20 minutes in an atmosphere containing either $H_2Se$ or a mixture of $H_2$ and Se vapor. The heat turns the precursor layer into a film 322. Optionally, this may be a dense, metallic film as shown in FIG. 13D. The heating may remove voids and create a denser film than the precursor layer. In other embodiments, where the precursor layer is already dense, there may be little to no densification.

Optionally, as shown in FIG. 13D, a layer 326 containing an additional chalcogen source, and/or an atmosphere containing a chalcogen source, may optionally be applied to layer 322. Heat 328 may optionally be applied to layer 322 and the layer 326 and/or atmosphere containing the chalcogen source to heat them to a temperature sufficient to melt the chalcogen source and to react the chalcogen source with the group IB element and group IIIA elements in the precursor layer 322. The heat 328 may be applied in a rapid thermal annealing process, e.g., as described above. The reaction of the chalcogen source with the group IB and IIIA elements forms a compound film 330 of a group IB-IIIA-chalcogenide compound as shown in FIG. 13E. Preferably, the group IB-IIIA-chalcogenide compound is of the form $Cu_zIn_{1-x}Ga_xSe_{2(1-y)}S_{2y}$, where $0 \leq x \leq 1$, $0 \leq y \leq 1$, and $0.5 \leq y \leq 1.5$. Although not limited to the following, the compound film 330 may be thicker than the film 322 due to the reaction with group VIA elements.

Referring now to FIGS. 13A-13E, it should be understood that sodium may also be used with the precursor material to improve the qualities of the resulting film. This may be particularly useful in the situation where solid Group IIIA particles are formed without using a sodium based material and additional sodium is desired. In a first method, as discussed in regards to FIGS. 13A and 13B, one or more layers of a sodium containing material may be formed above and/or below the precursor layer 316. The formation may occur by solution coating and/or other techniques such as but not limited to sputtering, evaporation, chemical bath deposition (CBD, electroplating, sol-gel based coating, spray coating, chemical vapor deposition (CVD), physical vapor deposition (PVD), atomic layer deposition (ALD), and the like.

Optionally, in a second method, sodium may also be introduced into the stack by sodium doping the nanoflakes microflakes and/or particles in the precursor layer 316. As a nonlimiting example, the nanoflakes and/or other particles in the precursor layer 316 may be a sodium containing material such as, but not limited to, Cu—Na, In—Na, Ga—Na, Cu—In—Na, Cu—Ga—Na, In—Ga—Na, Na—Se, Cu—Se—Na, In—Se—Na, Ga—Se—Na, Cu—In—Se—Na, Cu—Ga—Se—Na, In—Ga—Se—Na, Cu—In—Ga—Se—Na, Na—S, Cu—In—Ga—Na, Cu—S—Na, In—S—Na, Ga—S—Na, Cu—In—S—Na, Cu—Ga—S—Na, In—Ga—S—Na, and/or Cu—In—Ga—S—Na. In one embodiment of the present invention, the amount of sodium in the nanoflakes or microflakes and/or other particles may be about 1 atomic percent (at. %) or less. In another embodiment, the amount of sodium may be about 0.5 at. % or less. In yet another embodiment, the amount of sodium may be about 0.1 at. % or less. It should be understood that the doped particles and/or flakes may be made by a variety of methods including milling feedstock material with the sodium containing material and/or elemental sodium.

Optionally, in a third method, sodium may be incorporated into the ink itself, regardless of the type of particle, nanoparticle, microflake, and/or nanoflakes dispersed in the ink. As a nonlimiting example, the ink may include nanoflakes (Na doped or undoped) and a sodium compound with an organic counter-ion (such as but not limited to sodium acetate) and/or a sodium compound with an inorganic counter-ion (such as but not limited to sodium sulfide). It should be understood that sodium compounds added into the ink (as a separate compound), might be present as particles (e.g. nanoparticles), or dissolved and/or in (reverse) micelles. The sodium may be in "aggregate" form of the sodium compound (e.g. dispersed particles), and the "molecularly dissolved" form. Finally this added sodium may incorporate into the particles by the milling process or by any number of alloying processes described above.

None of the three aforementioned methods are mutually exclusive and may be applied singly or in any single or multiple combination(s) to provide the desired amount of sodium to the stack containing the precursor material. Additionally, sodium and/or a sodium containing compound may also be added to the substrate (e.g. into the molybdenum target). Also, sodium-containing layers may be formed in between one or more precursor layers if multiple precursor layers (using the same or different materials) are used. It should also be understood that the source of the sodium is not limited to those materials previously listed. Some may include other sodium compounds such as NaBF4, NaPF6, and/or sodium tetraphenlborate. As a nonlimiting example, basically, any deprotonated alcohol where the proton is replaced by sodium, any deprotonated organic and/or inorganic acid being, the sodium salt of the (deprotonated) acid can be used, $Na_xH_y-Se_zS_uTe_vO_w$ where x, y, z, u, v, and $w \geq 0$, $Na_xCu_yIn_zGa_uO_v$ where x, y, z, u, and $v \geq 0$ sodium hydroxide, sodium acetate, and the sodium salts of the following acids: butanoic acid, hexanoic acid, octanoic acid, decanoic acid, dodecanoic acid, tetradecanoic acid, hexadecanoic acid, 9-hexadecenoic acid, octadecanoic acid, 9-octadecenoic acid, 11-octadecenoic acid, 9,12-octadecadienoic acid, 9,12,15-octadecatrienoic acid, and/or 6,9,12-octadecatrienoic acid.

Optionally, as seen in FIG. 13E, it should also be understood that sodium and/or a sodium compound may be added to the processed chalcogenide film after the precursor layer has been annealed or otherwise processed. This embodiment of the present invention thus modifies the film after CIGS formation. With sodium, carrier trap levels associated with the grain boundaries are reduced, permitting improved electronic properties in the film. A variety of sodium containing materials such as those listed above may be deposited as layer 432 onto the processed film and then annealed to treat the CIGS film.

Additionally, the sodium material may be combined with other elements that can provide a bandgap widening effect. Two elements which would achieve this include gallium and sulfur. The use of one or more of these elements, in addition to sodium, may further improve the quality of the absorber layer. The use of a sodium compound such as but not limited to $Na_2S$, $NaInS_2$, or the like provides both Na and S to the film and could be driven in with an anneal such as but not limited to an RTA step to provide a layer with a bandgap different from the bandgap of the unmodified CIGS layer or film.

Roll-to-Roll Manufacturing

Figure 14:
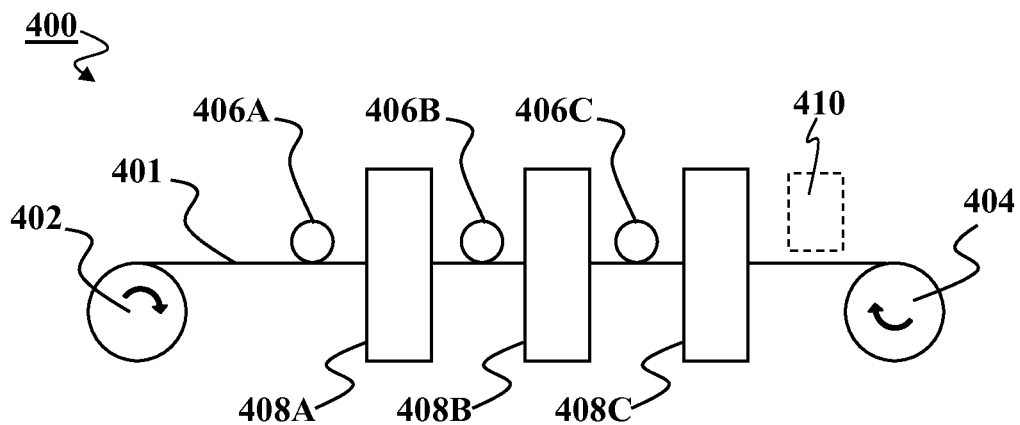
FIG. 14 shows roll-to-roll process according to an embodiment of the present invention.

Referring now to FIG. 14, a roll-to-roll manufacturing process according to the present invention will now be described. Embodiments of the invention using the solid group IIIA-based materials are well suited for use with roll-to-roll manufacturing. Specifically, in a roll-to-roll manufacturing system 400 a flexible substrate 401, e.g., aluminum foil travels from a supply roll 402 to a take-up roll 404. The width of the row may vary depending on the application. Some embodiments have a roll(s) with a width greater than 0.5 m, greater than 1.0 m, greater than 2.0 m, and/or greater than 3.0 m or more. These substrates may be high aspect ratio with lengths substantially greater than the width such as but not limited to aspect ratios of 50:1, 100:1, or more. In between the supply and take-up rolls, the substrate 401 passes a number of applicators 406A, 406B, 406C, e.g. microgravure rollers and heater units 408A, 408B, 408C. Each applicator deposits a different layer or sub-layer of a precursor layer, e.g., as described above. The heater units are used to anneal the different layers and/or sub-layers to form dense films. In the example depicted in FIG. 14, applicators 406A and 406B may apply different sub-layers of a precursor layer. Heater units 408A and 408B may anneal each sub-layer before the next sub-layer is deposited. Alternatively, both sub-layers may be annealed at the same time. Applicator 406C may optionally apply an extra layer of material containing chalcogen or alloy or elemental particles as described above. Heater unit 408C heats the optional layer and precursor layer as described above. Note that it is also possible to deposit the precursor layer (or sub-layers) then deposit any additional layer and then heat all three layers together to form the IB-IIIA-chalcogenide compound film used for the photovoltaic absorber layer. The roll-to-roll system may be a continuous roll-to-roll and/or segmented roll-to-roll, and/or batch mode processing.

Photovoltaic Device

Figure 15A:
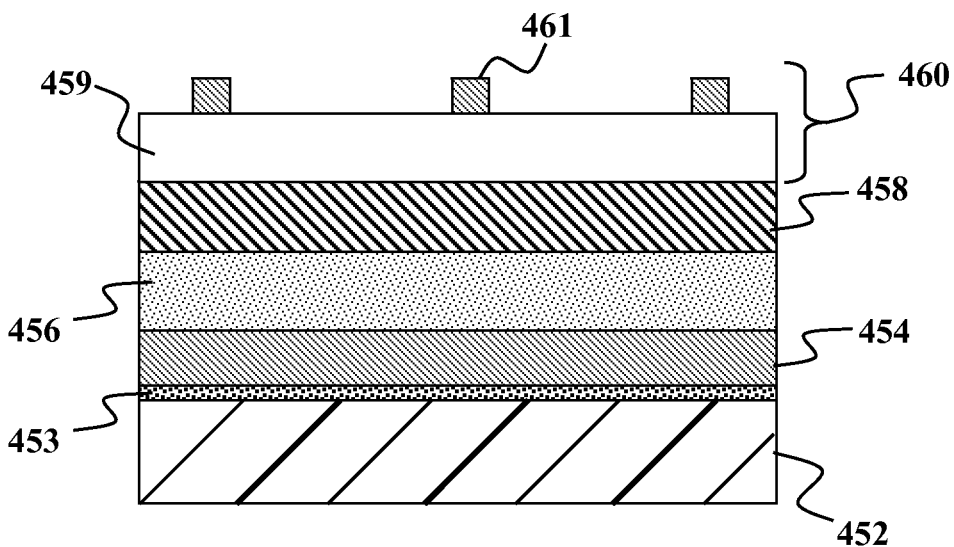
FIG. 15A shows a cross-sectional view of a photovoltaic device according to an embodiment of the present invention.

Referring now to FIG. 15A, the films fabricated as described above using solid group IIIA-based materials may serve as an absorber layer in a photovoltaic device, module, or solar panel. An example of such a photovoltaic device 450 is shown in FIG. 14. The device 450 includes a base substrate 452, an optional adhesion layer 453, a base or back electrode 454, a p-type absorber layer 456 incorporating a film of the type described above, a n-type semiconductor thin film 458 and a transparent electrode 460. By way of example, the base substrate 452 may be made of a metal foil, a polymer such as polyimides (PI), polyamides, polyetheretherketone (PEEK), Polyethersulfone (PES), polyetherimide (PEI), polyethylene naphthalate (PEN), Polyester (PET), related polymers, a metallized plastic, and/or combination of the above and/or similar materials. By way of nonlimiting example, related polymers include those with similar structural and/or functional properties and/or material attributes. The base electrode 454 is made of an electrically conductive material. By way of example, the base electrode 454 may be of a metal layer whose thickness may be selected from the range of about 0.1 micron to about 25 microns. An optional intermediate layer 453 may be incorporated between the electrode 454 and the substrate 452. The transparent electrode 460 may include a transparent conductive layer 459 and a layer of metal (e.g., Al, Ag, Cu, or Ni) fingers 461 to reduce sheet resistance. Optionally, the layer 453 may be a diffusion barrier layer to prevent diffusion of material between the substrate 452 and the electrode 454. The diffusion barrier layer 453 may be a conductive layer or it may be an electrically nonconductive layer. As nonlimiting examples, the layer 453 may be composed of any of a variety of materials, including but not limited to chromium, vanadium, tungsten, and glass, or compounds such as nitrides (including tantalum nitride, tungsten nitride, titanium nitride, silicon nitride, zirconium nitride, and/or hafnium nitride), oxides, carbides, and/or any single or multiple combination of the foregoing. As nonlimiting examples, the layer 453 may be composed of any of a variety of materials, including but not limited to chromium, vanadium, tungsten, and glass, or compounds such as nitrides (including tantalum nitride, tungsten nitride, titanium nitride, silicon nitride, zirconium nitride, and/or hafnium nitride), oxides, carbides, and/or any single or multiple combination of the foregoing. Although not limited to the following, the thickness of this layer can range from 10 nm to 500 nm. In some embodiments, the layer may be from 100 nm to 300 nm. Optionally, the thickness may be in the range of about 150 nm to about 250 nm. Optionally, the thickness may be about 200 nm. In some embodiments, two barrier layers may be used, one on each side of the substrate 452. Optionally, an interfacial layer may be located above the electrode 454 and be comprised of a material such as including but not limited to chromium, vanadium, tungsten, and glass, or compounds such as nitrides (including tantalum nitride, tungsten nitride, titanium nitride, silicon nitride, zirconium nitride, and/or hafnium nitride), oxides, carbides, and/or any single or multiple combination of the foregoing.

The n-type semiconductor thin film 458 serves as a junction partner between the compound film and the transparent conducting layer 459. By way of example, the n-type semiconductor thin film 458 (sometimes referred to as a junction partner layer) may include inorganic materials such as cadmium sulfide (CdS), zinc sulfide (ZnS), zinc hydroxide, zinc selenide (ZnSe), n-type organic materials, or some combination of two or more of these or similar materials, or organic materials such as n-type polymers and/or small molecules. Layers of these materials may be deposited, e.g., by chemical bath deposition (CBD) and/or chemical surface deposition (and/or related methods), to a thickness ranging from about 2 nm to about 1000 nm, more preferably from about 5 nm to about 500 nm, and most preferably from about 10 nm to about 300 nm. This may also configured for use in a continuous roll-to-roll and/or segmented roll-to-roll and/or a batch mode system.

The transparent conductive layer 459 may be inorganic, e.g., a transparent conductive oxide (TCO) such as but not limited to indium tin oxide (ITO), fluorinated indium tin oxide, zinc oxide (ZnO) or zinc oxide ($ZnO_x$) doped with aluminum, or a related material, which can be deposited using any of a variety of means including but not limited to sputtering, evaporation, chemical bath deposition (CBD, electroplating, sol-gel based coating, spray coating, chemical vapor deposition (CVD), physical vapor deposition (PVD), atomic layer deposition (ALD), and the like. Alternatively, the transparent conductive layer may include a transparent conductive polymeric layer, e.g. a transparent layer of doped PEDOT (Poly-3,4-Ethylenedioxythiophene), carbon nanotubes or related structures, or other transparent organic materials, either singly or in combination, which can be deposited using spin, dip, or spray coating, and the like or using any of various vapor deposition techniques. Optionally, it should be understood that a non-conductive layer such as intrinsic ZnO (i-ZnO) may be used between CdS and Al-doped ZnO. Optionally, an insulating layer may be included between the layer 458 and transparent conductive layer 459. Combinations of inorganic and organic materials can also be used to form a hybrid transparent conductive layer. Thus, the layer 459 may optionally be an organic (polymeric or a mixed polymeric-molecular) or a hybrid (organic-inorganic) material. Examples of such a transparent conductive layer are described e.g., in commonly-assigned US Patent Application Publication Number 20040187317, which is incorporated herein by reference.

Those of skill in the art will be able to devise variations on the above embodiments that are within the scope of these teachings. For example, it is noted that in embodiments of the present invention, portions of the IB-IIIA precursor layers (or certain sub-layers of the precursor layers or other layers in the stack) may be deposited using techniques other than microflake-based inks. For example precursor layers or constituent sub-layers may be deposited using any of a variety of alternative deposition techniques including but not limited to solution-deposition of spherical nanopowder-based inks, vapor deposition techniques such as ALD, evaporation, sputtering, CVD, PVD, electroplating and the like.

Figure 15B:
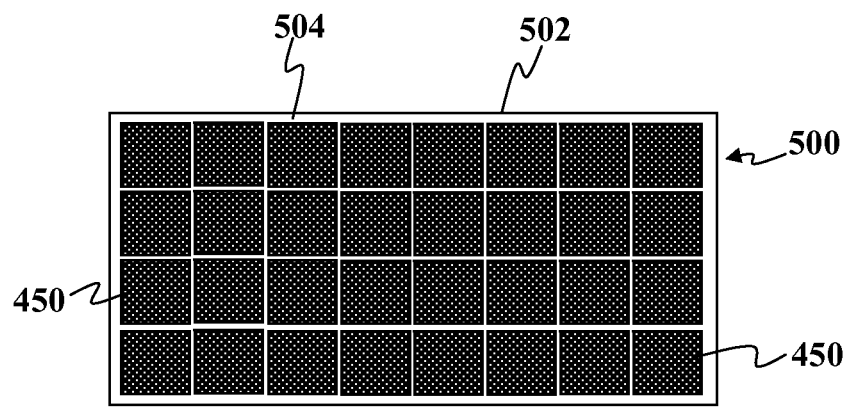
FIG. 15B shows one embodiment of a module according to the present invention.

Referring now to FIG. 15B, it should also be understood that a plurality of devices 450 may be incorporated into a module 500 to form a solar module that includes various packaging, durability, and environmental protection features to enable the devices 450 to be installed in an outdoor environment. In one embodiment, the module 500 may include a frame 502 that supports a substrate 504 on which the devices 450 may be mounted. This module 500 simplifies the installation process by allowing a plurality of devices 450 to be installed at one time. Alternatively, flexible form factors may also be employed. It should also be understood that an encapsulating device and/or layers may be used to protect from environmental influences. As a nonlimiting example, the encapsulating device and/or layers may block the ingress of moisture and/or oxygen and/or acidic rain into the device, especially over extended environmental exposure.

Figure 16A:
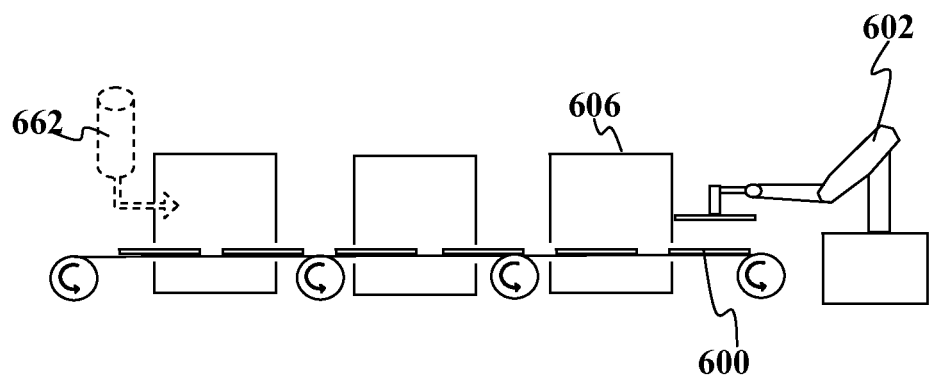
FIG. 16A shows one embodiment of a system for use with rigid substrates according to one embodiment of the present invention.

Referring now to FIG. 16A, it should also be understood that the embodiments of the present invention may also be used on a rigid substrate 600. By way of nonlimiting example, the rigid substrate 600 may be glass, soda-lime glass, steel, stainless steel, aluminum, polymer, ceramic, coated polymer, or other rigid material suitable for use as a solar cell or solar module substrate. A high speed pick-and-place robot 602 may be used to move rigid substrates 600 onto a processing area from a stack or other storage area. In FIG. 17A, the substrates 600 are placed on a conveyor belt which then moves them through the various processing chambers. Optionally, the substrates 600 may have already undergone some processing by the time and may already include a precursor layer on the substrate 600. Other embodiments of the invention may form the precursor layer as the substrate 600 passes through the chamber 606.

Figure 16B:
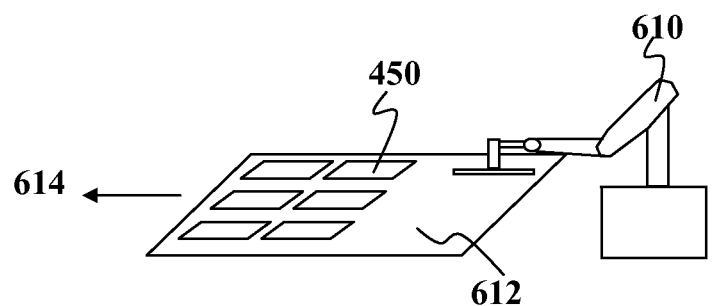
FIG. 16B shows one embodiment of a system for use with rigid substrates according to one embodiment of the present invention.

FIG. 16B shows another embodiment of the present system where a pick-and-place robot 610 is used to position a plurality of rigid substrates on a carrier device 612 which may then be moved to a processing area as indicated by arrow 614. This allows for multiple substrates 600 to be loaded before they are all moved together to undergo processing. Source 662 may provide a source of processing gas to provide a suitable atmosphere to create the desired semiconductor film. In one embodiment, chalcogen vapor may be provided by using a partially or fully enclosed chamber with a chalcogen source 662 therein or coupled to the chamber.

Inter-metallic Material

Figure 17:
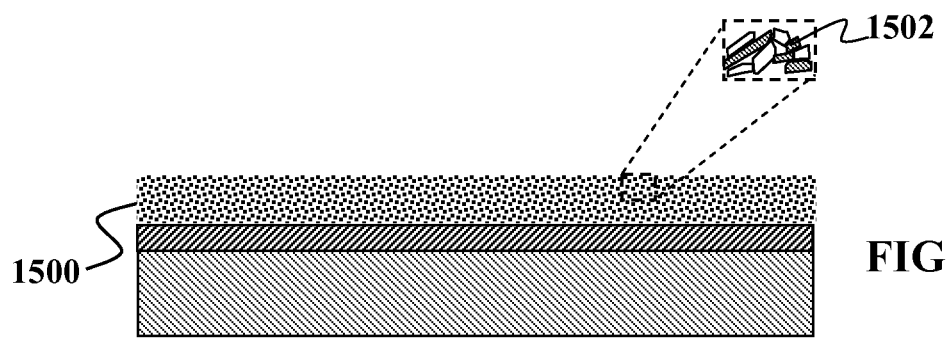
FIGS. 17-19 show the use of inter-metallic material to form a film according to embodiments of the present invention.
Figure 17A:
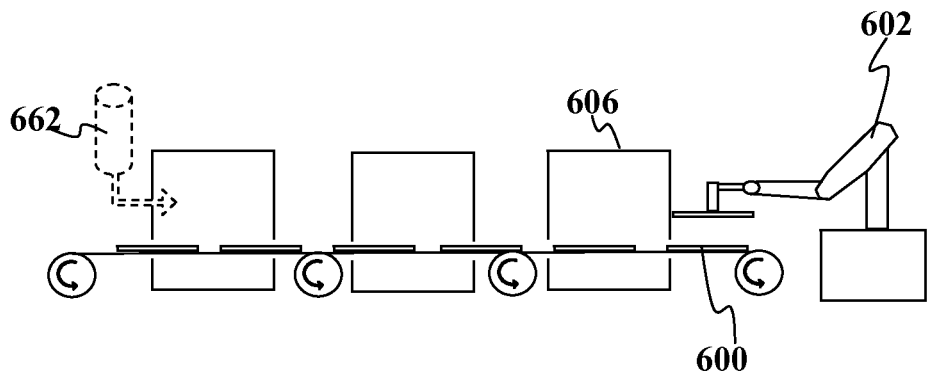
Figure 17B:
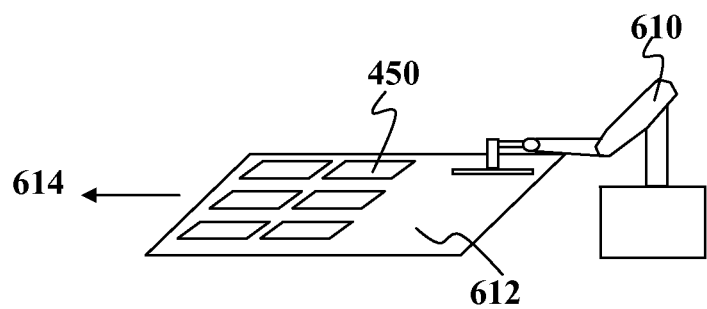

Referring now to FIG. 17, any of the foregoing solid particles, including solid group IIIA-based particles may be used with the following inter-metallic materials. By way of example and not limitation, the present invention also includes the possibility of using solid particles, emulsions of liquid materials, inter-metallic materials, and/or any single or multiple combinations of the foregoing.

In one embodiment, the particles used to form a precursor layer 1500 may include particles that are inter-metallic particles 1502. In one embodiment, an inter-metallic material is a material containing at least two elements, wherein the amount of one element in the inter-metallic material is less than about 50 molar percent of the total molar amount of the inter-metallic material and/or the total molar amount of that one element in a precursor material. The amount of the second element is variable and may range from less than about 50 molar percent to about 50 or more molar percent of the inter-metallic material and/or the total molar amount of that one element in a precursor material. Alternatively, inter-metallic phase materials may be comprised of two or more metals where the materials are admixed in a ratio between the upper bound of the terminal solid solution and an alloy comprised of about 50% of one of the elements in the inter-metallic material. The particle distribution shown in the enlarged view of FIG. 17 is purely exemplary and is nonlimiting. It should be understood that some embodiments may have particles that all contain inter-metallic materials, mixture of metallic and inter-metallic materials, metallic particles and inter-metallic particles, or combinations thereof.

It should be understood that inter-metallic phase materials are compounds and/or intermediate solid solutions containing two or more metals, which have characteristic properties and crystal structures different from those of either the pure metals or the terminal solid solutions. Inter-metallic phase materials arise from the diffusion of one material into another via crystal lattice vacancies made available by defects, contamination, impurities, grain boundaries, and mechanical stress. Upon two or more metals diffusing into one another, intermediate metallic species are created that are combinations of the two materials. Sub-types of inter-metallic compounds include both electron and interstitial compounds.

Electron compounds arise if two or more mixed metals are of different crystal structure, valency, or electropositivity relative to one another; examples include but are not limited to copper selenide, gallium selenide, indium selenide, copper telluride, gallium telluride, indium telluride, and similar and/or related materials and/or blends or mixtures of these materials.

Interstitial compounds arise from the admixture of metals or metals and non-metallic elements, with atomic sizes that are similar enough to allow the formation of interstitial crystal structures, where the atoms of one material fit into the spaces between the atoms of another material. For inter-metallic materials where each material is of a single crystal phase, two materials typically exhibit two diffraction peaks, each representative of each individual material, superimposed onto the same spectra. Thus inter-metallic compounds typically contain the crystal structures of both materials contained within the same volume. Examples include but are not limited to Cu—Ga, Cu—In, and similar and/or related materials and/or blends or mixtures of these materials, where the compositional ratio of each element to the other places that material in a region of its phase diagram other than that of the terminal solid solution.

Inter-metallic materials are useful in the formation of precursor materials for CIGS photovoltaic devices in that metals interspersed in a highly homogenous and uniform manner amongst one another, and where each material is present in a substantially similar amount relative to the other, thus allowing for rapid reaction kinetics leading to high quality absorber films that are substantially uniform in all three dimensions and at the nano-, micro, and meso-scales.

In the absence of the addition of indium nanoparticles, which are difficult to synthesize and handle, terminal solid solutions do not readily allow a sufficiently large range of precursor materials to be incorporated into a precursor film in the correct ratio (e.g. Cu/(In+Ga)=0.85) to provide for the formation of a highly light absorbing, photoactive absorber layer. Furthermore, terminal solid solutions may have mechanical properties that differ from those of inter-metallic materials and/or intermediate solid solutions (solid solutions between a terminal solid solution and/or element). As a nonlimiting example, some terminal solid solutions are not brittle enough to be milled for size reduction. Other embodiments may be too hard to be milled. The use of inter-metallic materials and/or intermediate solid solutions can address some of these drawbacks.

The advantages of particles 1502 having an inter-metallic phase are multi-fold. As a nonlimiting example, a precursor material suitable for use in a thin film solar cell may contain group IB and group IIIA elements such as copper and indium, respectively. If an inter-metallic phase of Cu—In is used such as $Cu_1In_2$, then Indium is part of an In-rich Cu material and not added as pure indium. Adding pure indium as a metallic particle is challenging due to the difficulty in achieving In particle synthesis with high yield, small and narrow nanoparticle size distribution, and requiring particle size discrimination, which adds further cost. Using inter-metallic In-rich Cu particles avoids pure elemental In as a precursor material. Additionally, because the inter-metallic material is Cu poor, this also advantageously allows Cu to be added separately to achieve precisely the amount of Cu desired in the precursor material. The Cu is not tied to the ratio fixed in alloys or solid solutions that can be created by Cu and In. The inter-metallic material and the amount of Cu can be fine tuned as desired to reach a desired stoichiometric ratio. Ball milling of these particles results in no need for particle size discrimination, which decreases cost and improves the throughput of the material production process.

In some specific embodiments of the present invention, having an inter-metallic material provides a broader range of flexibility. Since economically manufacturing elemental indium particles is difficult, it would be advantageous to have an indium-source that is more economically interesting. Additionally, it would be advantageous if this indium source still allows varying both the Cu/(In+Ga) and Ga/(In+Ga) in the layer independently of each other. As one nonlimiting example, a distinction can be made between $Cu_{11}In_9$ and $Cu_1In_2$ with an inter-metallic phase. This particularly true if only one layer of precursor material is used. If, for this particular example, if indium is only provided by $Cu_{11}In_9$, there is more restriction what stoichiometric ratio can be created in a final group IB-IIIA-VIA compound. With $Cu_1In_2$ as the only indium source, however, there is much greater range of ratio can be created in a final group IB-IIIA-VIA compound. $Cu_1In_2$ allows you to vary both the Cu/(In+Ga) and Ga/(In+Ga) independently in a broad range, whereas Cu11In9 does not. For instance, Cu11In9 does only allow for Ga/(In+Ga)=0.25 with Cu/(In+Ga)>0.92. Yet another example, Cu11In9 does only allow for Ga/(In+Ga)=0.20 with Cu/(In+Ga)>0.98. Yet another example, Cu11In9 does only allow for Ga/(In+Ga)=0.15 with Cu/(In+Ga)>1.04. Thus for an intermetallic material, particularly when the intermetallic material is a sole source of one of the elements in the final compound, the final compound may be created with stoichiometric ratios that more broadly explore the bounds of Cu/(In+Ga) with a compositional range of about 0.7 to about 1.0, and Ga/(In+Ga) with a compositional range of about 0.05 to about 0.3 In other embodiments, Cu/(In+Ga) compositional range may be about 0.01 to about 1.0. In other embodiments, the Cu/(In+Ga) compositional range may be about 0.01 to about 1.1. In other embodiments, the Cu/(In+Ga) compositional range may be about 0.01 to about 1.5. This typically results in additional $Cu_xSe_y$, which we might be able to remove afterwards if it is at the top surface. It should be understood that these ratios may apply to any of the above embodiments described herein.

Furthermore, it should be understood that during processing, an intermetallic material may create more liquid than other compounds. As a nonlimiting example, $Cu_1In_2$ will form more liquid when heated during processing than Cu11In9. More liquid promotes more atomic intermixing since it easier for material to move and mix while in a liquid stage.

Additionally, there are specific advantages for particular types of inter-metallic particles such as, but not limited to, $Cu_1In_2$. $Cu_1In_2$ is a material that is metastable. The material is more prone to decomposition, which advantageously for the present invention, will increase the rate of reaction (kinetically). Further, the material is less prone to oxidation (e.g. compared to pure In) and this further simplifies processing. This material may also be single-phase, which would make it more uniform as a precursor material, resulting in better yield.

Figure 18:
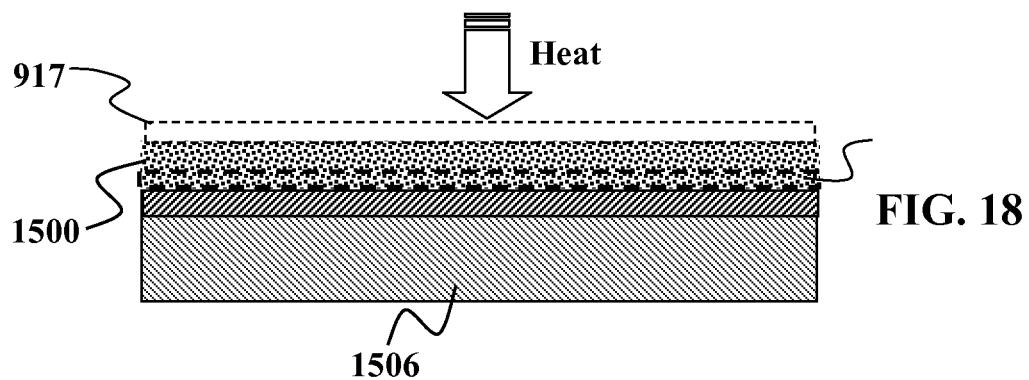
Figure 19:
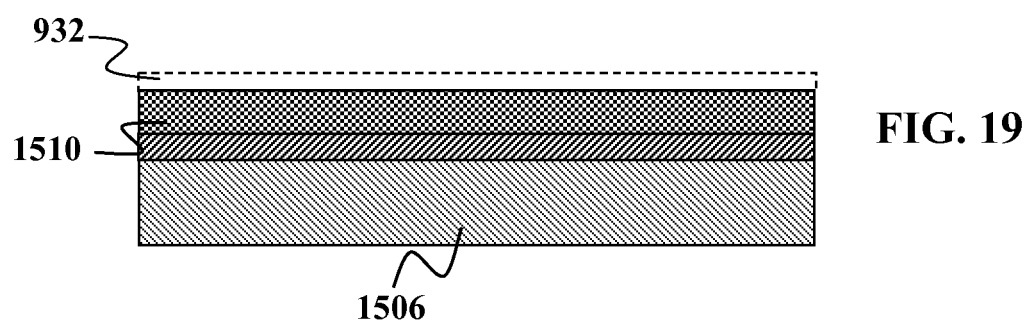

As seen in FIGS. 18 and 19, after the layer 1500 is deposited over the substrate 1506, it may then be heated in a suitable atmosphere to react the layer 1500 in FIG. 18 and form film 1510 shown in FIG. 19. It should be understood that the layer 1500 may be used in conjunction with layers 915 and 917 as described above with regards to FIG. 13A-13B. The layer 915 may be comprised of various materials including but not limited at least one of the following: a group IB element, a group IIIA element, a group VIA element, a group IA element (new style: group 1), a binary and/or multinary alloy of any of the preceding elements, a solid solution of any of the preceding elements. It should be understood that sodium or a sodium-based material such as but not limited to sodium, a sodium compound, sodium fluoride, and/or sodium indium sulfide, may also be used in layer 915 with the precursor material to improve the qualities of the resulting film. FIG. 19 shows that a layer 932 may also be used as described with regards to FIG. 13F. Any of the method suggested previously with regards to sodium content may also be adapted for use with the embodiments shown in FIGS. 17-19.

It should be understood that other embodiments of the present invention also disclose material comprised of at least two elements wherein the amount of at least one element in the material is less than about 50 molar percent of the total molar amount of that element in the precursor material. This includes embodiments where the amount of group IB element is less than the amount of group IIIA element in inter-metallic material. As a nonlimiting example, this may include other group IB poor, group IB-IIIA materials such as Cu-poor $Cu_xIn_y$ particles (where x<y). The amount of group IIIA material may be in any range as desired (more than about 50 molar percent of the element in the precursor material or less than 50 molar percent). In another nonlimiting example, $Cu_1Ga_2$ may be used with elemental Cu and elemental In. Although this material is not an inter-metallic material, this material is a intermediate solid solution and is different from a terminal solid solution. All solid particles are created based on a $Cu_1Ga_2$ precursor. In this embodiment, no emulsions are used.

In still other embodiments of the present invention, other viable precursor materials may be formed using a group IB rich, group IB-IIIA material. As a nonlimiting example, a variety of intermediate solid-solutions may be used. Cu—Ga (38 at % Ga) may be used in precursor layer 1500 with elemental indium and elemental copper. In yet another embodiment, Cu—Ga (30 at % Ga) may be used in precursor layer 1500 with elemental copper and elemental indium. Both of these embodiments describe Cu-rich materials with the Group IIIA element being less than about 50 molar percent of that element in the precursor material. In still further embodiments, Cu—Ga (multiphasic, 25 at % Ga) may be used with elemental copper and indium to form the desired precursor layer. It should be understood that nanoparticles of these materials may be created by mechanical milling or other size reduction methods. In other embodiments, these particles may be made by electroexplosive wire (EEW) processing, evaporation condensation (EC), pulsed plasma processing, or other methods. Although not limited to the following, the particles sizes may be in the range of about 10 nm to about 1 micron. They may be of any shape as described herein.

Figure 20:
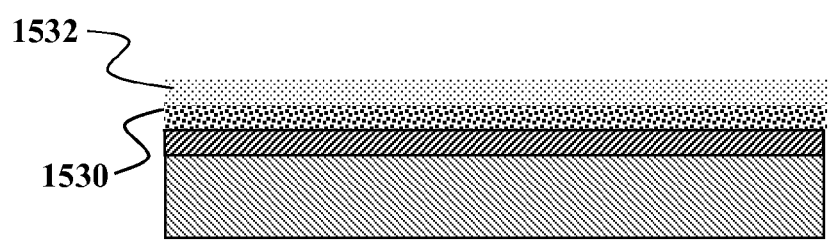
FIG. 20 is a cross-sectional view showing the use of multiple layers to form a film according to embodiments of the present invention.

Referring now to FIG. 20, in a still further embodiment of the present invention, two or more layers of materials may be coated, printed, or otherwise formed to provide a precursor layer with the desired stoichiometric ratio. As a nonlimiting example, layer 1530 may contain a precursor material having $Cu_{11}In_9$ and a Ga source such as elemental Ga and/or $Ga_xSe_y$. A copper rich precursor layer 1532 containing $Cu_{78}In_{28}$ (solid-solution) and elemental indium or $In_xSe_y$ may be printed over layer 1530. In such an embodiment, the resulting overall ratios may have Cu/(In+Ga)=0.85 and Ga/(In+Ga) 0.19. In one embodiment of the resulting film, the film may have a stoichiometric ratio of Cu/(In+Ga) with a compositional range of about 0.7 to about 1.0 and Ga/(In+Ga) with a compositional range of about 0.05 to about 0.3.

Figure 21:
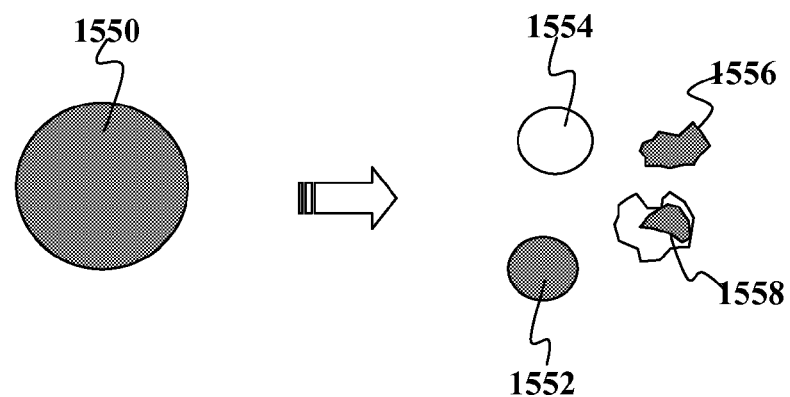
FIG. 21 shows feedstock material being processed according to embodiments of the present invention.

Referring now to FIG. 21, it should be understood that in some embodiments of the present invention, the inter-metallic material is used as a feedstock or starting material from which particles and/or nanoparticles may be formed. As a nonlimiting example, FIG. 21 shows one inter-metallic feedstock particle 1550 being processed to form other particles. Any method used for size reduction and/or shape change may be suitable including but not limited to milling, EEW, EC, pulsed plasma processing, or combinations thereof. Particles 552, 554, 556, and 558 may be formed. These particles may be of varying shapes and some may contain only the inter-metallic phase while others may contain that phase and other material phases.

Figure 22A:
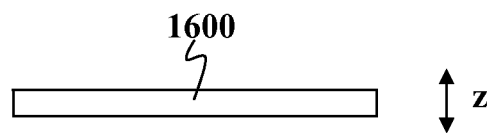
FIGS. 22A and 22B show features of flakes according to embodiments of the present invention.
Figure 22B:
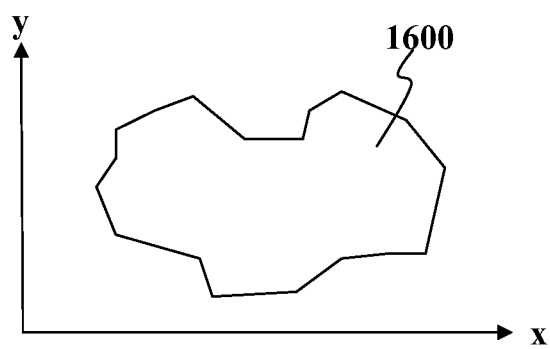
Figure 23A:
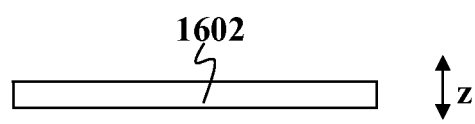
FIGS. 23A and 23B show features of platelets.
Figure 23B:
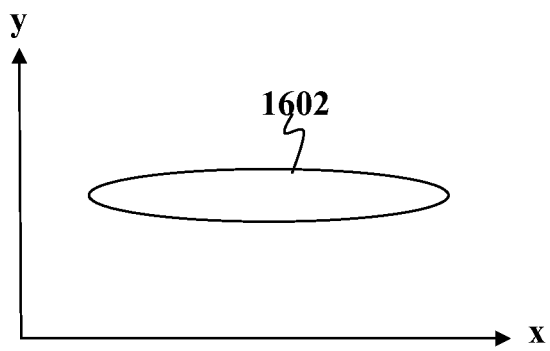

Referring now to FIGS. 22A and 22B, flakes 1600 (microflakes and/or nanoflakes) provide certain advantages over other non-spherical shapes such as but not limited to platelets. The flakes 1600 provide for highly efficient stacking (due to uniform thickness in Z-axis) and high surface area (in X and Y axes). This leads to faster reactions, better kinetics, and more uniform products/films/compounds (with fewer side propagations). Platelet 1602 as seen in FIGS. 23A and 23B fail to have all of the above advantages.

Figure 24:
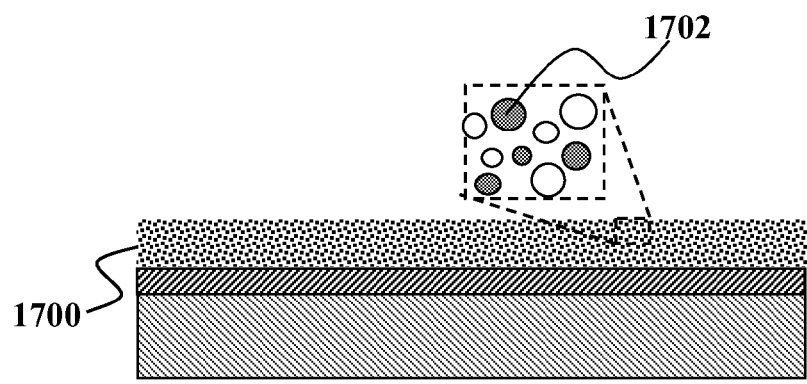
FIG. 24 shows the use of spherical inter-metallic material to form a film according to embodiments of the present invention.

Referring now to FIG. 24, shows that the foregoing discussion on intermetallics also applies to spherical particles. These spherical intermetallic particles may be used with other spherical particles, non-spherical particles, particles of various shapes, and/or any single or multiple combination of the foregoing.

In one embodiment, the particles used to form a precursor layer 1700 may include particles that are inter-metallic particles 1702. In one embodiment, an inter-metallic material is a material containing at least two elements, wherein the amount of one element in the inter-metallic material is less than about 50 molar percent of the total molar amount of the inter-metallic material and/or the total molar amount of that one element in a precursor material. The amount of the second element is variable and may range from less than about 50 molar percent to about 50 or more molar percent of the inter-metallic material and/or the total molar amount of that one element in a precursor material. Alternatively, inter-metallic phase materials may be comprised of two or more metals where the materials are admixed in a ratio between the upper bound of the terminal solid solution and an alloy comprised of about 50% of one of the elements in the inter-metallic material. The particle distribution shown in the enlarged view of FIG. 24 is purely exemplary and is nonlimiting. It should be understood that some embodiments may have particles that all contain inter-metallic materials, mixture of metallic and inter-metallic materials, metallic particles and inter-metallic particles, or combinations thereof.

It should be understood that inter-metallic phase materials are compounds and/or intermediate solid solutions containing two or more metals, which have characteristic properties and crystal structures different from those of either the pure metals or the terminal solid solutions. Inter-metallic phase materials arise from the diffusion of one material into another via crystal lattice vacancies made available by defects, contamination, impurities, grain boundaries, and mechanical stress. Upon two or more metals diffusing into one another, intermediate metallic species are created that are combinations of the two materials. Sub-types of inter-metallic compounds include both electron and interstitial compounds.

Electron compounds arise if two or more mixed metals are of different crystal structure, valency, or electropositivity relative to one another; examples include but are not limited to copper selenide, gallium selenide, indium selenide, copper telluride, gallium telluride, indium telluride, and similar and/or related materials and/or blends or mixtures of these materials.

Interstitial compounds arise from the admixture of metals or metals and non-metallic elements, with atomic sizes that are similar enough to allow the formation of interstitial crystal structures, where the atoms of one material fit into the spaces between the atoms of another material. For inter-metallic materials where each material is of a single crystal phase, two materials typically exhibit two diffraction peaks, each representative of each individual material, superimposed onto the same spectra. Thus inter-metallic compounds typically contain the crystal structures of both materials contained within the same volume. Examples include but are not limited to Cu—Ga, Cu—In, and similar and/or related materials and/or blends or mixtures of these materials, where the compositional ratio of each element to the other places that material in a region of its phase diagram other than that of the terminal solid solution.

Inter-metallic materials are useful in the formation of precursor materials for CIGS photovoltaic devices in that metals interspersed in a highly homogenous and uniform manner amongst one another, and where each material is present in a substantially similar amount relative to the other, thus allowing for rapid reaction kinetics leading to high quality absorber films that are substantially uniform in all three dimensions and at the nano-, micro, and meso-scales.

In the absence of the addition of indium nanoparticles, which are difficult to synthesize and handle, terminal solid solutions do not readily allow a sufficiently large range of precursor materials to be incorporated into a precursor film in the correct ratio (e.g. Cu/(In+Ga)=0.85) to provide for the formation of a highly light absorbing, photoactive absorber layer. Furthermore, terminal solid solutions may have mechanical properties that differ from those of inter-metallic materials and/or intermediate solid solutions (solid solutions between a terminal solid solution and/or element). As a nonlimiting example, some terminal solid solutions are not brittle enough to be milled for size reduction. Other embodiments may be too hard to be milled. The use of inter-metallic materials and/or intermediate solid solutions can address some of these drawbacks.

Figure 25:
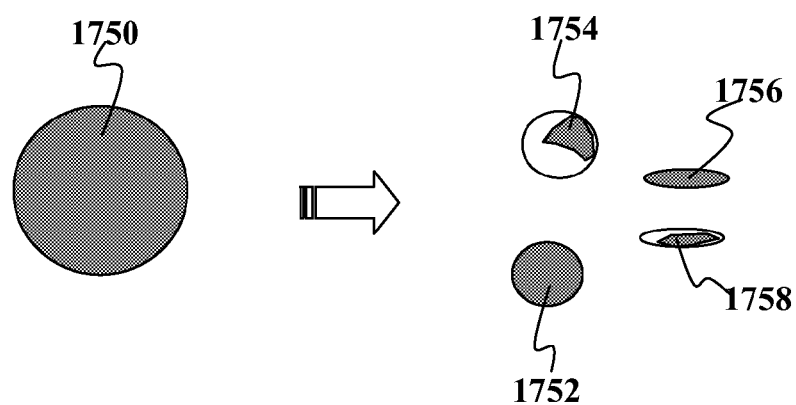
FIG. 25 shows feedstock material being processed according to embodiments of the present invention.

Referring now to FIG. 25, it should be understood that in some embodiments of the present invention, the inter-metallic material is used as a feedstock or starting material from which particles and/or nanoparticles may be formed. As a nonlimiting example, FIG. 25 shows one inter-metallic feedstock particle 1750 being processed to form other particles. Any method used for size reduction and/or shape change may be suitable including but not limited to milling, EEW, EC, pulsed plasma processing, or combinations thereof. Particles 1752, 1754, 1756, and 1758 may be formed. These particles may be of varying shapes and some may contain only the inter-metallic phase while others may contain that phase and other material phases.

Again, any of the solid particles, including solid group IIIA-based particles may be used with the foregoing inter-metallic materials. By way of example and not limitation, the present invention also includes the possibility of using solid particles, emulsions of liquid materials, intermetallic materials, and/or any single or multiple combinations of the foregoing.

Chalcogenides

It should be understood that a variety of chalcogen and/or chalcogenide particles may also be combined with non-chalcogenide particles to arrive at the desired excess supply of chalcogen in the precursor layer. The following table (Table IV) provides a non-limiting matrix of some of the possible combinations between chalcogenide particles listed in the rows and the non-chalcogenide particles listed in the columns. It should also be understood that two more materials from the columns may be combined. As a nonlimiting example, Cu—Ga+In+Se may also be combined even though the are from different columns. Another possibility involves, Cu—Ga+In—Ga+Se (or some other chalcogen source).

TABLE IV

|  | Cu | In | Ga | Cu—In |
|---|---|---|---|---|
| Se | Se + Cu | Se + In | Se + Ga | Se + Cu—In |
| Cu—Se | Cu—Se + Cu | Cu—Se + In | Cu—Se + Ga | Cu—Se + Cu—In |
| In—Se | In—Se + Cu | In—Se + In | In—Se + Ga | In—Se + Cu—In |
| Ga—Se | Ga—Se + Cu | Ga—Se + In | Ga—Se + Ga | Ga—Se + Cu—In |
| Cu—In—Se | Cu—In—Se + Cu | Cu—In—Se + In | Cu—In—Se + Ga | Cu—In—Se + Cu—In |
| Cu—Ga—Se | Cu—Ga—Se + Cu | Cu—Ga—Se + In | Cu—Ga—Se + Ga | Cu—Ga—Se + Cu—In |
| In—Ga—Se | In—Ga—Se + Cu | In—Ga—Se + In | In—Ga—Se + Ga | In—Ga—Se + Cu—In |
| Cu—In—Ga—Se | Cu—In—Ga—Se + Cu | Cu—In—Ga—Se + In | Cu—In—Ga—Se + Ga | Cu—In—Ga—Se + Cu—In |

|  | Cu—Ga | In—Ga | Cu—In—Ga |
|---|---|---|---|
| Se | Se + Cu—Ga | Se + In—Ga | Se + Cu—In—Ga |
| Cu—Se | Cu—Se + Cu—Ga | Cu—Se + In—Ga | Cu—Se + Cu—In—Ga |
| In—Se | In—Se + Cu—Ga | In—Se + In—Ga | In—Se + Cu—In—Ga |
| Ga—Se | Ga—Se + Cu—Ga | Ga—Se + In—Ga | Ga—Se + Cu—In—Ga |
| Cu—In—Se | Cu—In—Se + Cu—Ga | Cu—In—Se + In—Ga | Cu—In—Se + Cu—In—Ga |
| Cu—Ga—Se | Cu—Ga—Se + Cu—Ga | Cu—Ga—Se + In—Ga | Cu—Ga—Se + Cu—In—Ga |
| In—Ga—Se | In—Ga—Se + Cu—Ga | In—Ga—Se + In—Ga | In—Ga—Se + Cu—In—Ga |
| Cu—In—Ga—Se | Cu—In—Ga—Se + Cu—Ga | Cu—In—Ga—Se + In—Ga | Cu—In—Ga—Se + Cu—In—Ga |

In yet another embodiment, the present invention may combine a variety of chalcogenide particles with other chalcogenide particles. The following table (Table V) provides a non-limiting matrix of some of the possible combinations between chalcogenide particles listed for the rows and chalcogenide particles listed for the columns.

TABLE V

|  | Cu—Se | In—Se | Ga—Se | Cu—In—Se |
|---|---|---|---|---|
| Se | Se + Cu—Se | Se + In—Se | Se + Ga—Se | Se + Cu—In—Se |
| Cu—Se | Cu—Se | Cu—Se + In—Se | Cu—Se + Ga—Se | Cu—Se + Cu—In—Se |
| In—Se | In—Se + Cu—Se | In—Se | In—Se + Ga—Se | In—Se + Cu—In—Se |
| Ga—Se | Ga—Se + Cu—Se | Ga—Se + In—Se | Ga—Se | Ga—Se + Cu—In—Se |

TABLE V-continued

| | | | | |
|---|---|---|---|---|
| Cu—In—Se | Cu—In—Se + Cu—Se | Cu—In—Se + In—Se | Cu—In—Se + Ga—Se | Cu—In—Se |
| Cu—Ga—Se | Cu—Ga—Se + Cu—Se | Cu—Ga—Se + In—Se | Cu—Ga—Se + Ga—Se | Cu—Ga—Se + Cu—In—Se |
| In—Ga—Se | In—Ga—Se + Cu—Se | In—Ga—Se + In—Se | In—Ga—Se + Ga—Se | In—Ga—Se + Cu—In—Se |
| Cu—In—Ga—Se | Cu—In—Ga—Se + Cu—Se | Cu—In—Ga—Se + In—Se | Cu—In—Ga—Se + Ga—Se | Cu—In—Ga—Se + Cu—In—Se |

| | Cu—Ga—Se | In—Ga—Se | Cu—In—Ga—Se |
|---|---|---|---|
| Se | Se + Cu—Ga—Se | Se + In—Ga—Se | Se + Cu—In—Ga—Se |
| Cu—Se | Cu—Se + Cu—Ga—Se | Cu—Se + In—Ga—Se | Cu—Se + Cu—In—Ga—Se |
| In—Se | In—Se + Cu—Ga—Se | In—Se + In—Ga—Se | In—Se + Cu—In—Ga—Se |
| Ga—Se | Ga—Se + Cu—Ga—Se | Ga—Se + In—Ga—Se | Ga—Se + Cu—In—Ga—Se |
| Cu—In—Se | Cu—In—Se + Cu—Ga—Se | Cu—In—Se + In—Ga—Se | Cu—In—Se + Cu—In—Ga—Se |
| Cu—Ga—Se | Cu—Ga—Se | Cu—Ga—Se + In—Ga—Se | Cu—Ga—Se + Cu—In—Ga—Se |
| In—Ga—Se | In—Ga—Se + Cu—Ga—Se | In—Ga—Se | In—Ga—Se + Cu—In—Ga—Se |
| Cu—In—Ga—Se | Cu—In—Ga—Se + Cu—Ga—Se | Cu—In—Ga—Se + In—Ga—Se | Cu—In—Ga—Se |

Additionally, it should be understood that any number of combinations of flake and non-flake particles may be used according to the present invention in the various layers. As a nonlimiting example, the combinations may include but are not limited to:

TABLE VI

| | |
|---|---|
| Combination 1 | 1) chalcogenide (flake) + non-chalcogenide (flake) |
| Combination 2 | 2) chalcogenide (flake) + non-chalcogenide (non-flake) |
| Combination 3 | 3) chalcogenide (non-flake) + non-chalcogenide (flake) |
| Combination 4 | 4) chalcogenide (non-flake) + non-chalcogenide (non-flake) |
| Combination 5 | 5) chalcogenide (flake) + chalcogenide (flake) |
| Combination 6 | 6) chalcogenide (flake) + chalcogenide (non-flake) |
| Combination 7 | 7) chalcogenide (non-flake) + chalcogenide (non-flake) |
| Combination 8 | 8) non-chalcogenide (flake) + non-chalcogenide (flake) |
| Combination 9 | 9) non-chalcogenide (flake) + non-chalcogenide (non-flake) |
| Combination 10 | 10) non-chalcogenide (non-flake) + non-chalcogenide (non-flake) |

Additional Chalcogen

Any of the methods described herein may be further optimized by using, prior to, during, or after the solution deposition and/or heating of one or more of the precursor layers, any combination of (1) any chalcogen source that can be solution-deposited, e.g. a Se or S nano- or micron-sized powder mixed into the precursor layers or deposited as a separate layer, (2) chalcogen (e.g., Se or S) evaporation, (3) an $H_2Se$ ($H_2S$) atmosphere, (4) a chalcogen (e.g., Se or S) atmosphere, (5) an $H_2$ atmosphere, (6) an organo-selenium atmosphere, e.g. diethylselenide or another organo-metallic material, (7) another reducing atmosphere, e.g. CO, and a (8) heat treatment. The stoichiometric ratio of microflakes to extra chalcogen, given as Se/(Cu+In+Ga+Se) may be in the range of about 0 to about 1000.

Figure 26A:
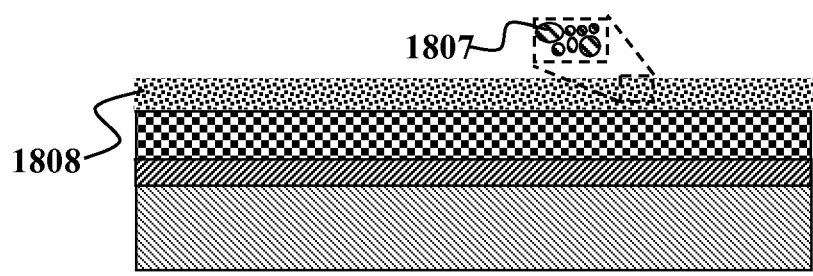
FIG. 26A-26D show cross-sectional view of depositing additional chalcogen according to one embodiment of the present invention.
Figure 26B:
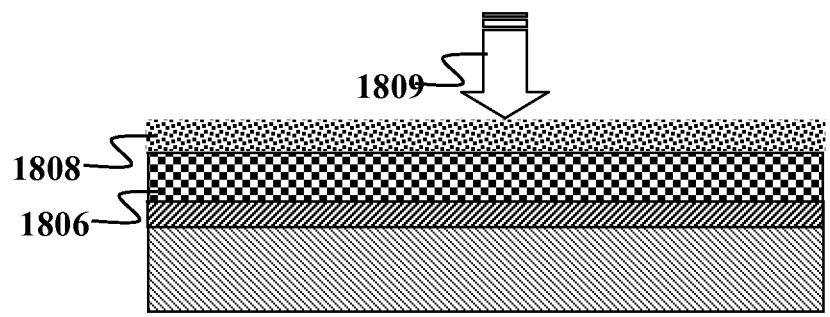
Figure 26C:
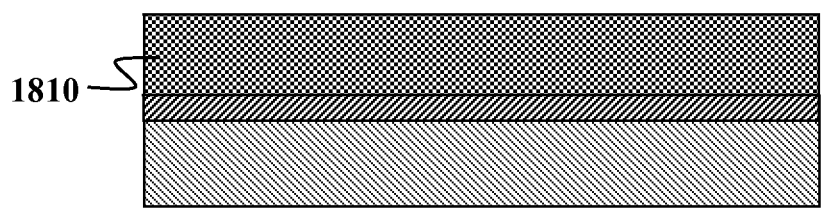
Figure 26D:
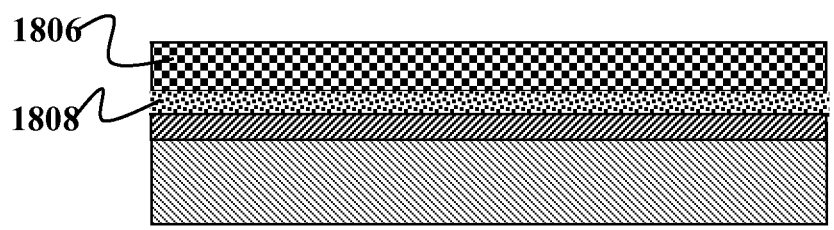

For example as shown in FIG. 26A, a layer 1808 containing elemental chalcogen particles 1807 over the precursor layer 1806. By way of example, and without loss of generality, the chalcogen particles may be particles of selenium, sulfur or tellurium. As shown in FIG. 26B, heat 1809 is applied to the precursor layer 1806 and the layer 1808 containing the chalcogen particles to heat them to a temperature sufficient to melt the chalcogen particles 1807 and to react the chalcogen particles 1807 with the group IB element and group IIIA elements in the precursor layer 1806. The reaction of the chalcogen particles 1807 with the group IB and IIIA elements forms a compound film 1810 of a group IB-IIIA-chalcogenide compound as shown in FIG. 26C. Optionally, the group IB-IIIA-chalcogenide compound is of the form $Cu_zIn_{1-x}Ga_xSe_{2(1-y)}S_y$, where $0<x<1$, $0 \leq y \leq 1$, and $0.5 \leq z \leq 1.5$.

If the chalcogen particles 1807 melt at a relatively low temperature (e.g., 220° C. for Se, 120° C. for S) the chalcogen is already in a liquid state and makes good contact with the group IB and IIIA nanoparticles in the precursor layer 1806. If the precursor layer 1806 and molten chalcogen are then heated sufficiently (e.g., at about 375° C.) the chalcogen reacts with the group IB and IIIA elements in the precursor layer 1806 to form the desired IB-IIIA-chalcogenide material in the compound film 1810. As one nonlimiting example, the precursor layer is between about 10 nm and about 5000 nm thick. In other embodiments, the precursor layer may be between about 4.0 to about 0.5 microns thick.

There are a number of different techniques for forming the IB-IIIA precursor layer 1806. For example, the precursor layer 1806 may be formed from a nanoparticulate film including nanoparticles containing the desired group IB and IIIA elements. The nanoparticles may be a mixture elemental nanoparticles, i.e., nanoparticles having only a single atomic species. Alternatively, the nanoparticles may be binary nanoparticles, e.g., Cu—In, In—Ga, or Cu—Ga or ternary particles, such as, but not limited to, Cu—In—Ga, or quaternary particles. Such nanoparticles may be obtained, e.g., by ball milling a commercially available powder of the desired elemental, binary or ternary material. These nanoparticles may be between about 0.1 nanometer and about 500 nanometers in size.

One of the advantages of the use of nanoparticle-based dispersions is that it is possible to vary the concentration of the elements within the compound film 1810 either by building the precursor layer in a sequence of sub-layers or by directly varying the relative concentrations in the precursor layer 1806. The relative elemental concentration of the nanoparticles that make up the ink for each sub-layer may be varied. Thus, for example, the concentration of gallium within the absorber layer may be varied as a function of depth within the absorber layer.

The layer 1808 containing the chalcogen particles 1807 may be disposed over the nanoparticulate film and the nanoparticulate film (or one or more of its constituent sub-layers)

may be subsequently sintered in conjunction with heating the chalcogen particles 1807. Alternatively, the nanoparticulate film may be heated to form the precursor layer 1806 before disposing the layer 1808 containing elemental chalcogen particles 1807 over precursor layer 1806. Additional disclosure on depositing chalcogen material may be found in co-pending U.S. patent application Ser. No. 11/361,522 filed Feb. 23, 2006 and fully incorporated herein by reference for all purposes.

Figure 27A:
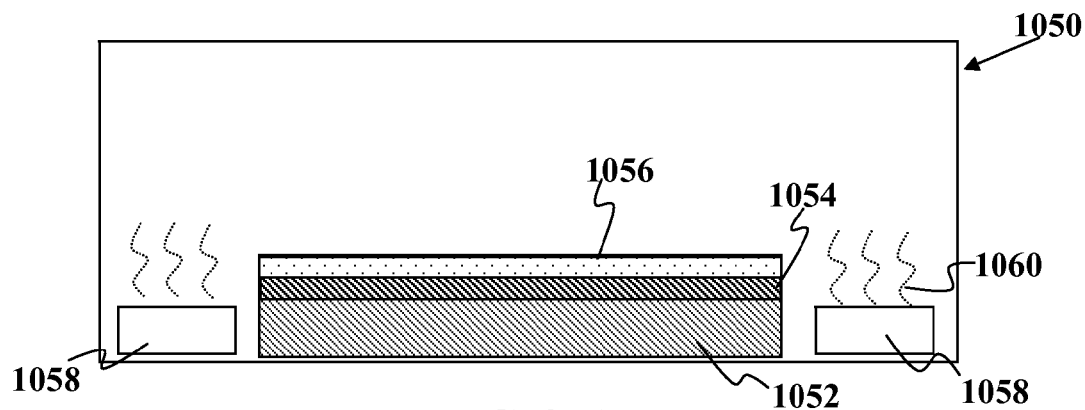
FIG. 27A shows a schematic of a system using a chalcogen vapor environment according to one embodiment of the present invention.

Referring now to FIG. 27A, it should be understood that any of the foregoing may also be used in a chalcogen vapor environment. It should be understood that this may be used in a one stage process, a two stage process, or a multi-stage process. In two stage and/or multi-stage process, different atmospheres may optionally be used for each stage and some may be inert atmospheres as described previously.

In another embodiment for use with a particle and/or microflake precursor material, it should be understood that overpressure from chalcogen vapor is used to provide a chalcogen atmosphere to improve processing of the film and crystal growth. FIG. 27A shows a chamber 1050 with a substrate 1052 having a contact layer 1054 and a precursor layer 1056. Extra sources 1058 of chalcogen are included in the chamber and are brought to a temperature to generate chalcogen vapor as indicated by lines 1060. In one embodiment of the present invention, the chalcogen vapor is provided to have a partial pressure of the chalcogen present in the atmosphere greater than or equal to the vapor pressure of chalcogen that would be required to maintain a partial chalcogen pressure at the processing temperature and processing pressure to minimize loss of chalcogen from the precursor layer, and if desired, provide the precursor layer with additional chalcogen. The partial pressure is determined in part on the temperature that the chamber 1050 or the precursor layer 1056 is at. It should also be understood that the chalcogen vapor is used in the chamber 1050 at a non-vacuum pressure. In one embodiment, the pressure in the chamber is at about atmospheric pressure. Per the ideal gas law $PV=nRT$, it should be understood that the temperature influences the vapor pressure. In one embodiment, this chalcogen vapor may be provided by using a partially or fully enclosed chamber with a chalcogen source 1062 therein or coupled to the chamber. In another embodiment using a more open chamber, the chalcogen atmosphere may be provided by supplying a source producing a chalcogen vapor. The chalcogen vapor may serve to help keep the chalcogen in the film or to provide the chalcogen to covert the precursor layer. Thus, the chalcogen vapor may or may not be used to provide excess chalcogen. In some embodiments, this may serve more to keep the chalcogen present in the film than to provide more chalcogen into the film.

Optionally, this vapor or atmosphere maybe used as a chalcogen that is introduced into an otherwise chalcogen free or selenium free precursor layer. It should be understood that the exposure to chalcogen vapor may occur in a non-vacuum environment. The exposure to chalcogen vapor may occur at or near atmospheric pressure. These conditions may be applicable to any of the embodiments described herein. The chalcogen may be carried into the chamber by a carrier gas. The carrier gas may be an inert gas such as nitrogen, argon, or the like. This chalcogen atmosphere system may be adapted for use in a roll-to-roll system.

Figure 27B:
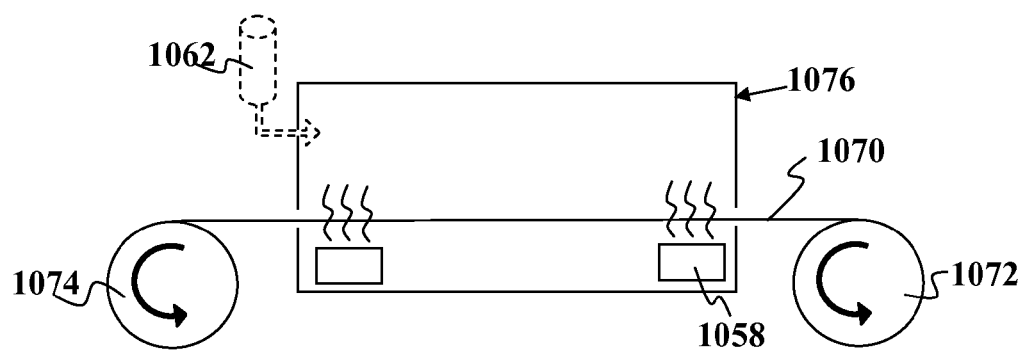
FIG. 27B shows a schematic of a system using a chalcogen vapor environment according to one embodiment of the present invention.

Referring now to FIG. 27B, it shown that the present invention may be adopted for use with a roll-to-roll system where the substrate 1070 carrying the precursor layer may be flexible and configured as rolls 1072 and 1074. The chamber 1076 may be at vacuum or non-vacuum pressures. The chamber 1076 may be designed to incorporate a differential valve design to minimize the loss of chalcogen vapor at the chamber entry and chamber exit points of the roll-to-roll substrate 1070.

Figure 27C:
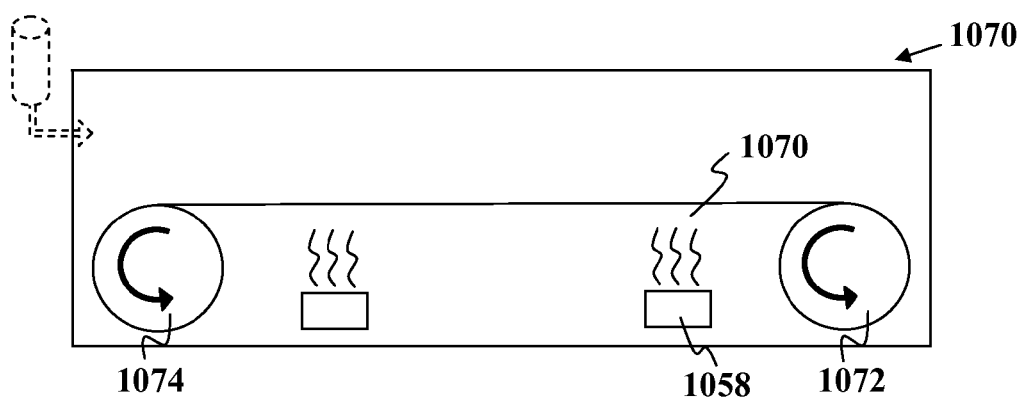
FIG. 27C shows a schematic of a system using a chalcogen vapor environment according to one embodiment of the present invention.

Referring now to FIG. 27C, yet another embodiment of the present invention uses a chamber 1090 of sufficient size to hold the entire substrate, including any rolls 1072 or 1074 associated with using a roll-to-roll configuration.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, particles of various shapes and sizes may be used separately or in combination with one another. Although the examples provided herein describe microflakes, it should be understood that flakes of other sizes may also be used in some embodiments of the invention. By way of nonlimiting example, microflakes (of solid group IIIA particles or particles of other compositions) may be replaced by and/or mixed with nanoflakes wherein the lengths of the planar nanoflakes are about 500 nm to about 1 nm. They may also be mixed with spherical particles of the same or different composition. As a nonlimiting example, the nanoflakes may have lengths and/or largest lateral dimension of about 300 nm to about 10 nm. In other embodiments, the nanoflakes may be of thickness in the range of about 200 nm to about 20 nm. In another embodiment, these nanoflakes may be of thickness in the range of about 100 nm to about 10 nm. In one embodiment, these nanoflakes may be of thickness in the range of about 200 nm to about 20 nm. As mentioned, some embodiments of the invention may include both microflakes and nanoflakes. Other may include flakes that are exclusively in the size range of microflakes or the size range of nanoflakes. With any of the above embodiments, the microflakes may be replaced and/or combined with microrods which are substantially linear, elongate members. Still further embodiments may combine nanorods with microflakes in the precursor layer. The microrods may have lengths between about 500 nm to about 1 nm. In another embodiment, the nanorods may have lengths between about 500 nm and 20 nm. In yet another embodiment, the nanorods may have lengths between about 300 nm and 30 nm. Any of the above embodiments may be used on rigid substrate, flexible substrate, or a combinations of the two such as but not limited to a flexible substrate that become rigid during processing due to its material properties. In one embodiment of the present invention, the particles may be plates and/or discs and/or flakes and/or wires and/or rods of micro-sized proportions. In another embodiment of the present invention, the particles may be nanoplates and/or nanodiscs and/or nanoflakes and/or nanowires and/or nanorods of nano-sized proportions. Again, any of the foregoing may also be combined with spherical particles in a suspension. Some embodiments may have all spherical particles, all non-spherical particles, and/or mixtures of particles of various shapes. It should be understood that the solid group IIIA-based particles may be used in single or multiple combination with particles of other shapes and/or composition. This may include shapes such as but not limited to spherical, planar, flake, platelet, other non-spherical, and/or single or multiple combinations of the foregoing. As for materials, this may include alloys, elementals, chalcogenides, inter-metallics, solid-solutions, and/or single or multiple combinations of the foregoing in any shape or form. Use of solid particles with dispersions and/or emulsions of the foregoing is also envisioned. The solid solutions are described in pending U.S.

patent application Ser. No. 10/474,259 and published as US20040219730, fully incorporated herein by reference for all purposes. The following applications are also fully incorporated herein by reference: Ser. Nos. 11/395,438, 11/395,668, and 11/395,426 both filed Mar. 30, 2006. Any of the embodiments described in those applications may be adapted for use with the solid IIIA-based particles described herein.

For any of the above embodiments, it should be understood that in addition to the aforementioned, the temperature used during annealing may also vary over different time periods of precursor layer processing. As a nonlimiting example, the heating may occur at a first temperature over an initial processing time period and proceed to other temperatures for subsequent time periods of the processing. Optionally, the method may include intentionally creating one or more temperature dips so that, as a nonlimiting example, the method comprises heating, cooling, heating, and subsequent cooling. For any of the above embodiments, it is also possible to have two or more elements of IB elements in the chalcogenide particle and/or the resulting film. Although the description herein uses an ink, it should be understood that in some embodiments, the ink may have the consistency of a paste or slurry.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 nm to about 200 nm should be interpreted to include not only the explicitly recited limits of about 1 nm and about 200 nm, but also to include individual sizes such as 2 nm, 3 nm, 4 nm, and sub-ranges such as 10 nm to 50 nm, 20 nm to 100 nm, etc. . . . .

For example, still other embodiments of the present invention may use a Cu—In precursor material wherein Cu—In contributes less than about 50 percent of both Cu and In found in the precursor material. The remaining amount is incorporated by elemental form or by non IB-IIIA alloys. Thus, a $Cu_{11}In_9$ may be used with elemental Cu, In, and Ga to form a resulting film. In another embodiment, instead of elemental Cu, In, and Ga, other materials such as Cu—Se, In—Se, and/or Ga—Se may be substituted as source of the group IB or IIIA material. Optionally, in another embodiment, the IB source may be any particle that contains Cu without being alloyed with In and Ga (Cu, Cu—Se). The IIIA source may be any particle that contains In without Cu (In—Se, In—Ga—Se) or any particle that contains Ga without Cu (Ga, Ga—Se, or In—Ga—Se). Other embodiments may have these combinations of the IB material in a nitride or oxide form. Still other embodiments may have these combinations of the IIIA material in a nitride or oxide form. The present invention may use any combination of elements and/or selenides (binary, ternary, or multinary) may be used. Optionally, some other embodiments may use oxides such as $In_2O_3$ to add the desired amounts of materials. It should be understood for any of the above embodiments that more than one solid solution may be used, multi-phasic alloys, and/or more general alloys may also be used. For any of the above embodiments, the annealing process may also involve exposure of the compound film to a gas such as $H_2$, CO, $N_2$, Ar, $H_2Se$, Se vapor, S vapor, or other group VIA containing vapor. There may be a two stage process where there is an initial anneal in a non group-VIA based atmosphere and then a second or more heating in group VIA-based atmosphere. There may be a two stage process where there is an initial anneal in a non group-VIA based atmosphere and then a second heating in a non-group VIA based atmosphere, wherein VIA material is placed directly on the stack for the second heating and additional is the VIA-containing vapor is not used. Alternatively, some may use a one stage process to create a final film, or a multi-stage process where each heating step use a different atmosphere.

It should also be understood that several intermediate solid solutions may also be suitable for use according to the present invention. As nonlimiting examples, a composition in the δ phase for Cu—In (about 42.52 to about 44.3 wt % In) and/or a composition between the δ phase for Cu—In and $Cu_{16}In_9$ may be suitable inter-metallic materials for use with the present invention to form a group IB-IIIA-VIA compound. It should be understood that these inter-metallic materials may be mixed with elemental or other materials such as Cu—Se, In—Se, and/or Ga—Se to provide sources of the group IB or IIIA material to reach the desired stoichiometric ratios in the final compound. Other nonlimiting examples of inter-metallic material include compositions of Cu—Ga containing the following phases: $\gamma_1$ (about 31.8 to about 39.8 wt % Ga), $\gamma_2$ (about 36.0 to about 39.9 wt % Ga), $\gamma_3$ (about 39.7 to about −44.9 wt % Ga), the phase between $\gamma_2$ and $\gamma_3$, the phase between the terminal solid solution and $\gamma_1$, and θ (about 66.7 to about 68.7 wt % Ga). For Cu—Ga, a suitable composition is also found in the range in between the terminal solid-solution of and the intermediate solid-solution next to it. Advantageously, some of these inter-metallic materials may be multi-phasic which are more likely to lead to brittle materials that can be mechanically milled. Phase diagrams for the following materials may be found in ASM Handbook, Volume 3 Alloy Phase Diagrams (1992) by ASM International and fully incorporated herein by reference for all purposes. Some specific examples (fully incorporated herein by reference) may be found on pages 2-168, 2-170, 2-176, 2-178, 2-208, 2-214, 2-257, and/or 2-259. It should also be understood that a particle may have portions that are of a solid alloy and portions that are phase separated into individual elements or other alloys that are liquid.

It should be understood that any of the embodiments herein may be adapted for use in a one step process, or a two step process, or a multi-step process for forming a photovoltaic absorber layer. One step processes do not require a second follow-up process to convert the film into an absorber layer. A two step process typically creates a film that uses a second process to convert the film into an absorber layer. Additionally, some embodiments may have anywhere from about 0 to about 5 wt % oxygen in the shell.

It should be understood that the solid IIIA particles as described herein may be used with solids, solid solutions, intermetallics, nanoglobules, emulsions, nanoglobule, emulsion, or other types of particles.

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. The following related applications are fully incorporated herein by reference for all purposes: U.S. patent application Ser. No. 11/290,633 entitled "CHALCOGENIDE SOLAR CELLS" filed Nov. 29, 2005, U.S. patent application Ser. No. 10/782, 017, entitled "SOLUTION-BASED FABRICATION OF PHOTOVOLTAIC CELL" filed Feb. 19, 2004, U.S. patent application Ser. No. 10/943,657, entitled "COATED NANO-PARTICLES AND QUANTUM DOTS FOR SOLUTION-BASED FABRICATION OF PHOTOVOLTAIC CELLS" filed Sep. 18, 2004, U.S. patent application Ser. No. 11/081,163, entitled "METALLIC DISPERSION", filed Mar. 16, 2005, and U.S. patent application Ser. No. 10/943,685, entitled "FORMATION OF CIGS ABSORBER LAYERS ON FOIL SUBSTRATES", filed Sep. 18, 2004, Ser. No. 60/804,649 filed Jun. 13, 2006, and Ser. No. 60/804,565 filed Jun. 12, 2006, the entire disclosures of which are incorporated herein by reference. The following applications are also incorporated herein by reference for all purposes: Ser. No. 11/361,498 entitled "HIGH-THROUGHPUT PRINTING OF SEMICONDUCTOR PRECURSOR LAYER FROM MICROFLAKE PARTICLES" filed Feb. 23, 2006 and commonly-assigned, co-pending application Ser. No. 11/361,433 entitled "HIGH-THROUGHPUT PRINTING OF SEMICONDUCTOR PRECURSOR LAYER FROM NANOFLAKE PARTICLES" filed Feb. 23, 2006, Ser. No. 60/804,565 filed Jun. 12, 2006, Ser. No. 60/804,566 filed Jun. 12, 2006, Ser. No. 60/804,567 filed Jun. 12, 2006, Ser. No. 60/804,569 filed Jun. 12, 2006, Ser. No. 60/804,649 filed Jun. 13, 2006, and Ser. No. 60/804,647 filed Jun. 13, 2006.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method comprising:
   providing a first material comprising an alloy of a) a group IIIA-based material and b) at least one group IA-based material, wherein the group IA-based material is included in an amount sufficient so that no liquid phase of the alloy is present within the first material in a temperature range between room temperature and a deposition or pre-deposition temperature higher than room temperature, wherein the group IIIA-based material is otherwise liquid in that temperature range; and
   formulating a precursor material comprising a) particles of the first material and b) particles containing at least one element from the group consisting of: group IB, IIIA, VIA element, alloys containing any of the foregoing elements, or combinations thereof.

2. The method of claim 1 further comprising:
   formulating an ink including the precursor material;
   solution depositing the ink onto a substrate to form a precursor layer on the substrate; and
   reacting the precursor layer in a suitable atmosphere to form a group IB-IIIA-VIA based film.

3. The method of claim 2 wherein the alloy containing particles are a sole source of group IIIA elements in the ink.

4. The method of claim 2 wherein the film has a Cu/(In+Ga) compositional range of about 0.01 to about 1.0 and a Ga/(In+Ga) compositional range of about 0.01 to about 1.0.

5. The method of claim 2 wherein the film has a Cu/(In+Ga) compositional range of about >1.0 for Cu/(In+Ga) and a Ga/(In+Ga) compositional range of about 0.01 to about 1.0.

6. The method of claim 2 wherein the film has a Cu/(In+Ga) compositional range of about 0.01 to about 1.0 and a Ga/(In+Ga) compositional range of about 0.01 to about 1.0.

7. The method of claim 2 wherein the film has a desired Cu/(In+Ga) molar ratio is in the range of about 0.7 to about 1.0 and a desired Ga/(Ga+n) molar ratio in the range of about 0.1 to about 0.8.

8. The method of claim 2 wherein the ink includes a carrier liquid.

9. The process of claim 1 wherein the material comprises Al to make solid Al—Ga particles.

10. The process of claim 1 wherein the material comprises Al; wherein Ga dissolves in Al to make solid Al—Ga particles for use in forming a film of CAGS and/or CAIGS.

11. The method of claim 1 wherein the precursor material comprises a precursor material that forms a Cu—In—Se based alloy when sintered at the first temperature profile.

12. The method of claim 1 wherein the precursor material comprises a precursor material that forms a Cu—In—Se based alloy when sintered at the first temperature profile and combines with the alloy to form a Cu—In—Ga—Se based alloy when further heated through the second temperature profile.

13. The method of claim 1 wherein the precursor material comprises a precursor material that forms a Cu—In—Ga—Se based alloy when sintered at the first temperature profile and combines with the alloy to form a Cu—In—Ga—Se based alloy with further heating through the second temperature profile, resulting in increased Ga content near a top surface of the layer.

14. The method of claim 1 wherein:
   the film has a desired Cu/(In+Ga) molar ratio in the range of greater than about 1.0 and a desired Ga/(Ga+n) molar ratio in the range of about 0.1 to about 0.8;
   further reacting the film in a post-reacting step to change Cu/(In+Ga) to be in a range less than about 1.0.

15. The method of claim 1 wherein the precursor material is deposited on a substrate comprising a metal foil with a bottom layer selected from the group consisting of: Mo, Cu, Ag, Al, Ta, Ni, Cr, NiCr, or steel.

* * * * *